(12) United States Patent
Liu et al.

(10) Patent No.: US 12,392,874 B2
(45) Date of Patent: Aug. 19, 2025

(54) LIGHT DETECTION AND RANGING SENSORS WITH MULTIPLE EMITTERS AND MULTIPLE RECEIVERS, AND ASSOCIATED SYSTEMS AND METHODS

(71) Applicant: SZ DJI TECHNOLOGY CO., LTD., Shenzhen (CN)

(72) Inventors: Xiang Liu, Shenzhen (CN); Xiaoping Hong, Shenzhen (CN); Guoguang Zheng, Shenzhen (CN); Huai Huang, Shenzhen (CN); Jiangbo Chen, Shenzhen (CN)

(73) Assignee: SZ DJI TECHNOLOGY CO., LTD., Shenzhen (CN)

( * ) Notice: Subject to any disclaimer, the term of this patent is extended or adjusted under 35 U.S.C. 154(b) by 1044 days.

(21) Appl. No.: 17/081,913

(22) Filed: Oct. 27, 2020

(65) Prior Publication Data

US 2021/0132202 A1    May 6, 2021

Related U.S. Application Data

(63) Continuation of application No. PCT/CN2018/085173, filed on Apr. 28, 2018.

(51) Int. Cl.
*G01S 7/497* (2006.01)
*G01S 7/481* (2006.01)
(Continued)

(52) U.S. Cl.
CPC ............ *G01S 7/497* (2013.01); *G01S 7/4815* (2013.01); *G01S 7/4816* (2013.01);
(Continued)

(58) Field of Classification Search
CPC ...... G01S 7/497; G01S 7/4815; G01S 7/4816; G01S 7/4817; G01S 17/10;
(Continued)

(56) References Cited

U.S. PATENT DOCUMENTS

| | | |
|---|---|---|
| 4,901,325 A | 2/1990 | Kato et al. |
| 5,324,387 A | 6/1994 | Andrews et al. |

(Continued)

FOREIGN PATENT DOCUMENTS

| | | |
|---|---|---|
| CN | 1879268 A | 12/2006 |
| CN | 201171142 Y | 12/2008 |

(Continued)

OTHER PUBLICATIONS

Chinese Office Action issued Sep. 13, 2023 in corresponding Chinese Patent Application No. 201880009618.0, 7 pages.

(Continued)

*Primary Examiner* — Isam A Alsomiri
*Assistant Examiner* — Joseph C Fritchman
(74) *Attorney, Agent, or Firm* — ANOVA LAW GROUP, PLLC

(57) ABSTRACT

Systems and techniques associated light detection and ranging (LIDAR) applications are described. In one representative aspect, techniques can be used to implement a packaged semi-conductive apparatus is disclosed. The apparatus includes a substrate; a diode die carried by the substrate and positioned to emit an electromagnetic energy beam; and a shell coupled to the substrate to enclose the diode die. The shell includes an opening or a transparent area to allow the electromagnetic energy beam emitted from the diode die to pass through the shell.

18 Claims, 51 Drawing Sheets

(51) Int. Cl.
  *G01S 17/10* (2020.01)
  *G02B 26/08* (2006.01)
  *H01S 5/00* (2006.01)
  *H01S 5/40* (2006.01)

(52) U.S. Cl.
  CPC ............ *G01S 7/4817* (2013.01); *G01S 17/10* (2013.01); *G02B 26/0833* (2013.01); *H01S 5/0071* (2013.01); *H01S 5/4025* (2013.01)

(58) Field of Classification Search
  CPC . G02B 26/0833; H01S 5/0071; H01S 5/4025; H01S 5/02469
  See application file for complete search history.

(56) References Cited

U.S. PATENT DOCUMENTS

| | | | |
|---|---|---|---|
| 5,490,160 A | 2/1996 | Kovacs et al. | |
| 5,581,523 A | 12/1996 | Seki | |
| 5,680,384 A | 10/1997 | Seki | |
| 5,913,108 A | 6/1999 | Stephens et al. | |
| 6,101,206 A | 8/2000 | Apollonov et al. | |
| 6,188,132 B1 | 2/2001 | Shih et al. | |
| 6,411,371 B1* | 6/2002 | Hinderling | G01S 7/4812 356/5.1 |
| 6,583,445 B1 | 6/2003 | Reedy et al. | |
| 6,586,678 B1 | 7/2003 | Rosenberg | |
| 6,778,576 B1 | 8/2004 | Acklin | |
| 9,128,190 B1 | 9/2015 | Ulrich et al. | |
| 9,450,377 B1 | 9/2016 | Roff et al. | |
| 10,418,780 B1 | 9/2019 | Hwang | |
| 2002/0097773 A1 | 7/2002 | Masui | |
| 2002/0126940 A1 | 9/2002 | Kathman | |
| 2003/0138008 A1 | 7/2003 | Riaziat | |
| 2004/0071174 A1 | 4/2004 | Takemori | |
| 2004/0074661 A1 | 4/2004 | Schiaffino | |
| 2004/0151505 A1 | 8/2004 | Aronson | |
| 2004/0163836 A1 | 8/2004 | Kumar | |
| 2005/0057741 A1* | 3/2005 | Anderson | G01S 7/4817 356/5.01 |
| 2005/0074046 A1 | 4/2005 | Kasai | |
| 2005/0089280 A1 | 4/2005 | Kumar | |
| 2005/0094694 A1 | 5/2005 | Fujihara | |
| 2005/0105572 A1 | 5/2005 | Simoun-Ou et al. | |
| 2005/0111503 A1 | 5/2005 | Ishigami | |
| 2005/0121684 A1 | 6/2005 | Aruga | |
| 2006/0054906 A1 | 3/2006 | Inoue et al. | |
| 2006/0114950 A1 | 6/2006 | Yen et al. | |
| 2006/0222042 A1 | 10/2006 | Teramura | |
| 2007/0024840 A1* | 2/2007 | Fetzer | G01S 7/4811 382/106 |
| 2009/0092162 A1 | 4/2009 | Huff et al. | |
| 2009/0161710 A1 | 6/2009 | Hoashi et al. | |
| 2010/0226655 A1 | 9/2010 | Kim | |
| 2011/0149268 A1* | 6/2011 | Marchant | G01S 17/58 356/27 |
| 2011/0158273 A1 | 6/2011 | Okayama | |
| 2013/0001627 A1 | 1/2013 | Kinoshita et al. | |
| 2013/0207970 A1 | 8/2013 | Shpunt et al. | |
| 2013/0258597 A1 | 10/2013 | Kim et al. | |
| 2014/0347650 A1 | 11/2014 | Bösch | |
| 2015/0029571 A1* | 1/2015 | Steele | G02B 26/108 359/211.2 |
| 2015/0055117 A1 | 2/2015 | Pennecot et al. | |
| 2015/0098191 A1 | 4/2015 | Kim | |
| 2015/0137148 A1 | 5/2015 | Wong | |
| 2015/0229912 A1 | 8/2015 | Masalkar et al. | |
| 2015/0255949 A1 | 9/2015 | Lee | |
| 2015/0318664 A1 | 11/2015 | Eckert | |
| 2016/0204575 A1 | 7/2016 | Horn et al. | |
| 2016/0282468 A1 | 9/2016 | Gruver et al. | |
| 2016/0359295 A1 | 12/2016 | Lee | |
| 2017/0031115 A1 | 2/2017 | Schaevitz | |
| 2017/0207601 A1 | 7/2017 | Weber | |
| 2017/0244217 A1 | 8/2017 | Shibata | |
| 2017/0255199 A1 | 9/2017 | Boehmke | |
| 2017/0288368 A1 | 10/2017 | Takazane | |
| 2017/0363887 A1* | 12/2017 | Uyeno | G02F 1/3501 |
| 2018/0062348 A1 | 3/2018 | Lee et al. | |
| 2018/0081038 A1 | 3/2018 | Medina et al. | |
| 2018/0106901 A1 | 4/2018 | Frederiksen et al. | |
| 2018/0167602 A1 | 6/2018 | Pacala et al. | |
| 2018/0278014 A1 | 9/2018 | Komatsu | |
| 2018/0284234 A1 | 10/2018 | Curatu | |
| 2019/0011885 A1* | 1/2019 | Dürr | G02B 27/0944 |
| 2019/0179018 A1* | 6/2019 | Gunnam | G01S 17/42 |
| 2020/0395738 A1 | 12/2020 | Von Freyhold et al. | |

FOREIGN PATENT DOCUMENTS

| | | |
|---|---|---|
| CN | 102650718 A | 8/2012 |
| CN | 202423821 U | 9/2012 |
| CN | 102804432 A | 11/2012 |
| CN | 102928978 A | 2/2013 |
| CN | 103155310 A | 6/2013 |
| CN | 103166104 A | 6/2013 |
| CN | 203553611 U | 4/2014 |
| CN | 104160240 A | 11/2014 |
| CN | 204243442 U | 4/2015 |
| CN | 104733999 A | 6/2015 |
| CN | 104898109 A | 9/2015 |
| CN | 204793612 U | 11/2015 |
| CN | 105319555 A | 2/2016 |
| CN | 105510899 A | 4/2016 |
| CN | 105629213 A | 6/2016 |
| CN | 105659108 A | 6/2016 |
| CN | 105785343 A | 7/2016 |
| CN | 106405563 A | 2/2017 |
| CN | 205982639 U | 2/2017 |
| CN | 206133000 U | 4/2017 |
| CN | 106797104 A | 5/2017 |
| CN | 107407727 A | 11/2017 |
| CN | 107466373 A | 12/2017 |
| CN | 107561551 A | 1/2018 |
| CN | 107634446 A | 1/2018 |
| CN | 107743592 A | 2/2018 |
| CN | 107783144 A | 3/2018 |
| CN | 107807367 A | 3/2018 |
| CN | 107958178 A | 4/2018 |
| CN | 106471686 B | 6/2019 |
| DE | 102009060566 A1 | 6/2011 |
| DE | 102018128751 A1 | 5/2020 |
| EP | 1267459 A1 | 12/2002 |
| EP | 3032594 A1 | 6/2016 |
| EP | 3276303 A1 | 1/2018 |
| JP | 62-26874 A | 2/1987 |
| JP | 62-184381 A | 8/1987 |
| JP | 2-251782 A | 10/1990 |
| JP | H07-58414 A | 3/1995 |
| JP | H07-99368 A | 4/1995 |
| JP | 2000-501574 A | 2/2000 |
| JP | 2001-185636 A | 7/2001 |
| JP | 2001-223442 | 8/2001 |
| JP | 2001-332804 A | 11/2001 |
| JP | 2003-21686 A | 1/2003 |
| JP | 2003-229629 A | 8/2003 |
| JP | 2004-031900 A | 1/2004 |
| JP | 2004-066543 | 3/2004 |
| JP | 2004-146720 A | 5/2004 |
| JP | 2004-363550 | 12/2004 |
| JP | 2005-235884 A | 9/2005 |
| JP | 2005-274678 A | 10/2005 |
| JP | 2007-027375 | 2/2007 |
| JP | 2008-89393 A | 4/2008 |
| JP | 2008-124351 A | 5/2008 |
| JP | 2010-91378 A | 4/2010 |
| JP | 2011-249355 | 12/2011 |
| JP | 2013-89918 A | 5/2013 |
| JP | 2013-195758 A | 9/2013 |
| JP | 2016-534346 A | 11/2016 |
| JP | 2016-217971 A | 12/2016 |
| JP | 2017-028044 A | 2/2017 |
| KR | 20110066321 A | 6/2011 |

(56) References Cited

FOREIGN PATENT DOCUMENTS

| KR | 10-2011-0008891 | | 4/2013 |
|---|---|---|---|
| KR | 101789175 B1 | | 10/2017 |
| PL | 224520 B1 | * | 1/2017 |
| WO | 2007099612 A1 | | 9/2007 |
| WO | WO 2016/160961 A1 | | 10/2016 |
| WO | WO 2017/043122 A1 | | 3/2017 |
| WO | 2017188097 A1 | | 11/2017 |
| WO | 2019086619 A1 | | 5/2019 |

OTHER PUBLICATIONS

U.S. Office Action issued Sep. 15, 2023 in co-pending U.S. Appl. No. 17/081,715, 30 pages.
International Search Report in related PCT Application No. PCT/CN2018/085173, mailed Feb. 3, 2019 (3 pgs.).
Extended European Search Report in related European Application No. 18915852.0, mailed Jun. 24, 2020 (7 pages).
Partial Supplementary European Search Report in related European Application No. 18916260.5, mailed Oct. 14, 2020 (11 pages).
International Search Report and Written Opinion mailed on Feb. 11, 2019, corresponding PCT/CN2018/085127, 12 pages.
International Search Report mailed on Feb. 2, 2019, corresponding PCT/CN2018/085125 with English translation, 8 pages.
Communication under Rule 71(3) EPC issued Oct. 17, 2022, in corresponding European Patent Application No. 18 915 852.0.
Huifeng Xiong et al., "Lidar." Beijing: Aerospace Publishing House. The first edition. Apr. 30, 1994 (Apr. 30, 1994). 6 Pages (including translation).

* cited by examiner

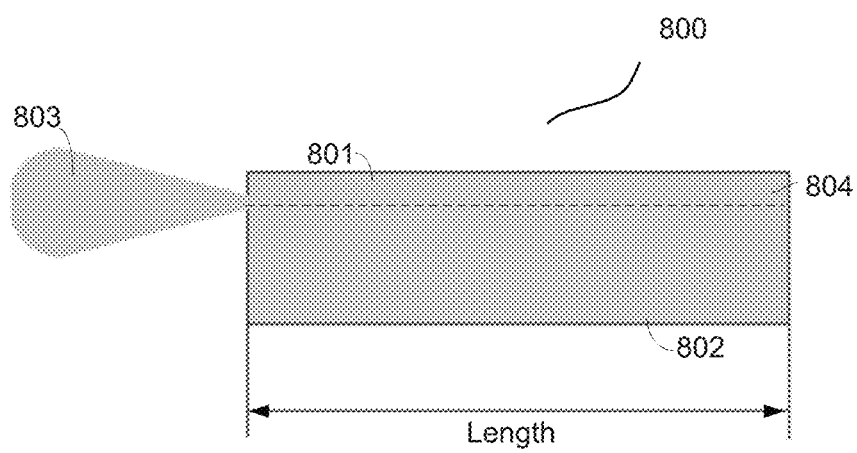
FIG. 8A
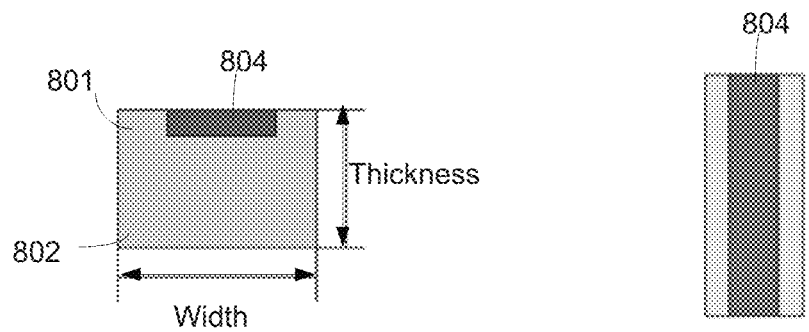 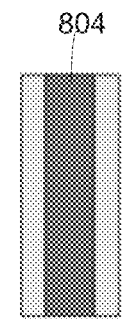
FIG. 8B          FIG. 8C

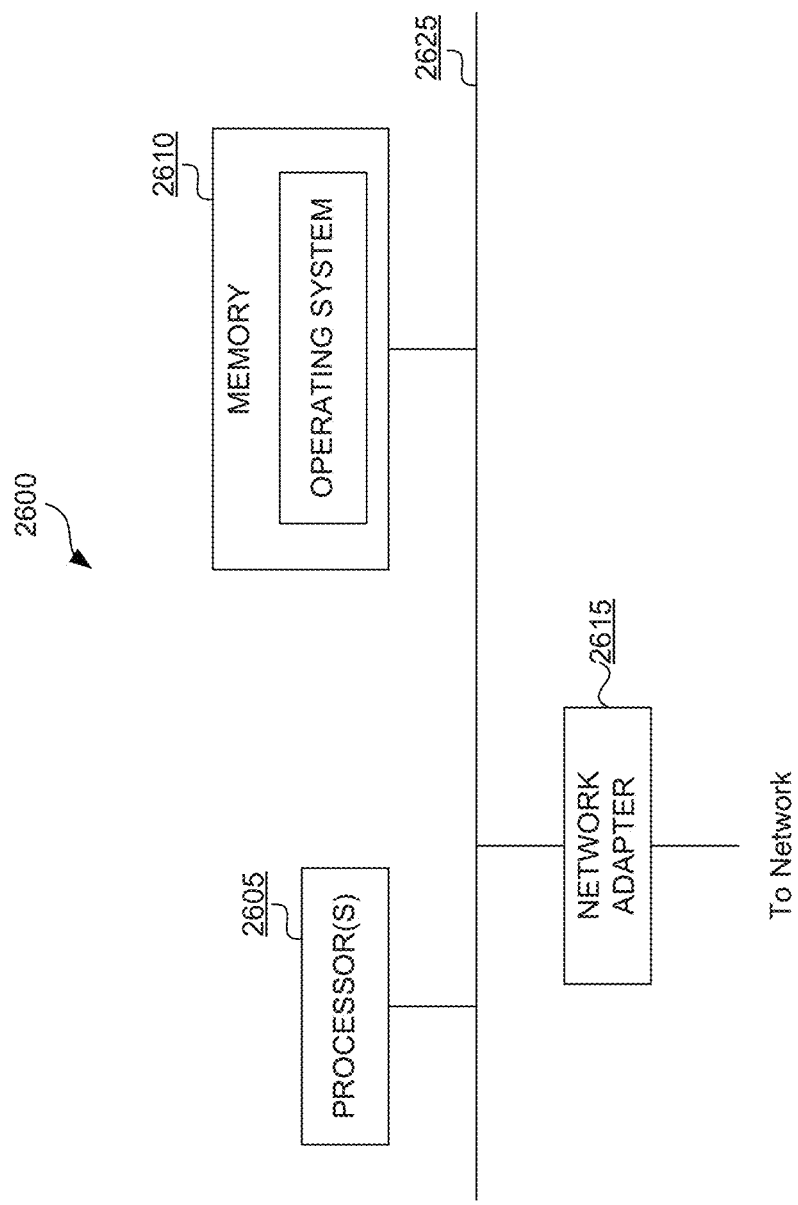

LIGHT DETECTION AND RANGING SENSORS WITH MULTIPLE EMITTERS AND MULTIPLE RECEIVERS, AND ASSOCIATED SYSTEMS AND METHODS

CROSS-REFERENCE TO RELATED APPLICATIONS

This application is a continuation of International Application No. PCT/CN2018/085173, filed Apr. 28, 2018, now pending, which is incorporated herein by reference in its entirety.

TECHNICAL FIELD

The present disclosure is directed generally to environmental sensing, and more specifically, to components, systems and techniques associated with light detection and ranging (LIDAR) applications.

BACKGROUND

With their ever-increasing performance and lowering cost, intelligent machinery (such as robotics) is now extensively used in many fields. Representative missions include crop surveillance, real estate photography, inspection of buildings and other structures, fire and safety missions, border patrols, and product delivery, among others. For obstacle detection as well as for other functionalities, it is beneficial for intelligent machinery to be equipped with obstacle detection and surrounding environment scanning devices. Light detection and ranging (LIDAR, also known as "light radar") offers reliable and accurate detection. However, to obtain an accurate model of the external environment, the LIDAR system requires high quality data signals from the environment. Such a requirement can increase the complexity and cost of manufacturing the optical and electrical components of the LIDAR system. Accordingly, there remains a need for improved techniques for implementing LIDAR systems carried by intelligent machinery and other devices.

SUMMARY OF PARTICULAR EMBODIMENTS

The present disclosure is directed to components, systems and techniques associated with light detection and ranging (LIDAR) systems.

In one representative aspect, a packaged semi-conductive apparatus is disclosed. The apparatus includes a substrate, a diode die carried by the substrate and positioned to emit an electromagnetic energy beam, and a shell coupled to the substrate to enclose the diode die. The shell includes an opening or a transparent area to allow the electromagnetic energy beam emitted from the diode die to pass through the shell.

In another representative aspect, an electromagnetic energy emitting apparatus is disclosed. The apparatus includes a source module that comprises a substrate; and multiple diode dice carried by the substrate. An individual diode die includes an emission surface positioned to emit an electromagnetic energy beam. The apparatus also includes a shell coupled to the substrate to enclose the multiple diode dice. The shell includes an opening or a transparent area to allow multiple electromagnetic energy beams emitted from the multiple diode dice to pass through the shell. The apparatus further includes a collimator module positioned in the paths of the multiple electromagnetic energy beams to collimate the multiple electromagnetic energy beams.

In another representative aspect, an electromagnetic energy receiving apparatus is disclosed. The apparatus includes a collimator module positioned to receive electromagnetic energy beams reflected from one or more objects in an external environment and generate collimated electromagnetic energy beams. The apparatus also includes a receiver module that comprises a substrate, and a plurality of semiconductor receiver units coupled to the substrate. Individual semiconductor receiver units are positioned to receive corresponding collimated electromagnetic energy beams and convert light signals from the corresponding collimated electromagnetic energy beams to electrical signals. The plurality of semiconductor receiver units is positioned relative to a focal plane of the collimator module.

In another representative aspect, an electromagnetic energy sensor device is disclosed. The sensor device includes a source module that comprises a first substrate, and a plurality of diode emitters coupled to the first substrate to emit a plurality of electromagnetic energy beams. The sensor device also includes a receiver module that comprises a second substrate, and a plurality of semiconductor receiver units coupled to the second substrate, wherein individual semiconductor receiver units are positioned to receive corresponding reflected electromagnetic energy beams from one or more objects in an external environment and convert light signals from the plurality of reflected electromagnetic energy beams into electrical signals.

In another representative aspect, an electromagnetic energy sensor device is disclosed. The device includes a source module that comprises a first substrate and multiple diode dice carried by the first substrate. An individual diode die includes an emission surface to emit an electromagnetic energy beam. The device includes a shell coupled to the first substrate to enclose the multiple diode dice. The shell includes an opening or a transparent area to allow multiple electromagnetic energy beams emitted from the multiple diode dice to pass through the shell. The device further includes a reflector module positioned to reflect the multiple electromagnetic energy beams to produce multiple reflected electromagnetic energy beams. The device includes a collimator module positioned to collimate the multiple reflected electromagnetic energy beams to produce corresponding outgoing electromagnetic energy beams. The device also includes a receiver module that comprises a second substrate, and a plurality of semiconductor receiver units coupled to the second substrate. The receiver module is positioned to receive multiple returned electromagnetic energy beams reflected from one or more objects in an external environment and to convert light signals from the multiple returned electromagnetic energy beams to electrical signals.

In another representative aspect, a method for manufacturing an electromagnetic energy emitter is disclosed. The method includes attaching a first diode die to a side of a first carrier, and attaching a second diode die to an opposing side of the first carrier such that a distance between an emitting area of the first diode die and an emitting area of the second diode die is generally equivalent to a thickness of the first carrier.

In another representative aspect, an electromagnetic energy sensor apparatus is disclosed. The apparatus includes a source module that comprises one or more diodes positioned to emit one or more electromagnetic energy beams, and a reflector module positioned to receive and reflect the one or more electromagnetic energy beams. The source module and the reflector module together emit multiple outgoing electromagnetic energy beams. The apparatus also includes a receiver module that comprises a plurality of semiconductor receiver units positioned to receive returned electromagnetic energy beams reflected from one or more objects in an external environment and convert light signals from the returned electromagnetic energy beams to electrical signals.

In another representative aspect, a method for calibrating an electromagnetic energy sensor that includes an emitter assembly, a collimator module, and a receiver assembly is disclosed. The method includes selecting a reference unit of the receiver assembly from a plurality of semiconductor receiver units included in the receiver assembly, selecting a reference diode of the emitter assembly from a plurality of diodes included in the receiver assembly, adjusting a position of the receiver assembly such that the reference unit of the receiver assembly aligns with the reference diode of the emitter assembly. The method further includes rotating the receiver assembly about an axis to obtain a correspondence between individual semiconductor receiver units in the receiver assembly and individual diodes in the emitter assembly. The axis passes through the reference unit of the receiver assembly.

In yet another representative aspect, a method for calibrating an electromagnetic energy sensor that includes an emitter module, a receiver module, and a collimator module is disclosed. The method includes adjusting a position of the emitter module such that a distance between diodes in the emitter module and an axis of the collimator module is at least approximately minimized, and adjusting a position of the receiver module such that individual semiconductor receiver units in the receiver module form a one-to-one correspondence with individual diodes in the emitter module.

The above and other aspects and implementations are described in greater detail in the drawings, the description and the claims.

BRIEF DESCRIPTION OF THE DRAWINGS

FIG. 8A shows a side view of a representative diode configured in accordance with one or more embodiments of the present technology.

FIG. 8B shows an end view of a representative diode configured in accordance with one or more embodiments of the present technology.

FIG. 8C shows a top view of a representative diode configured in accordance with embodiments of the present technology.

FIG. 26 is a block diagram illustrating a representative example of the architecture for a computer system or other control device that can be utilized to implement various portions of the presently disclosed technology.

DETAILED DESCRIPTION

As introduced above, it is important for intelligent machinery to be able to independently detect obstacles and/or to automatically engage in evasive maneuvers. Light detection and ranging (LIDAR) is a reliable and accurate detection technology. Moreover, unlike traditional image sensors (e.g., cameras), LIDAR can obtain three-dimensional information by detecting depth or distance to an object. However, current LIDAR systems have limitations. For example, the energy density within a certain distance from the laser emitters is usually regulated by local related safety policies or schemes. Therefore, the detection range of the LIDAR system using a single laser emitter can be limited. Furthermore, a single laser emitter may not be able to generate a dense data set suitable for obtaining an accurate model of the external environment. Accordingly, there remains a need for improved techniques for implementing LIDAR systems to achieve lower manufacturing costs while improving the quality of the input data.

In the following discussion, numerous specific details are set forth to provide a thorough understanding of the presently disclosed technology. In other embodiments, the techniques introduced herein can be practiced without these specific details. In other instances, well-known features, such as specific fabrication techniques, are not described in detail in order to avoid unnecessarily obscuring elements of the present disclosure. References in this description to "an embodiment," "one embodiment," or the like, mean that a particular feature, structure, material, or characteristic being described is included in at least one embodiment of the present disclosure. Thus, the appearances of such phrases in this specification do not necessarily all refer to the same embodiment. On the other hand, such references are not necessarily mutually exclusive either. Furthermore, the particular features, structures, materials, or characteristics can be combined in any suitable manner in one or more embodiments. Also, it is to be understood that the various embodiments shown in the figures are merely illustrative representations and are not necessarily drawn to scale.

Figure 1:
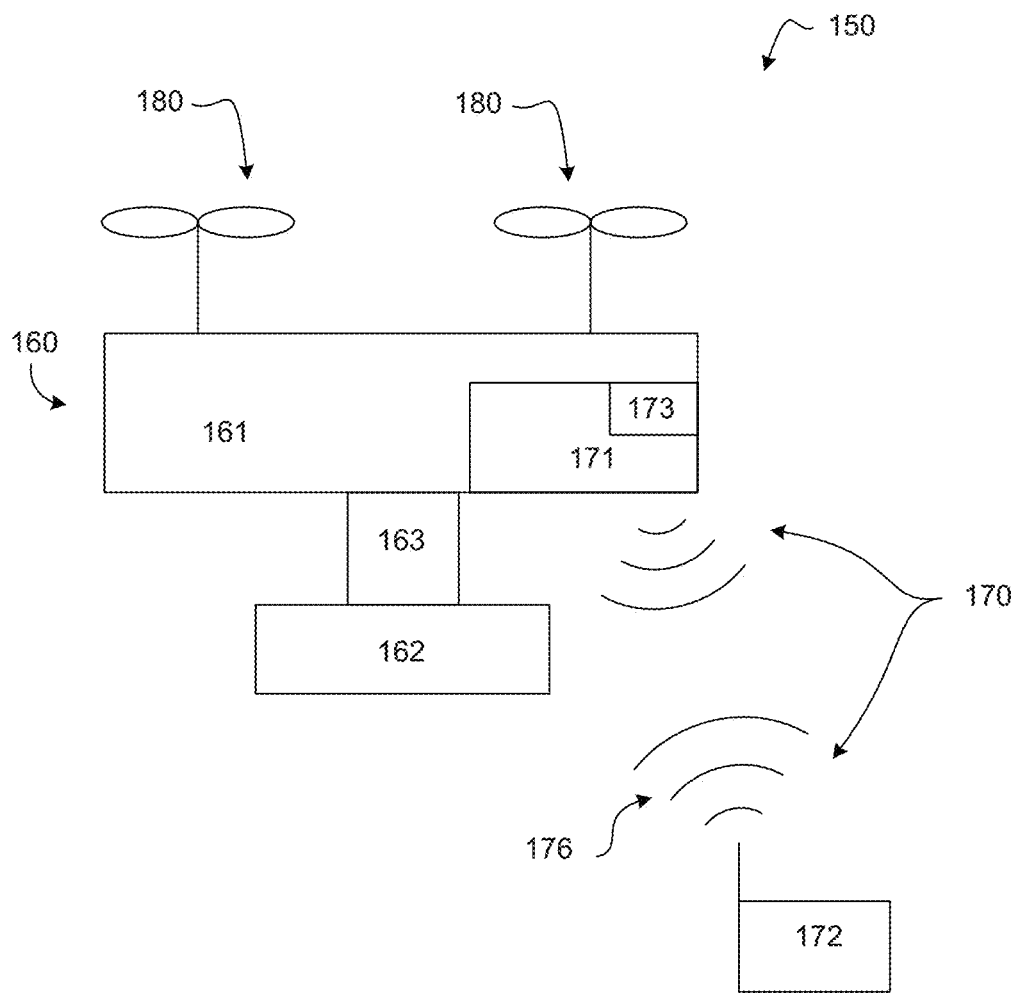
FIG. 1 is a schematic illustration of a representative system having elements configured in accordance with one or more embodiments of the present technology.

FIG. 1 is a schematic illustration of a representative system 150 having elements configured in accordance with one or more embodiments of the present technology. The system 150 includes an apparatus 160 (e.g., an unmanned aerial vehicle) and a control system 170.

The apparatus 160 can include a main body 161 (e.g., an airframe) that can carry a payload 162, for example, an imaging device or an optoelectronic scanning device (e.g., a LIDAR device). In some embodiments, the payload 162 can be a camera (e.g., a video camera and/or a still camera). The camera can be sensitive to wavelengths in any of a variety of suitable bands, including visual, ultraviolet, infrared and/or other bands. The payload 162 can also include other types of sensors and/or other types of cargo (e.g., packages or other deliverables). In some embodiments, the payload 162 is supported relative to the main body 161 with a carrying mechanism 163. The carrying mechanism 163 can allow the payload 162 to be independently positioned relative to the main body 161. For instance, the carrying mechanism 163 can permit the payload 162 to rotate around one, two, three, or more axes. The carrying mechanism 163 can also permit the payload 162 to move linearly along one, two, three, or more axes. The axes for the rotational or translational movement may or may not be orthogonal to each other. In this way, when the payload 162 includes an imaging device, the imaging device can be moved relative to the main body 161 to photograph, video, and/or track a target.

In some embodiments, the apparatus 160 may include one or more propulsion units 180. The one or more propulsion units 180 can enable the apparatus 160 to move, e.g., to take off, land, hover, and move in the air with respect to up to three degrees of freedom of translation and up to three degrees of freedom of rotation. In some embodiments, the propulsion units 180 can include one or more rotors. The rotors can include one or more rotor blades coupled to a shaft. The rotor blades and shaft can be rotated by a suitable drive mechanism, such as a motor. Although the propulsion units 180 of the apparatus 160 are depicted as propeller-based and can have four rotors, any suitable number, type, and/or arrangement of propulsion units can be used. For example, the number of rotors can be one, two, three, four, five, or more. The rotors can be oriented vertically, horizontally, or at any other suitable angle with respect to the apparatus 160. The angle of the rotors can be fixed or variable. The propulsion units 180 can be driven by any suitable motor, such as a DC motor (e.g., brushed or brushless) or an AC motor. In some embodiments, the motor can be configured to mount and drive a rotor blade.

The apparatus 160 is configured to receive control commands from the control system 170. In the embodiment shown in FIG. 1, the control system 170 includes some components carried on the apparatus 160 and some components positioned off the apparatus 160. For example, the control system 170 can include a first controller 171 carried by the apparatus 160 and a second controller 172 (e.g., a human-operated, remote controller) positioned remotely from the apparatus 160 and connected via a communication link 176 (e.g., a wireless link such as a radio frequency (RF) based link). The first controller 171 can include a computer-readable medium 173 that executes instructions directing the actions of the apparatus 160, including, but not limited to, operation of the propulsion system 180 and the payload 162 (e.g., a camera). The second controller 172 can include one or more input/output devices, e.g., display and control buttons. The operator manipulates the second controller 172 to control the apparatus 160 remotely, and receives feedback from the apparatus 160 via the display and/or other interface devices carried by the second controller 172. In other representative embodiments, the apparatus 160 can operate autonomously, in which case the second controller 172 can be eliminated, or can be used solely for operator override functions.

Figure 2:
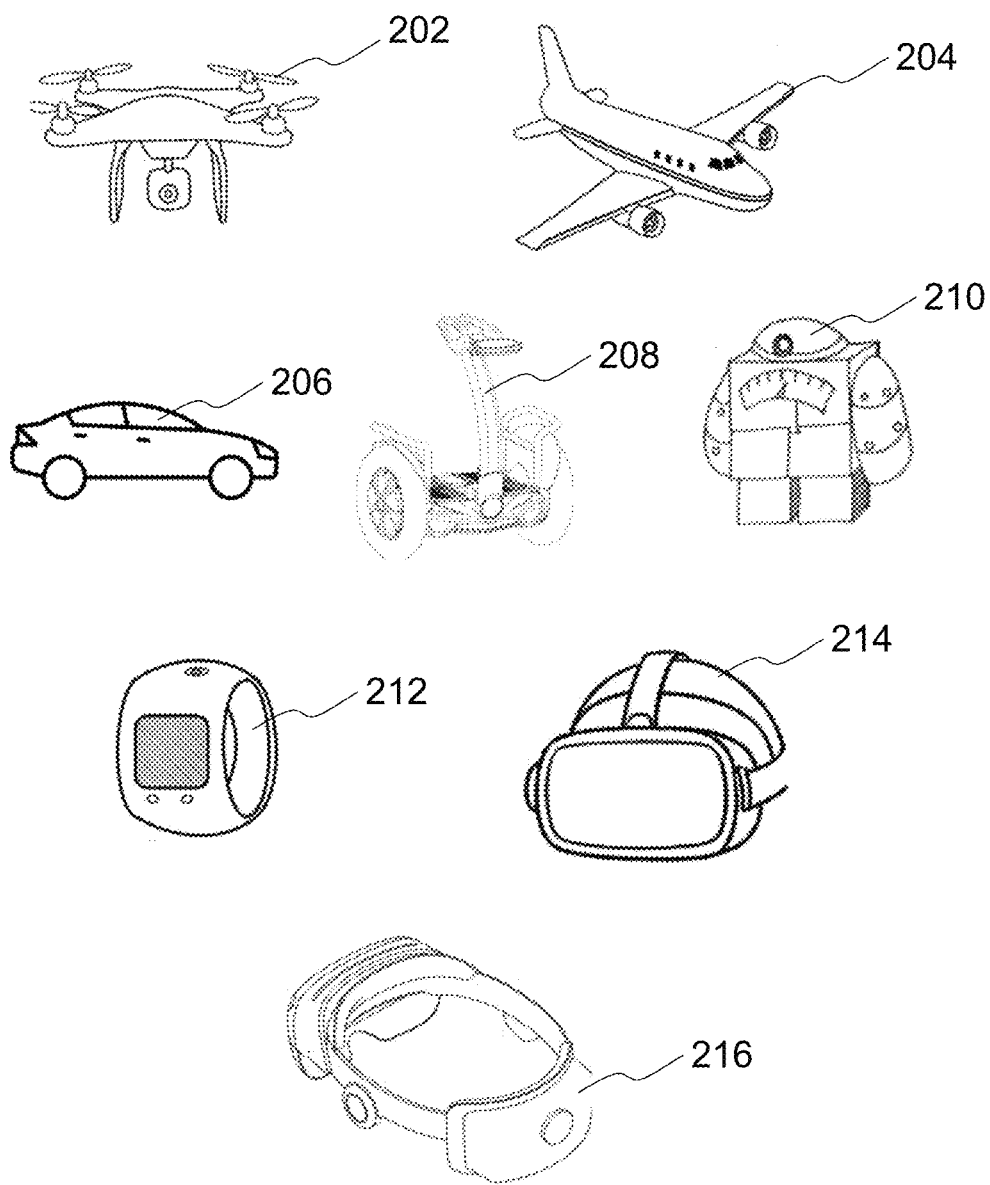
FIG. 2 illustrates some representative apparatus that can be used in accordance with one or more embodiments of the present technology.

The apparatus 160 can be any of a number of suitable types of devices that can be used in various embodiments. FIG. 2 illustrates some representative apparatus that can be used in accordance with one or more embodiments of the present technology. The apparatus includes at least one of an unmanned aerial vehicle (UAV) 202, a manned aircraft 204, an autonomous car 206, a self-balancing vehicle 208, a terrestrial robot 210, a smart wearable device 212, a virtual reality (VR) head-mounted display 214, and an augmented reality (AR) head-mounted display 216. The apparatus can also include vehicles such as semi-autonomous cars or automobiles that allow environment-sensing to assist driving.

To allow swift movement of the apparatus, it is desirable that the payload (e.g., an optoelectronic scanning device) can obtain high-density spatial data to construct an accurate model of the surroundings. However, this can be difficult to achieve using a single-source emitter in the optoelectronic scanning device.

Furthermore, local regulations typically impose an upper limit on the energy density of the emitter. For example, the light energy density at the exit(s) of the emitter(s) and/or within a certain distance from the emitter(s) may not exceed a threshold value. Such a threshold may impose a limitation on the emission power, thereby limiting the detection range of the optoelectronic scanning device. Furthermore, component efficiency of the existing optoelectronic scanning devices (e.g., solid-state LIDAR systems) may also negatively impact the detection range.

The present disclosure describes optoelectronic scanning devices that are capable of emitting multiple electromagnetic beams (e.g., laser beams) and detecting multiple returned signals. The multiple electromagnetic beams can be emitted and/or directed in the same or different directions. In embodiments in accordance with the disclosed techniques, multiple signals can be emitted and detected at any particular point in time, thereby allowing the system to collect denser and more evenly distributed spatial data as compared to devices that use a single emitter. Furthermore, by employing a beam steering module in the system, the embodiments in accordance with the disclosed technology can achieve the same level of spatial data density with fewer emitter(s) as compared to some of the existing systems (e.g., solid-state LIDAR systems).

Figure 3A:
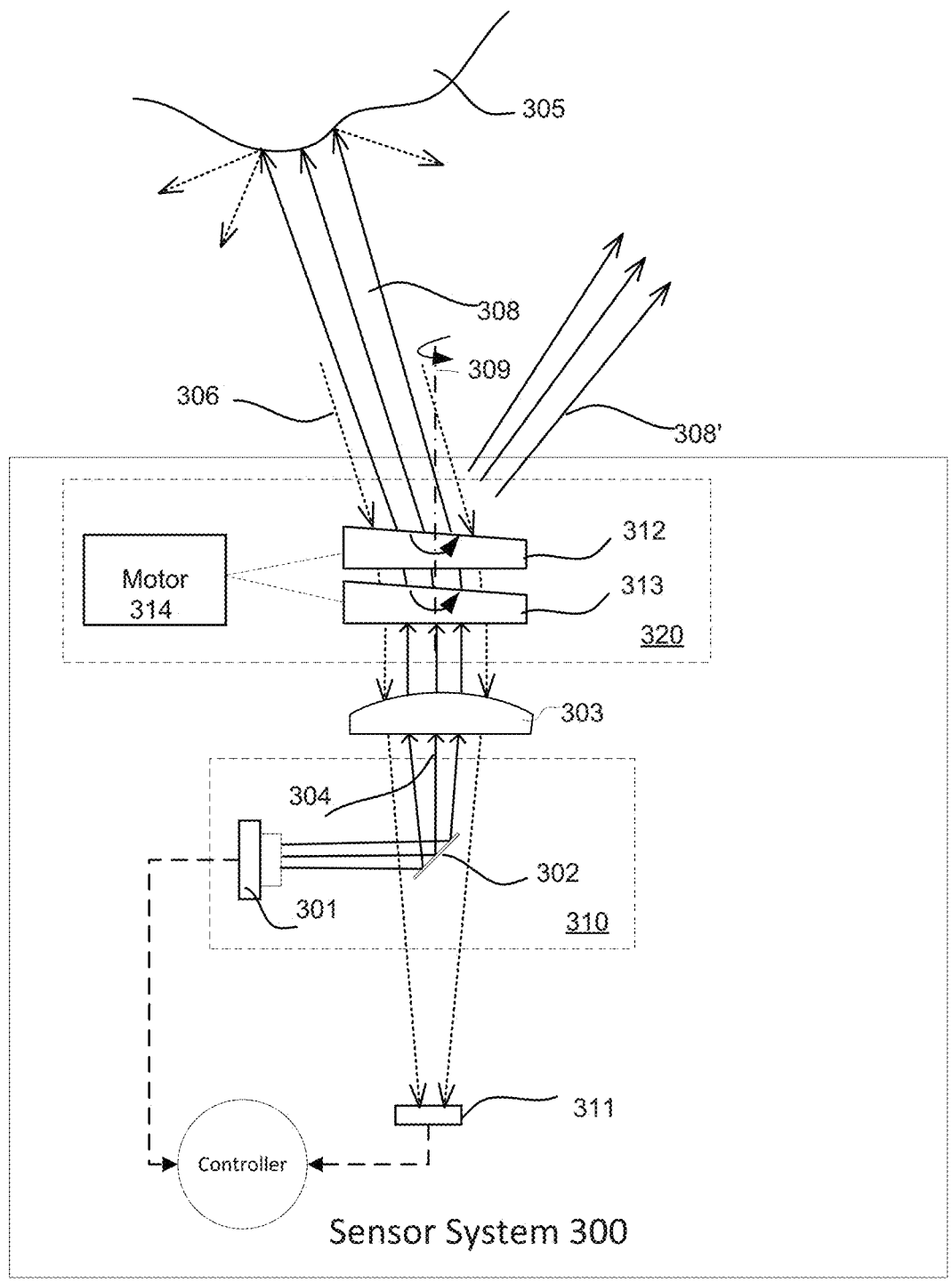
FIG. 3A shows a schematic diagram of a representative sensor system configured in accordance with one or more embodiments of the present technology.

FIG. 3A shows a schematic diagram of a representative sensor system 300 configured in accordance with one or more embodiments of the present technology. The sensor system 300 can detect the distance of an object 305 in the external environment based on measuring the time for light to travel between the sensor system 300 and the object 305, i.e., the time-of-flight (TOF). The sensor system 300 includes a multi-source emitter module 310. The multi-source emitter module 310 includes a source module 301 that includes one or more diodes positioned to emit one or more electromagnetic energy beams within a field of view (FOV). Each of the electromagnetic energy beams can be a single electromagnetic energy pulse or a series of electromagnetic energy pulses. In the discussions below, a light emitter module is used as an example of a source module 301. For example, the one or more diodes can emit one or more light beams within the FOV of the source module 301. However, it is noted that other suitable types of electromagnetic energy emitters can be adopted in the sensor system 300 to emit one or more electromagnetic energy beams other than light beams.

As shown in FIG. 3A, the multi-source emitter module 310 also includes a reflector module 302 that is positioned to receive and reflect the one or more light beams. The source module 301 and the reflector module 302 together emit multiple outgoing light beams 304. In some embodiment, the multi-source emitter module 310 further includes a collimator module 303 positioned in the paths of multiple reflected light beams from the reflector module 302 to generate multiple outgoing light beams. In some embodiments, the reflector module 302 is positioned along an optical axis of the collimator module 303 to so that the light beams can be collimated more effectively. In some embodiments, the reflector module 302 is positioned along an axis that deviates from the optical axis of the collimator module 303 to reduce the amount of returned light possibly obstructed by the reflector module 302.

In some embodiments, the sensor system 300 includes a beam steering module 320 that includes one or more optical components (e.g., one or more lenses) to steer the multiple outgoing light beams from the multi-source emitter module 310 in the same or different directions. For example, the beam steering module 320 can include an optical element 312 and a motor 314. The optical element 312 includes a first surface and a second, non-parallel surface. For example, the thickness of the optical element 312 can increase along a direction—with one end of the optical element 312 having a larger thickness than the other end. In some implementations, the optical element 312 includes a lens. The motor 314 is coupled to the optical element 312 to drive the optical element 312 to rotate about an axis 309 for steering the plurality of light beams in different directions, such as a first direction 308 and a second direction 308'. In some implementations, the beam steering module 320 can include a second optical element 313 positioned to rotate around the axis 309. The second optical element 313 is also driven by the motor 314 and can rotate at the same speed as the first optical element 312 or at a different speed than the first optical element 312. The difference in rotation speeds may produce different scanning patterns.

Figure 4A:
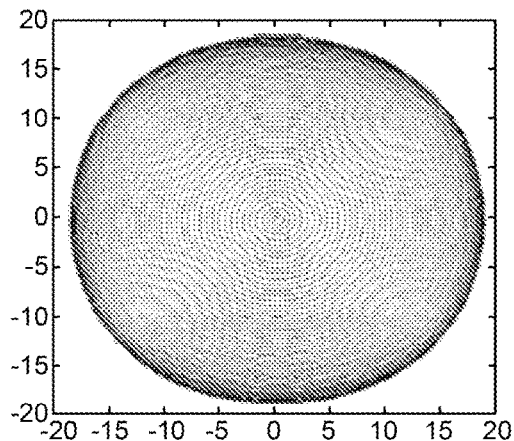
FIG. 4A shows a representative path of outgoing light beams from a beam steering module configured in accordance with one or more embodiments of the present technology.
Figure 4B:
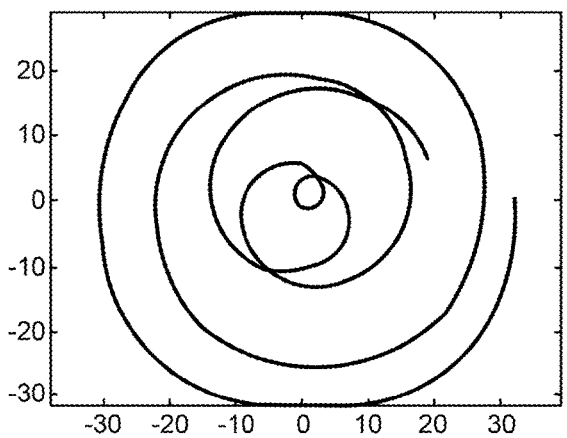
FIG. 4B shows another representative path of outgoing light beams from a beam steering module configured in accordance with one or more embodiments of the present technology.
Figure 4C:
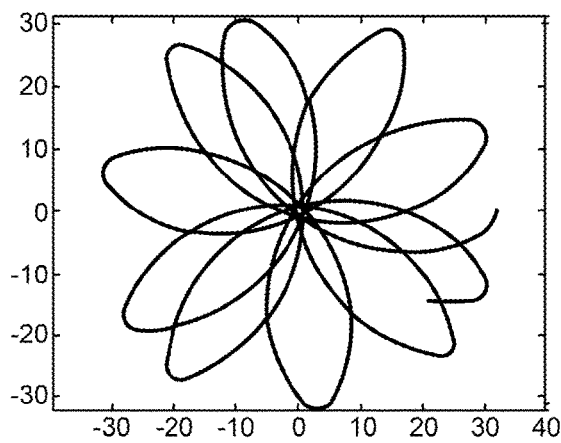
FIG. 4C shows another representative path of outgoing light beams from a beam steering module configured in accordance with one or more embodiments of the present technology.
Figure 4D:
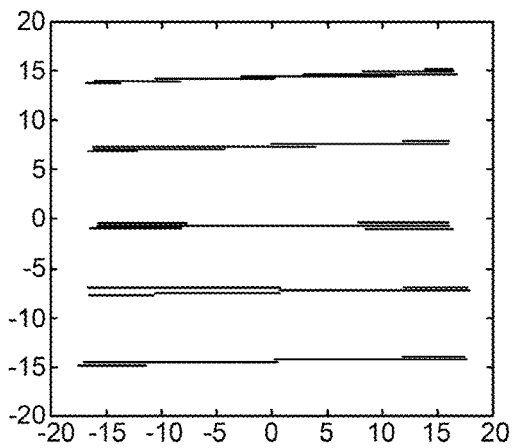
FIG. 4D shows yet another representative path of outgoing light beams from a beam steering module configured in accordance with one or more embodiments of the present technology.

FIGS. 4A-4D show some of the representative paths of the outgoing light beams from a beam steering module configured in accordance with one or more embodiments of the present technology. Depending on the optical components used in the beam steering module, the paths for the outgoing light beams can be dense or sparse, regular or irregular. In particular, an angle between an individual outgoing beam and the axis can remain the same or change over time. For example, when the angles between the axis and individual beams remain the same, the paths of the outgoing light beams form multiple concentric circles. As another example, when the angles between the axis and individual beams change over time, the paths of the outgoing light beams form various irregular shapes as shown in FIGS. 4A-4C. In some embodiments, the beam steering module 320 can be positioned to scan the multiple outgoing light beams back and forth. For example, the beam steering module 320 can include a scanning mirror that oscillates along an axis (e.g., the axis can be one of the sides of the mirror). As shown in FIG. 4D, the paths of the outgoing light beams from the scanning mirror form multiple lines that are generally parallel to each other.

Returning to FIG. 3A, when the outgoing beam in the first direction 308 hits the object 305, the reflected or scattered light may spread over a large angle and only a fraction of the energy may be reflected toward the sensor system 300. For example, the return beam 306 is directed toward the collimator module 303 (e.g., by the beam steering module 320). The collimator module 303 can collect and focus the returned beams 306 on a receiver module 311. The collimator module 303 may include at least a lens and/or a mirror. In some embodiments, a second, separate collimator module that includes at least a lens and/or a mirror can be used to collect and focus the returned beams from the beam steering module 320 towards the receiver module 311. The receiver module 311 can include a plurality of semiconductor receiver units positioned to receive the returned beams 306 and convert light signals from the returned beams to electrical signals.

In some embodiments, the length of the optical path between the source module 301 and the reflector module 302 is generally the same as the length of the optical path between the source module 301 and the receiver module 311, thereby improving the quality of collimation of the light beams.

Figure 3B:
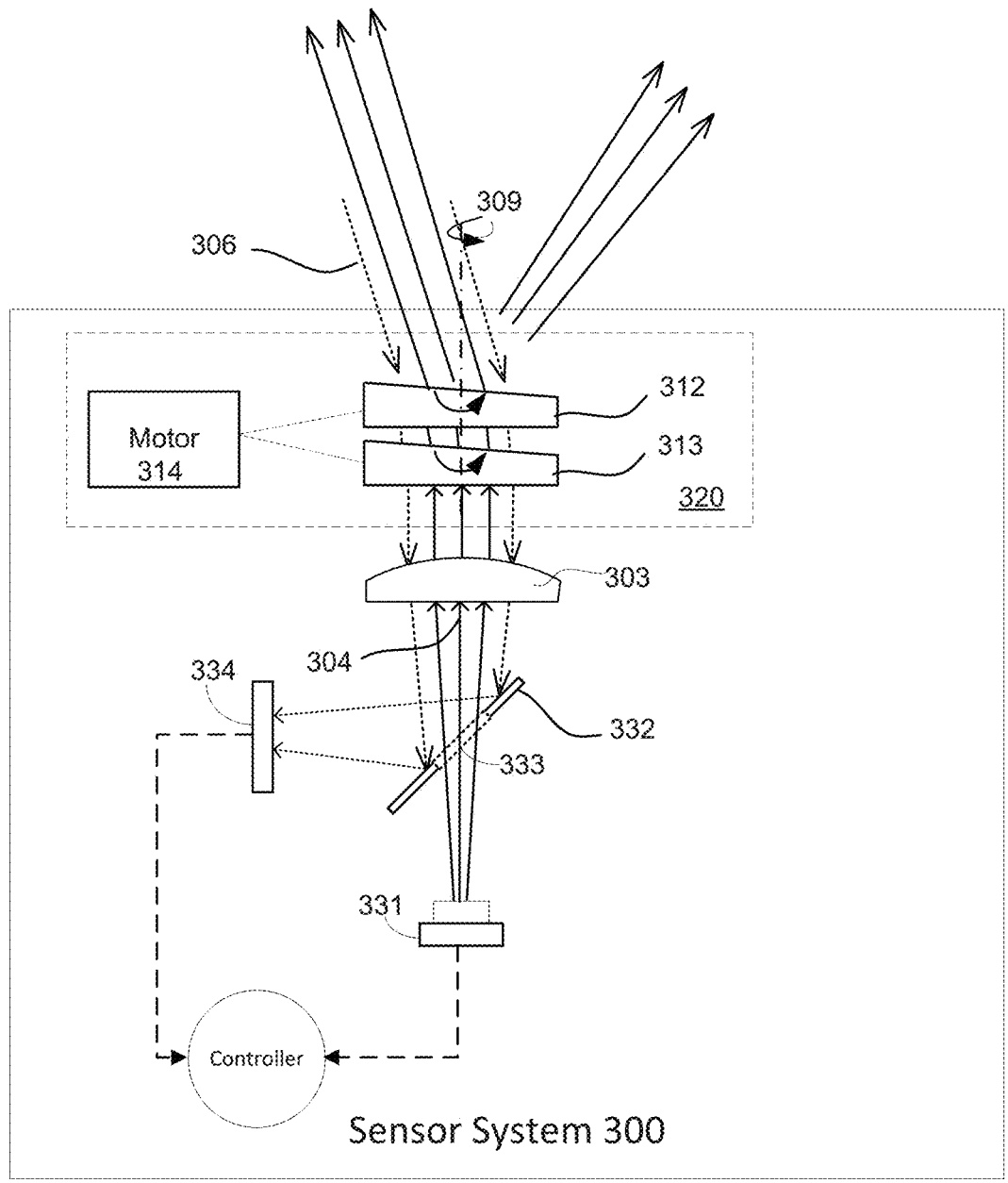
FIG. 3B shows a schematic diagram of another representative sensor system configured in accordance with one or more embodiments of the present technology.

FIG. 3B shows a schematic diagram of another representative sensor system configured in accordance with one or more embodiments of the present technology. In this embodiment, the source module 331 includes multiple diodes positioned to emit multiple light beams 304 within the FOV. A reflector module 332 is positioned in the paths of the multiple light beams 304. In some embodiments, as shown in FIG. 3B, the reflector module includes a transparent area or an opening 333 to allow the multiple light beams 304 to pass through. The collimator 303 then aligns and directs the multiple light beams 304 towards the beam steering module 320. In some embodiments, the reflector module 333 is located along a different axis than the optical axis of the collimator module 303 so that the beams can be collimated by the collimator module 303.

The light beams 304 are collimated by the collimator module 303 and steered by the beam steering module 320 toward the external environment. The returned beams 306 from the one or more objects in the external environment are then collimated by the collimator module 303 and reflected by the reflector module 332 towards the receiver module 334. For example, the collimator module 303 can focus the returned beams 306 and direct the narrowed beams towards the reflector module 332 so that the beams can be received by the receiver module 334.

Similarly, in some embodiments, the length of the optical path between the source module 331 and the reflector module 332 is generally the same as the length of the optical path between the source module 331 and the receiver module 334, thereby improving the quality of collimation of the light beams.

Figure 3C:
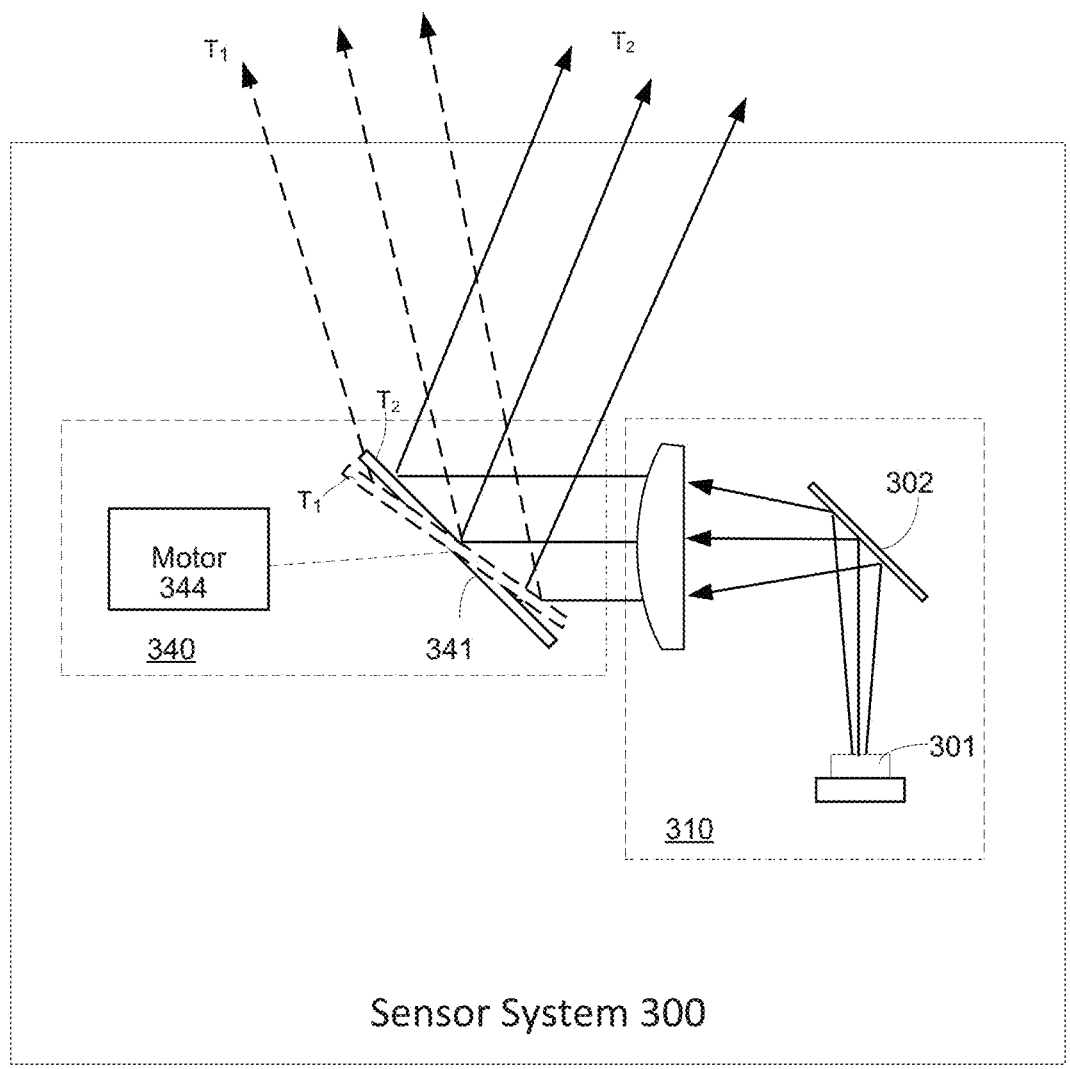
FIG. 3C shows a schematic diagram of another representative sensor system configured in accordance with one or more embodiments of the present technology.

FIG. 3C shows a schematic diagram of another representative sensor system configured in accordance with one or more embodiments of the present technology. In this embodiment, the reflector module 302 includes a first scanning mirror that oscillates to generate multiple outgoing light beams. The beam steering module 340 includes a second scanning mirror 341 coupled to a motor 344. The motor 344 drives the second scanning mirror 341 to oscillate for steering the light beams to the external environment. Both scanning mirrors 302, 341 can oscillate in the same direction or in different directions.

Figure 3D:
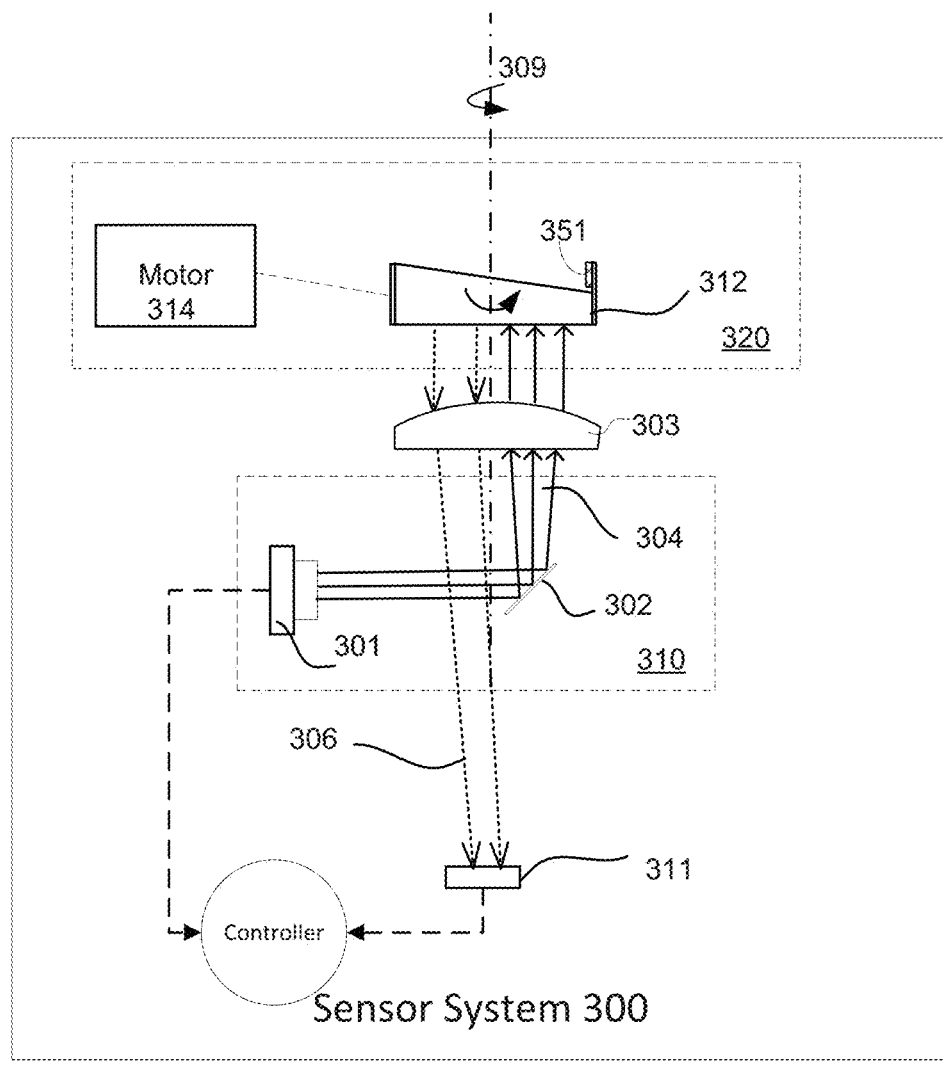
FIG. 3D shows a schematic diagram of yet another representative sensor system configured in accordance with one or more embodiments of the present technology.

FIG. 3D shows a schematic diagram of yet another representative sensor system configured in accordance with one or more embodiments of the present technology. In the embodiment shown in FIG. 3D, the optical element 312 includes a lens having an asymmetrical shape. To account for the uneven weight distribution of the lens, the optical element 312 includes a stabilizer 351 to maintain the balance of the optical element 312 as it rotates. Furthermore, to avoid blocking and/or interfering with the return beams 306, the reflector module 302 can be positioned away from the axis 309 of the optical element 312 so that the multiple light beams 304 from the source module 301 can be directed toward an edge of the optical element 312. However, the reflector module 302 is not positioned too close to the edge of the optical element 312, thereby avoiding the multiple light beams 304 being blocked by the stabilizer 351.

The multi-source emitter can be implemented using various optical configurations, or using a source module that produces multiple light beams. Details of the multi-source emitter and the associated manufacturing techniques are further described in the following embodiments.

Figure 5A:
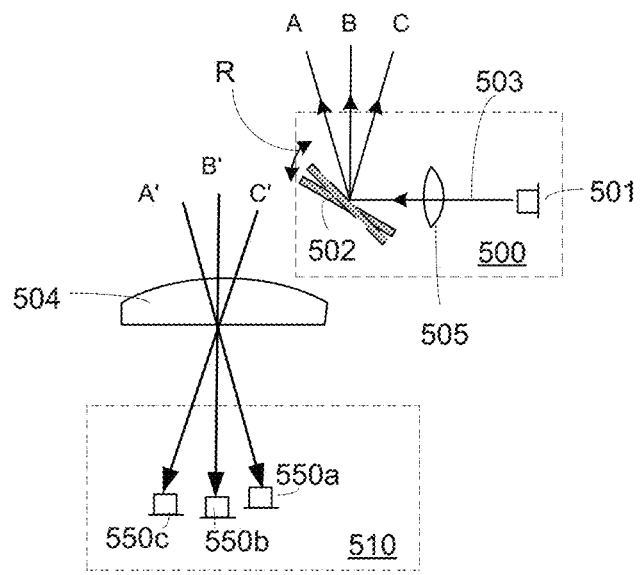
FIG. 5A is a schematic illustration of a representative multi-source emitter module and a corresponding multi-unit receiver module configured in accordance with one or more embodiments of the present technology.

FIG. 5A is a schematic illustration of a representative multi-source emitter module 500 and a corresponding multi-unit receiver module 510 configured in accordance with one or more embodiments of the present technology. The emitter module 500 includes a single diode 501 that emits a light beam, and a reflector module 502 that reflects the light beam. In this embodiment, the reflector module 502 includes a reflective surface (e.g., a single mirror) that can oscillate (as shown by arrow R) at a high frequency within a small angular range. The reflector module 502 can be coupled to an actuator that controls the oscillation of the reflective surface. The oscillation causes the reflective surface to reflect the light beam 503 from the single diode 501 in different directions, such as A, B, and C, sequentially in the time domain. In some embodiments, the reflector module 502 includes a scanning mirror, such as a Micro Electro Mechanical System (MEMS) scanning mirror. In some implementations, the mirror can oscillate within a range of 5 to 10 degrees.

In some embodiments, the multi-source emitter module 520 includes a first collimator module 505 positioned between the source module 501 and the reflector module 502 to align the light beam 503 in a particular direction before the reflector module 502 receives the light beam 503 and emits light beams in the same or different directions.

The multiple light beams may then be reflected by one or more objects in the external environment. A second collimator 504 directs the returned light beams arriving from multiple directions (e.g., A', B', and C') toward the multi-unit receiver module 510 to obtain signals for constructing a model of the external environment. It is noted that the light beams passing through the optical center of the second collimator 504 do not change directions. It is further noted that the receiver units in the multi-unit receiver module 510 are positioned on or in proximity to a curved plane corresponding to the focal plane of the second collimator 504. Thus, light beams that are parallel to A' are collimated to receiver unit 550a, light beams that are parallel to B' are collimated to receiver unit 550b, and light beams that are parallel to C' are similarly collimated to receiver unit 550c.

Figure 5B:
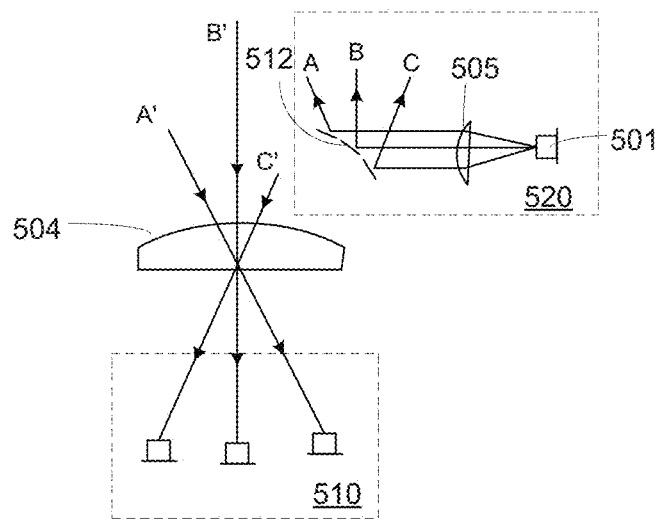
FIG. 5B is a schematic illustration of another representative multi-source emitter module and a corresponding multi-unit receiver module configured in accordance with one or more embodiments of the present technology.

FIG. 5B is a schematic illustration of another representative multi-source emitter module 520 and a corresponding multi-unit receiver module 510 configured in accordance with one or more embodiments of the present technology. The emitter module 520 includes a single diode 501 that emits a light beam and a reflector module 512 that reflects the light beam. In this embodiment, the reflector module 512 includes multiple reflective surfaces. Each surface is positioned to reflect at least a portion of the light beam from the diode 501 and generate a reflected beam in a different direction A, B, and C.

In some embodiments, the multi-source emitter module 520 includes a first collimator module 505 positioned between the source module 501 and the reflector module 512 to align the light beam in one direction before the reflector module 512 receives the light beam and emits light beams in the same or different directions.

In some embodiments, the reflector module 512 includes an array of micro-mirrors coupled to a micro-mirror controller. The controller can control the angular positions of the micro-mirrors, thereby allowing more accurate calibration of the light beams. The light beams are then reflected by one or more objects in the external environment. A second collimator 504 directs the returned light beams arriving from multiple directions (e.g., A', B', and C') from the external environment towards the multi-unit receiver module 510 to obtain signals for constructing a model of the external environment.

Figure 6A:
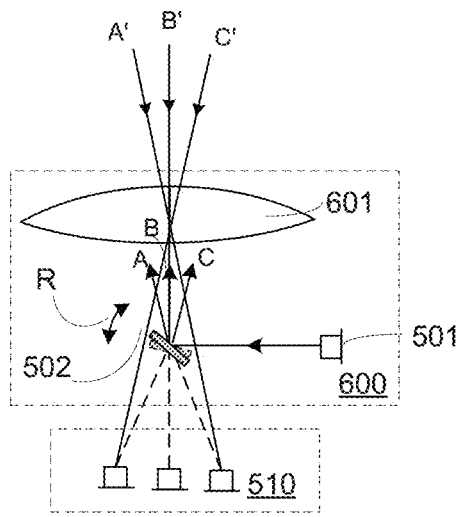
FIG. 6A is a schematic illustration of a representative multi-source emitter module and a corresponding multi-unit receiver module configured in accordance with one or more embodiments of the present technology.

FIG. 6A is a schematic illustration of another representative multi-source emitter module 600 and a corresponding multi-unit receiver module 510 configured in accordance with one or more embodiments of the present technology. In this embodiment, the emitter module 600 and the receiver module 510 share the same collimator module 601. The reflector module 502 includes a single mirror that can oscillate (as shown by arrow R) at a high frequency within a small angular range. The multi-source emitter module 600 also includes a collimator module 601 positioned in paths of multiple reflected light beams from the reflector module. The collimator module 601 can be used to collimate light beams in different directions (e.g., directions A, B, and C) from the reflector module 502 as well as to direct returned light beams in different directions (e.g., directions A', B', and C') from the external environment toward the multi-unit receiver module 510.

Figure 6B:
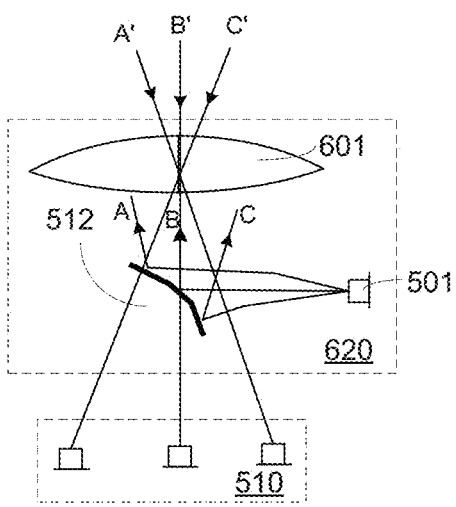
FIG. 6B is a schematic illustration of another representative multi-source emitter module and a corresponding multi-unit receiver module configured in accordance with one or more embodiments of the present technology.

FIG. 6B a schematic illustration of another representative multi-source emitter module 620 and a corresponding multi-unit receiver module 510 configured in accordance with one or more embodiments of the present technology. The reflector module 512 includes multiple reflective surfaces. Each surface is positioned to reflect at least a portion of the light beam from the diode 501 and direct a reflected beam in a different direction. The individual surfaces have a one-to-one correspondence with the individual receiver units in the multi-unit receiver module 510. In some embodiments, the distance between each receiver unit and the corresponding surface is generally the same as the distance between the diode 501 and the corresponding surface.

In the embodiments shown in FIGS. 6A-6B, the emitter module (600, 620) and the receiver module 510 share the same collimator module 601. The collimator module 601 is positioned in the paths of the multiple reflected light beams from the reflector module. The collimator module 601 can be used to collimate light beams in different directions (e.g., directions A, B, and C) as well as to direct returned light beams in different directions (e.g., directions A', B', and C') from the external environment towards the multi-unit receiver module 510.

Figure 6C:
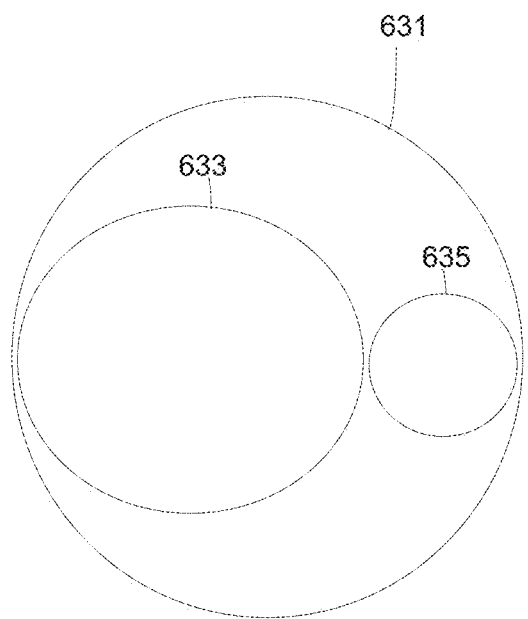
FIG. 6C shows a schematic diagram of various apertures in accordance with one or more embodiments of the present technology when separate collimators are used.

By sharing the collimator module 601, the emitter module 610 and the receiver module 510 can be integrally assembled, thereby allowing easier manufacture of the sensor device with fewer parts. In another advantageous aspect, sharing the collimator module 601 also allows a larger aperture for the returned light beams. In some implementations, to allow a more compact design of the sensor device, the aperture of the beam steering module is shared by the aperture(s) of the collimator module(s). FIG. 6C shows a schematic diagram of various apertures in accordance with one or more embodiments of the present technology in which separate collimators are used. In FIG. 6C, the beam steering module has a first aperture 631. Two separate collimator modules are used; the second aperture 633 of a first collimator module and the third aperture 635 of the second collimator module are calibrated to be within the first aperture 631. It is evident that both the second and third apertures are smaller than the first aperture. By sharing the collimator module, the aperture of the collimator module can be the same size as the aperture 631 of the beam steering module, thereby allowing more returned light beams to be captured by the sensor device.

Figure 7:
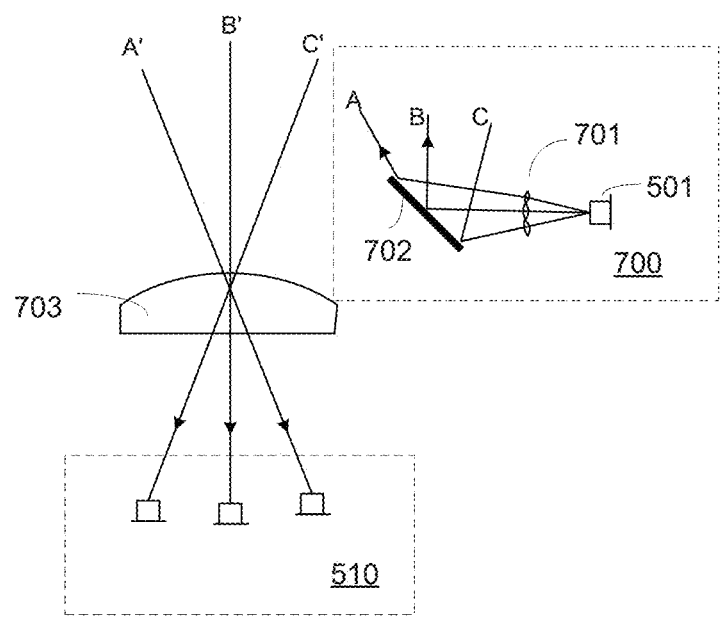
FIG. 7 is a schematic illustration of yet another multi-source emitter module and a corresponding multi-unit receiver module configured in accordance with one or more embodiments of the present technology.

FIG. 7 is a schematic illustration of yet another multi-source emitter module 700 and a corresponding multi-unit receiver module 510 configured in accordance with one or more embodiments of the present technology. The multi-source emitter module 700 includes a single diode 501, a collimator module 701, and a reflector module 702. In this embodiment, the collimator module 701 is positioned between the diode 501 and the reflector module 702 to collimate the light beam before it is reflected by the reflector module 702. The collimator module 701 can be an array of micro-lenses to direct the light beam into the same or different directions. For example, each micro-lens can collimate a portion of the light from the diode 501. The multiple light beams are first reflected by the reflector module 702 to form the multiple outgoing light beams directed in different directions (e.g., A, B, and C). The outgoing light beams are then reflected by one or more objects in the external environment. A second collimator module 703 directs the returned light beams arriving from multiple directions (e.g., A', B', and C') from the external environment towards the multi-unit receiver module 510 to obtain signals for constructing a model of the external environment.

In the embodiments as shown in FIGS. 5A-7, multiple light beams can be generated using a single-source emitter (e.g., single diode) with various optical configurations. FIGS. 8A-8C illustrate a representative diode configured in accordance with one or more embodiments of the present technology. The diode is capable of emitting an electromagnetic energy beam. FIG. 8A shows a side view of a representative diode 800. The diode 800 has a positive side 801 (e.g., P-side or anode) and a negative side 802 (e.g., N-side or cathode). Together, the two sides allow a light beam 803 to be emitted from a light-emitting area 804. FIG. 8B shows an end view of the diode 800 and FIG. 8C shows a top view of the diode 800. In the example as shown in FIG. 8A-8C, the area that emits the light beam may be positioned closer to the P-side 801.

In some embodiments, a single-source emitter module can be packaged in accordance to the disclosed techniques discussed below to obtain a suitable detection range. In some embodiments, a multi-source emitter module can be packaged in accordance to the disclosed techniques discussed below to provide a dense and more evenly distributed data set while complying with the safety and/or energy regulations.

As discussed above, the energy density emitted by each of the diode is typically regulated by local safety and/or power regulations. At the same time, it is desirable to have a large emitting power to achieve a larger detection range. To conform with safety and/or energy regulations while providing a desired detection range, the pulse signals from the diode die can be narrowed—that is, the same amount of energy can be emitted from the diode die within a shorter period of time. The emitter thus can achieve higher power for each of the pulse signals without exceeding the total energy density limits under the energy and/or safety regulations.

However, the narrower the pulse, the greater the dissipated energy caused by the inductance of the associated circuitry, which can be a significant impediment to increasing the transmit power. In addition, the large inductance such as distributed inductance can delay the response time of the diode die, thereby extending the narrow pulse signals to undesirably wide ones. This can become a significant impediment to increasing the transmission power.

It is thus desirable to reduce the distributed inductance in the associated circuitry. Currently, a packaged component that includes the emitting diode is typically coupled to the system circuitry via metal wires. The corresponding control circuitry of the emitting diode is typically located outside of the packaged component. Such a configuration can introduce a large amount of distributed inductance. Embodiments of the present technology provide techniques that can be used to reduce the distance between the associated control circuitry and the emitting diode(s), thereby reducing the distributed inductance caused by the circuitry. The techniques can also be used in various embodiments to achieve a more integrated and compact packaged component.

Figure 9A:
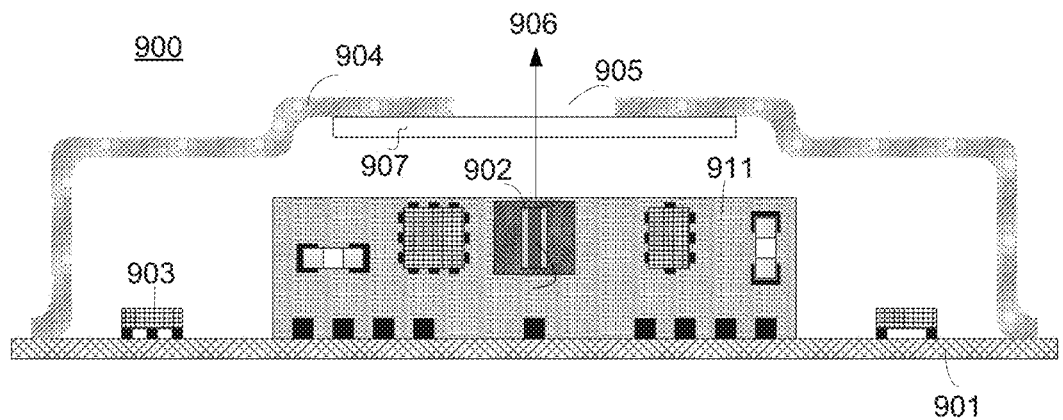
FIG. 9A shows a cross-sectional view of a representative packaged diode configured in accordance with embodiments of the present technology.
Figure 9B:
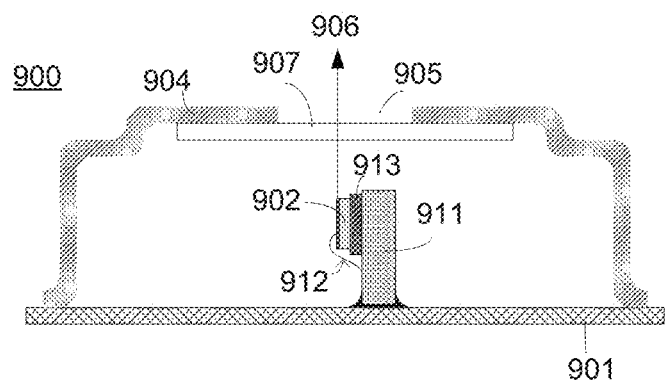
FIG. 9B shows another cross-sectional view of a representative packaged diode configured in accordance with embodiments of the present technology.

FIGS. 9A-9B illustrate a representative packaged diode 900 configured in accordance with embodiments of the present technology. FIG. 9A shows a cross-section view of a representative packaged diode 900. The packaged diode 900 includes a substrate 901 and a diode die 902 carried by the substrate 901 (e.g., via a carrier 911). The diode die is positioned to emit an electromagnetic energy beam 906 (e.g., a laser beam). The package diode 900 also includes a shell 904 coupled to the substrate 901 to enclose the diode die 902. The shell includes an opening or a transparent area 905 to allow the electromagnetic energy beam emitted from the diode die to pass through the shell. In some embodiments, the electromagnetic energy beam emitted from the diode die passes through the shell 904 directly. The electromagnetic energy beam can also be directed by additional optical components before it passes through the shell 904.

In some embodiments, the packaged diode 900 includes a control circuit 903 on the substrate to control the diode die 902. The shell 904 is positioned to enclose both the diode die 902 and the control circuit 903. The control circuit 902 can include a switching component and/or a driver circuit. The switching component can be used to turn on/off the driver circuit, thereby controlling the diode die 902. In some implementations, the control circuit 902 includes at least one of the following: a field-effect transistor, a resistor, or a capacitor. Because the control circuit 902 is packaged together with the diode die 902, the inductance such as distributed inductance of the control circuit can be configured as to reduce the impact on the response time of the diode die 902.

In some embodiments, the packaged diode 900 includes a protective plate 907 covering at least partially the opening or the transparent area 905 of the shell. In some implementations, the protective plate 907 includes a transparent material to allow at least 98% of electromagnetic energy from the electromagnetic energy beam to pass through. In some embodiments, the shell 904 includes a metallic material. The shell 904 can be manufactured using techniques such as injection molding.

FIG. 9B shows another cross-section view of the representative packaged diode 900 including a carrier 911 for carrying the diode die 902. A positive side (e.g., anode) of the diode die 902 is connected to the substrate 901 using a conductive wire 912. Because the conductive wire 912 is thin and narrow, it can be purposely placed such that the electromagnetic energy beam can pass through the opening or the transparent area 905 of the shell 904 without being obstructed. A negative side (e.g., cathode) of the diode die is attached to the carrier 911 to electrically connect the diode die to the system circuitry.

In some embodiments, the carrier 911 includes a thermally conductive material for conducting heat from the diode die 902 to the substrate 901. For example, the carrier 911 may include a cermet or silicon material having a metallic pattern. In some implementations, the carrier 911 can include a copper layer 913 attached to the diode die 902 to conduct heat from the diode die to the substrate 901.

Figure 9C:
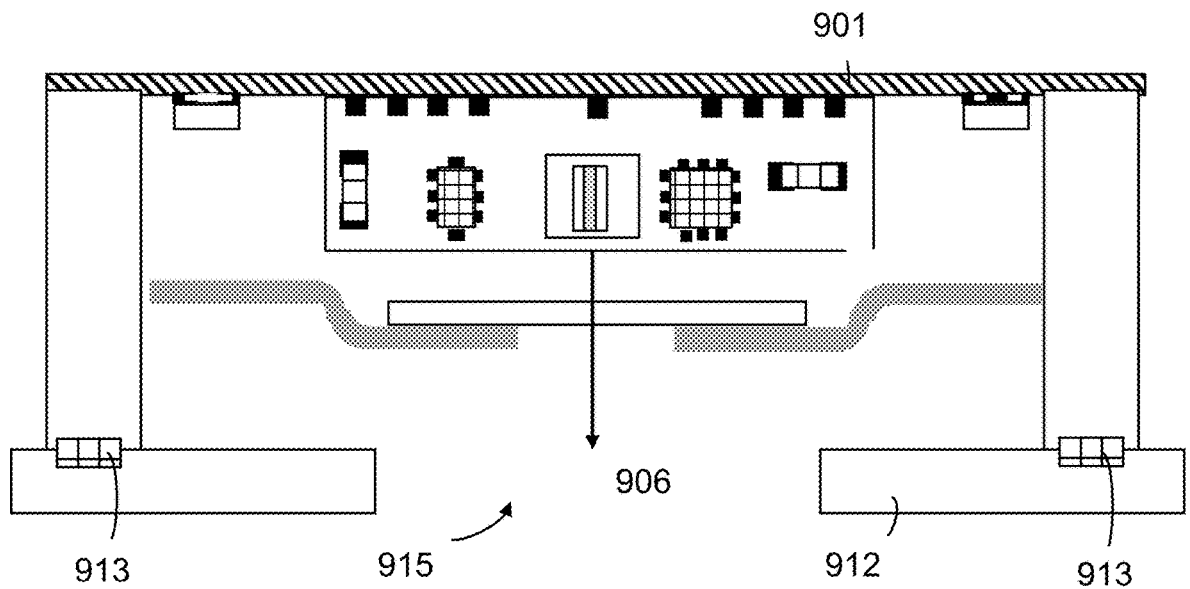
FIG. 9C shows an example of a substrate coupled to a printed circuit board via one or more pins configured in accordance with embodiments of the present technology.
Figure 9D:
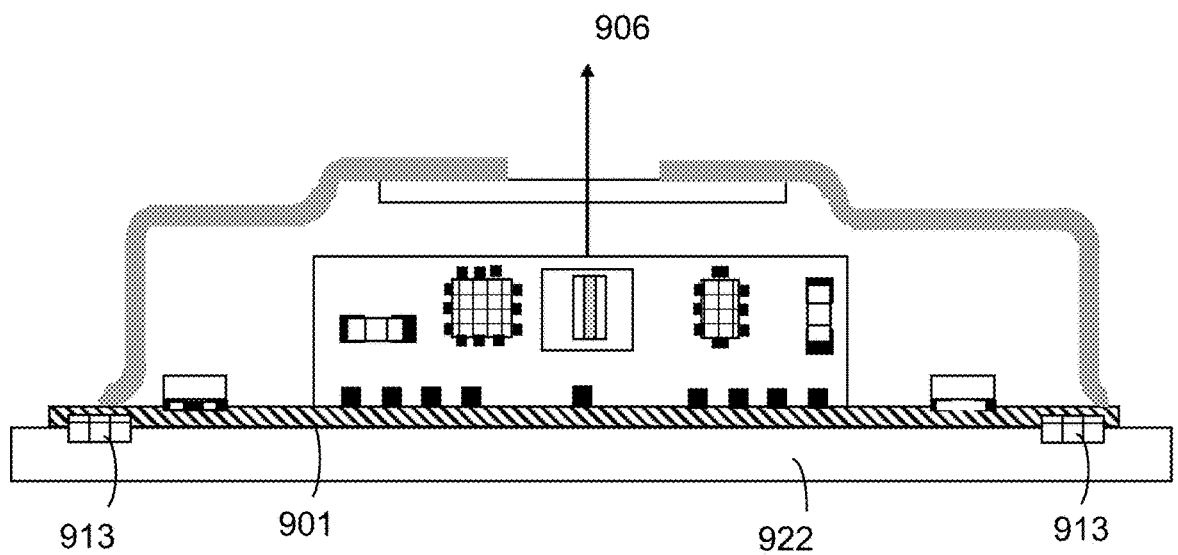
FIG. 9D shows another example of a substrate coupled to a printed circuit board via one or more pins configured in accordance with embodiments of the present technology.

In some embodiments, the substrate 901 is coupled to the system circuitry (e.g., a printed circuit board) via one or more pins. FIG. 9C shows an example of the substrate 901 coupled to a printed circuit board 912 via one or more pins 913 configured in accordance with embodiments of the present technology. The printed circuit board 912 includes a hole 915 to allow the electromagnetic energy beam 906 to come through. FIG. 9D shows another example of the substrate 901 coupled to the printed circuit board 922 via one or more pins 913 configured in accordance with embodiments of the present technology. In this embodiment, the electromagnetic energy beam 906 is emitted in a direction opposite to the printed circuit board 922.

Figure 9E:
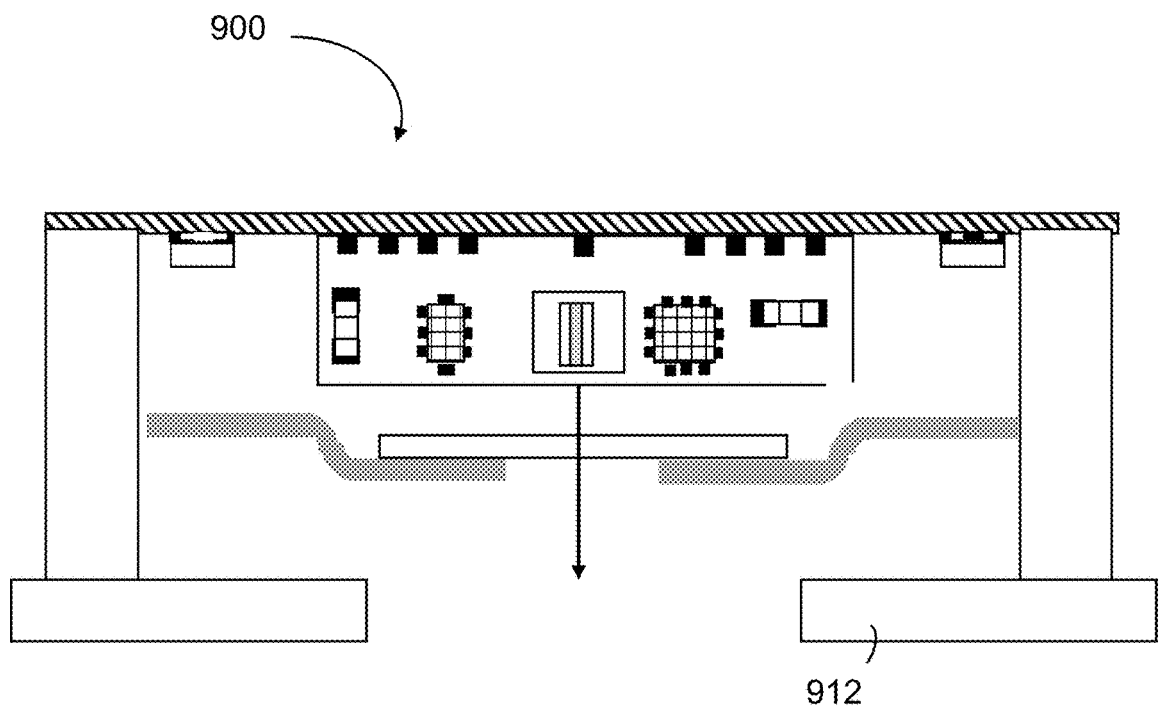
FIG. 9E shows an example of a packaged diode surface-mounted onto a printed circuit board configured in accordance with embodiments of the present technology.
Figure 9F:
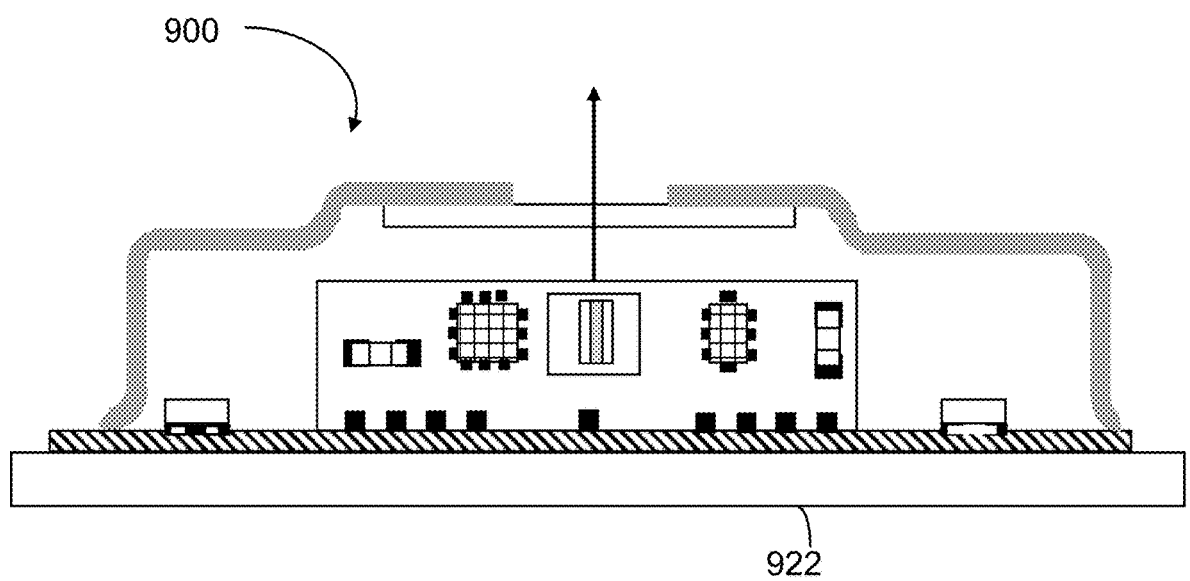
FIG. 9F shows another example of a packaged diode surface-mounted onto a printed circuit board configured in accordance with embodiments of the present technology.

In some embodiments, the substrate 901 is surface-mounted onto the system circuitry. Currently, manual labor is typically required for welding the metal wires to couple the substrate to the printed circuit board. Using surface mounting techniques, the substrate can be coupled to the printed circuit board automatically via a thin layer of metal, reducing the amount of manual effort in the manufacturing process. FIGS. 9E-9F show two examples of the packaged diode 900 surface-mounted onto the printed circuit board (912, 922) configured in accordance with embodiments of the present technology.

Figure 9G:
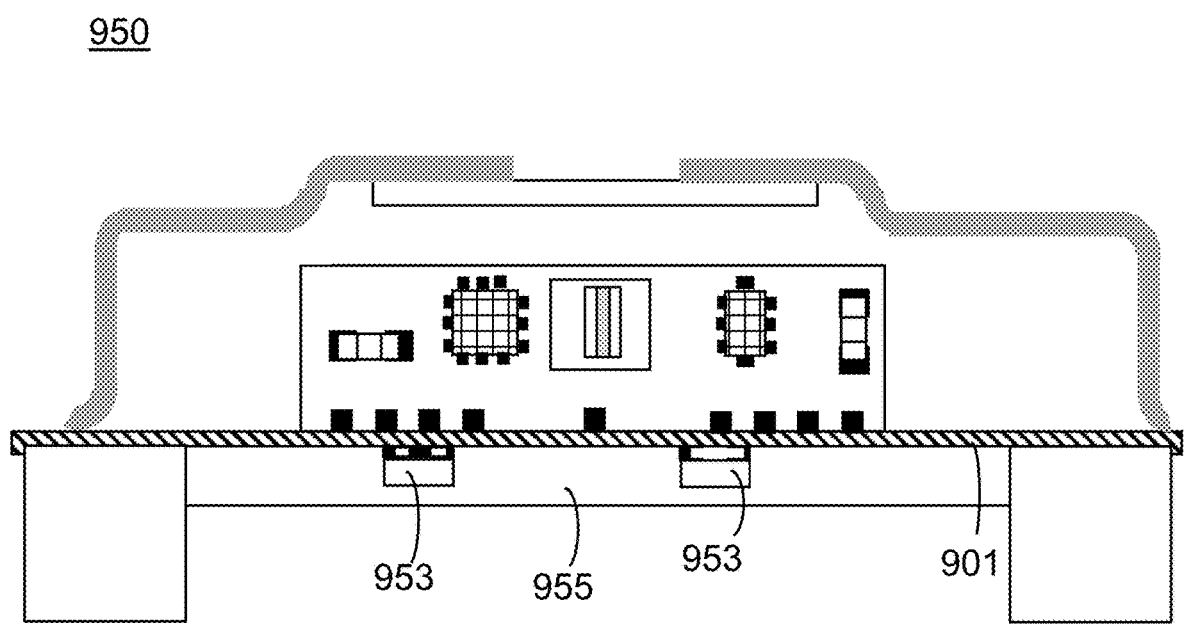
FIG. 9G illustrates another representative packaged diode configured in accordance with embodiments of the present technology.

FIG. 9G illustrates another representative packaged diode 950 configured in accordance with embodiments of the present technology. The packaged diode 950 includes one or more control circuit components 953 on the other side of the substrate 901. By placing the control circuit component on the other side of the substrate 901, the distance between the control circuit component 953 and the corresponding diode 902 can be reduced, thereby reducing the distributed inductance accordingly. In some embodiments, the packaged diode 950 includes a glue 955 (e.g., an ultra-violet glue) to protect the control circuit 953 on the other side of the substrate 901.

The packaging process for the embodiment shown in FIGS. 9A-9B can include the following steps:

Step 1.a: Place the control circuit on the substrate using a surface mount technique (SMT).

Step 1.b: Couple a copper layer to the carrier using a die bonding technique. This step can be skipped if the carrier itself includes a thermally conductive material.

Step 1.c: Couple the cathode of the diode die to the carrier using a die bonding technique (e.g., with a conductive glue).

Step 1.d: Connect the anode of the diode die to the carrier using a wire bonding technique (e.g., via a conductive wire).

Step 1.d: Place the carrier on the substrate using a surface mount technique such that the light emitting surface of the diode die aligns with the opening or the transparent area of the shell.

Step 11: Place the shell on the substrate using a surface mount technique.

Figure 10A:
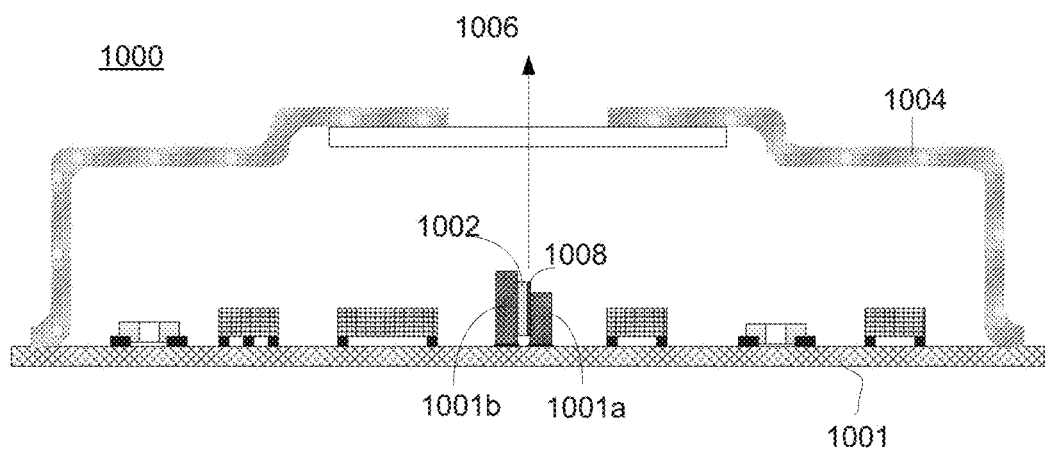
FIG. 10A illustrates another representative packaged diode configured in accordance with embodiments of the present technology.

FIG. 10A illustrates another representative packaged diode 1000 configured in accordance with embodiments of the present technology. In this embodiment, the packaged diode 1000 includes multiple heat sinks 1001a, 1001b for carrying the diode die 1002. The heat sinks 1001a, 1001b also transmit heat from the diode die 1002 to the substrate 1001. The positive side (e.g., anode) of the diode die 1002 is attached to a first heat sink 1001a and a negative side (e.g., cathode) of the diode die 1002 is attached to a second heat sink 1001b.

Figure 10B:
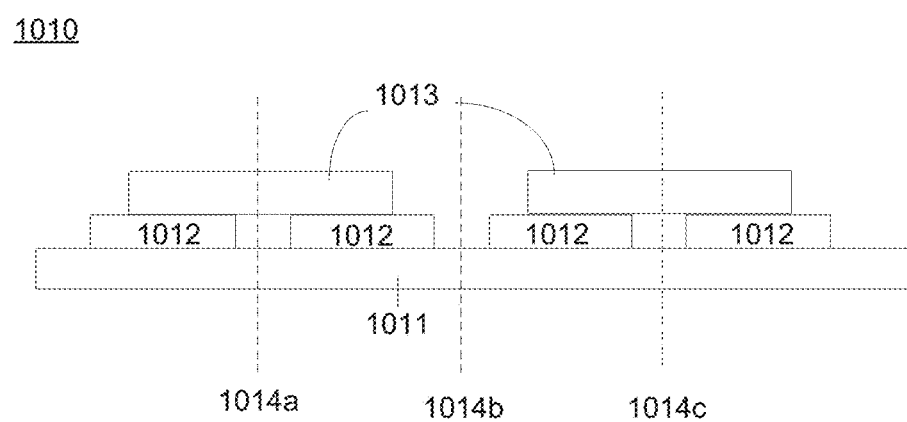
FIG. 10B is a schematic diagram showing a manufacturing process for providing a diode die configured in accordance with embodiments of the present technology.

In some embodiments, the first heat sink 1001a has a shorter length than the second heat sink 1001b. In one advantageous aspect, the different lengths of the heat sinks allow the electromagnetic energy beam 1006 to pass through the opening or the transparent area of the shell 1004. For example, as shown in FIG. 10A, the emitting area 1008 is closer to one side of the diode die (e.g., the positive side). By placing the emitting area 1008 toward the shorter heat sink 1001a, the electromagnetic energy beam 1006 from the diode die 1002 can pass through the opening or the transparent area of the shell 1004. In another advantageous aspect, the different lengths of the heat sinks allow an easier manufacturing process. For example, as shown in FIG. 10B, multiple diode dice 1012 can be placed on a layer of heat sink material 1011. The negative sides of the multiple diode dice 1012 can be coupled to the layer of heat sink material 1011 to allow the emitting areas of the multiple diode dice 1012 to face upwards. Multiple pieces of the heat sink material 1013 then can be placed onto pairs of diode dice 1012. The assembly 1010 can be cut long multiple lines 1014a, 1014b, 1014c to obtain multiple individual diode dice that are carried by corresponding multiple heat sinks. It is noted that both the layer of heat sink material 1011 beneath the diode dice 1012 and the heat material 1013 above the diode dice 1012 can be cut at the same time to allow the cut ends of the heat sinks on both sides to be flush, thereby ensuring that the electromagnetic energy beam can be emitted generally perpendicular to the substrate after the heat sinks are positioned onto the substrate.

In some embodiments, copper or other conductive materials can be included in the heat sink. The heat sink can serve two functions: electrically connecting the diode die to the substrate, and conducting heat that is generated from the diode die to the substrate.

Figure 10C:
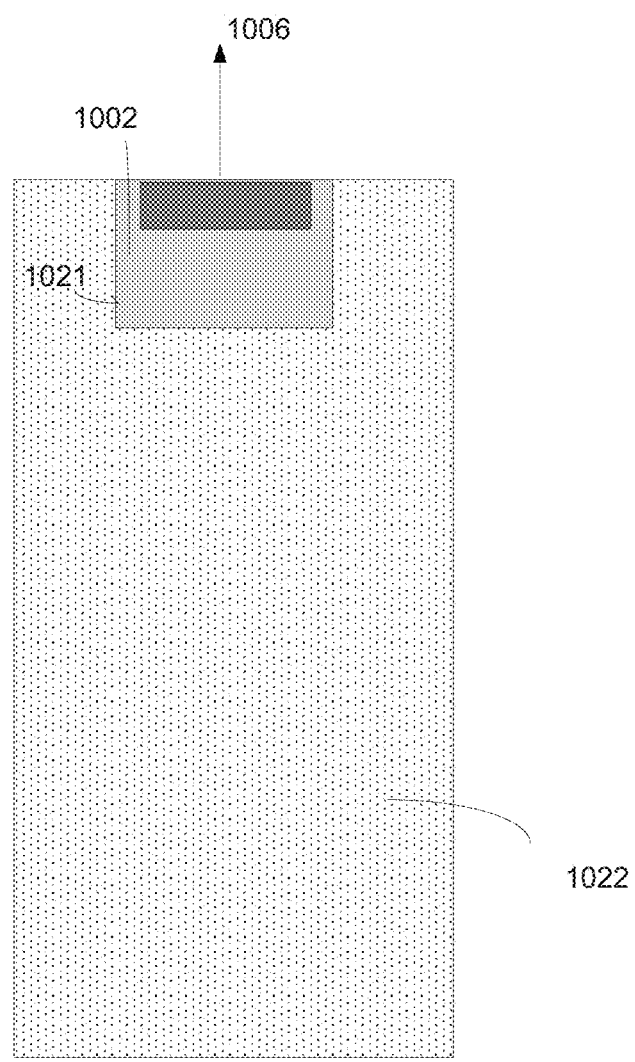
FIG. 10C shows a side view of a representative heat sink that is coupled to the positive side of a diode die configured in accordance with embodiments of the present technology.

In some embodiments, the electromagnetic energy beam 1006 has a certain divergence angle. Thus, the heat sink that is coupled to the positive side of the diode die may need a groove to avoid obstructing the electromagnetic energy beam 1006. FIG. 10C shows a side view of a representative heat sink 1022 that is coupled to the positive side of a diode die 1002 configured in accordance with embodiments of the present technology. In this embodiment, the heat sink 1011 includes a groove 1021 positioned to allow the electromagnetic energy beam 1006 emitted from the diode die to pass through the opening or the transparent area of the shell. In some implementations, the heat sink that is coupled to the negative side of the diode does not include any groove so that the manufacturing process can be simplified.

Figure 10D:
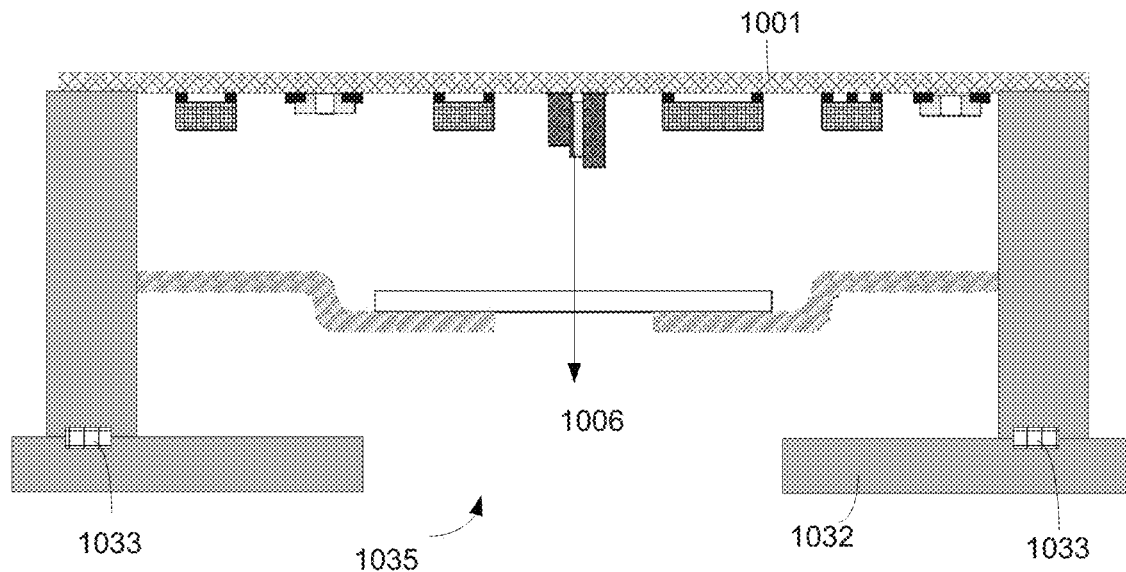
FIG. 10D shows an example of a substrate coupled to a printed circuit board via one or more pins configured in accordance with embodiments of the present technology.
Figure 10E:
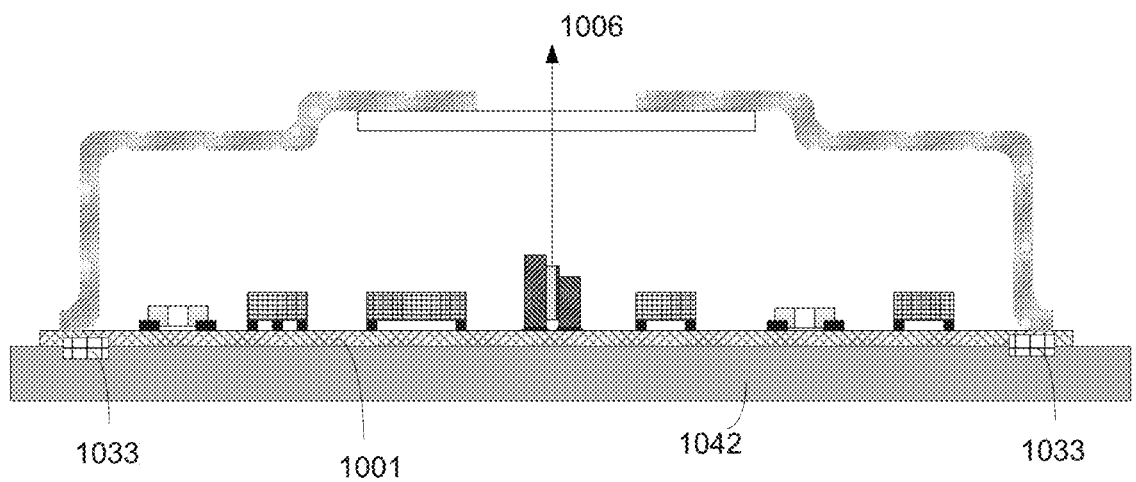
FIG. 10E shows another example of a substrate coupled to a printed circuit board via one or more pins configured in accordance with embodiments of the present technology.

In some embodiments, the substrate 1001 is coupled to the system circuitry (e.g., a printed circuit board) via one or more pins. FIG. 10D shows an example of the substrate 1001 coupled to a printed circuit board 1032 via one or more pins 1033 configured in accordance with embodiments of the present technology. The printed circuit board 1032 includes a hole 1035 to allow the electromagnetic energy beam 1006 to come through. FIG. 10E shows another example of the substrate 1001 coupled to the printed circuit board 1042 via one or more pins 1033 configured in accordance with embodiments of the present technology. In this embodiment, the electromagnetic energy beam 1006 is emitted in a direction opposite to the printed circuit board 1042.

Figure 10F:
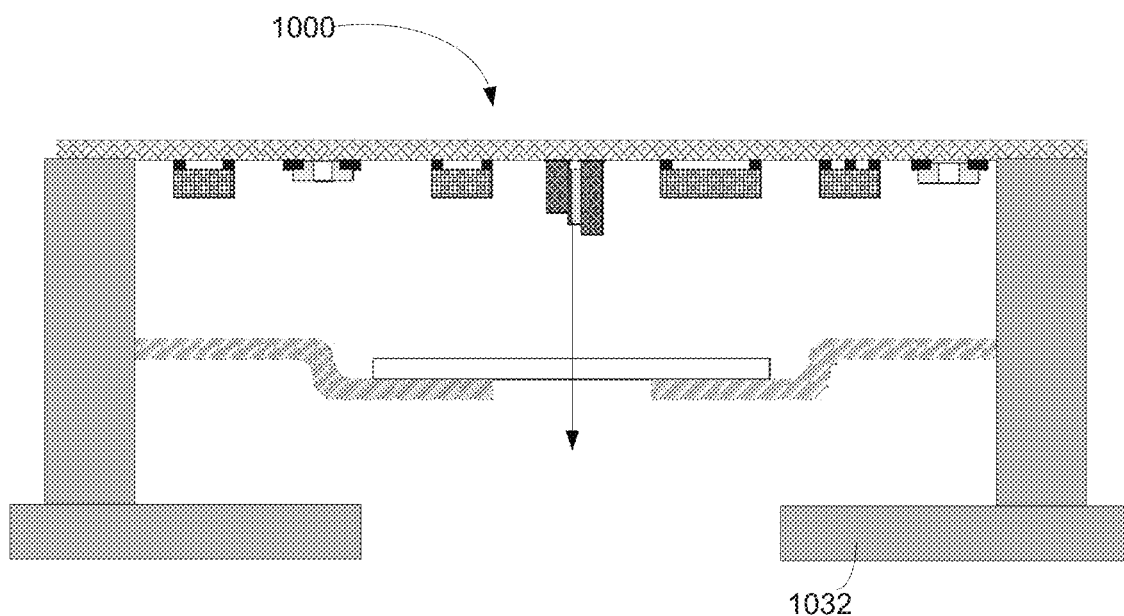
FIG. 10F shows an example of a packaged diode surface-mounted onto a printed circuit board configured in accordance with embodiments of the present technology.
Figure 10G:
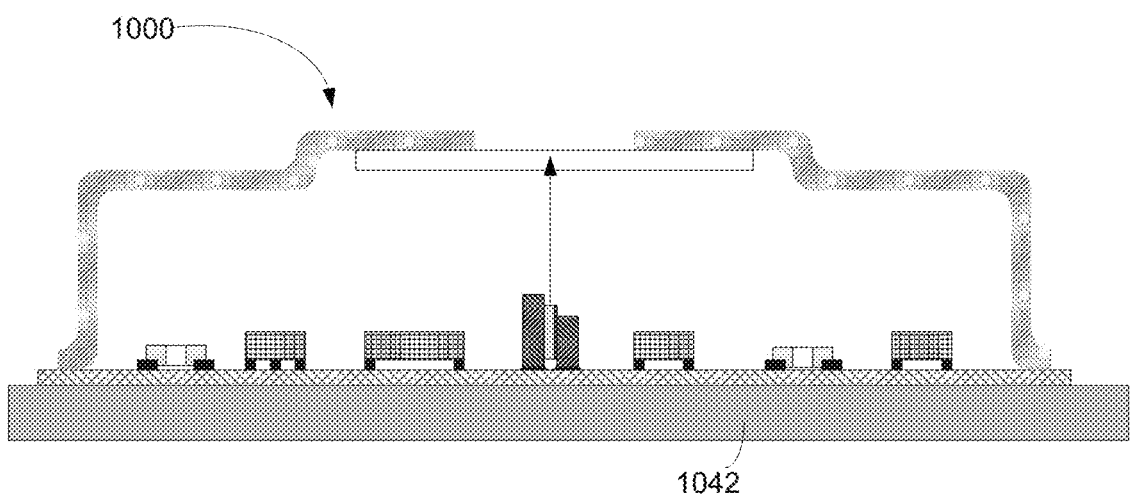
FIG. 10G shows another example of a packaged diode surface-mounted onto a printed circuit board configured in accordance with embodiments of the present technology.

In some embodiments, the substrate 1001 is surface-mounted onto the system circuitry. As discussed above, manual labor is typically required for welding the metal wires to couple the substrate to the printed circuit board. Using surface mounting techniques, the substrate can be coupled to the printed circuit board automatically via a thin layer of metal, reducing the amount of manual effort in the manufacturing process. FIGS. 10F-10G show two examples of the packaged diode 1000 surface-mounted onto the printed circuit board (1032, 1042) configured in accordance with embodiments of the present technology.

Figure 11A:
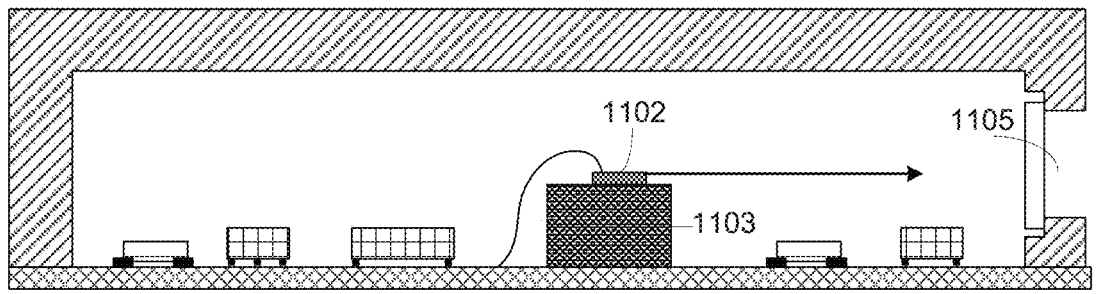
FIG. 11A illustrates a representative configuration configured in accordance with embodiments of the present technology to allow a diode die to emit a light beam generally parallel to a substrate.
Figure 11B:
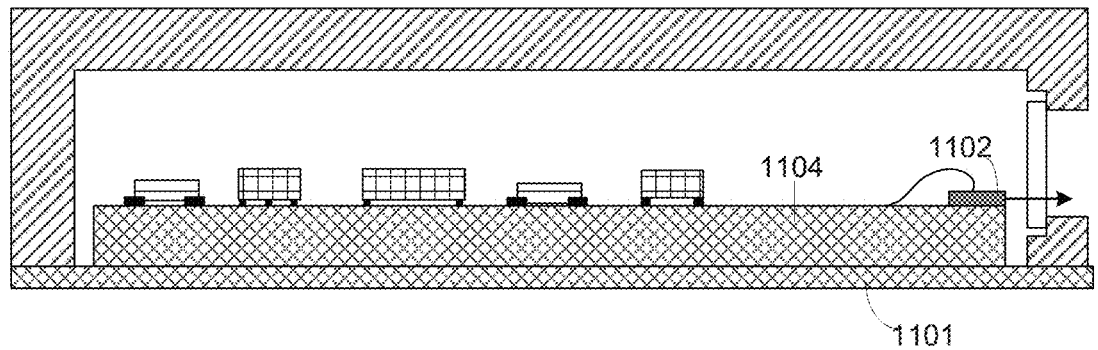
FIG. 11B illustrates another representative configuration configured in accordance with embodiments of the present technology to allow a diode die to emit a light beam generally parallel to a substrate.

The diode die can be positioned to emit the light beam in the same or different directions. For example, as shown in FIGS. 9A and 10A, the emitted beam can be generally perpendicular (e.g., 90°±5) to the substrate. FIGS. 11A-11B demonstrate different configurations configured in accordance with embodiments of the present technology to allow the diode die to emit a light beam generally parallel (0°±5') to the substrate.

Figure 11C:
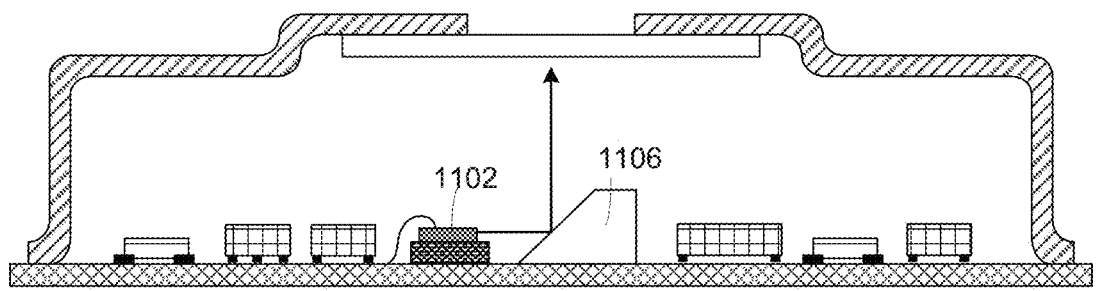
FIG. 11C illustrates yet another representative configuration configured in accordance with embodiments of the present technology to allow a diode die to emit a light beam generally parallel to a substrate.

As shown in FIG. 11A, a carrier 1103 can be positioned under the diode die 1102 such that the light emitted from the diode die 1102 can exit from an opening 1105 of the shell. Alternatively, as shown in FIG. 11B, the diode die 1102 and other components can be coupled to the substrate 1101 via a larger carrier 1104. In some embodiments, the larger carrier 1104 is a part of the substrate 1101. For example, the shape of the substrate 1101 is partially raised in the middle to form the carrier 1104. In another example shown in FIG. 11C, a reflective component 1106 is positioned to reflect the light beam from the diode die 1101 and generate a corresponding outgoing light beam that is generally perpendicular (e.g., 90°±5°) to the substrate 1101.

The packing techniques described above can be used to package multiple diode dice in a single packaged component. By packaging multiple diode dice together, a small, suitable distance between adjacent diode dice can be achieved, resulting in a more compact design of the packaged component and corresponding optical parts. Furthermore, this design can also reduce inductance. Thus, the impact of inductance on the narrow pulse signals can be mitigated.

Figure 12A:
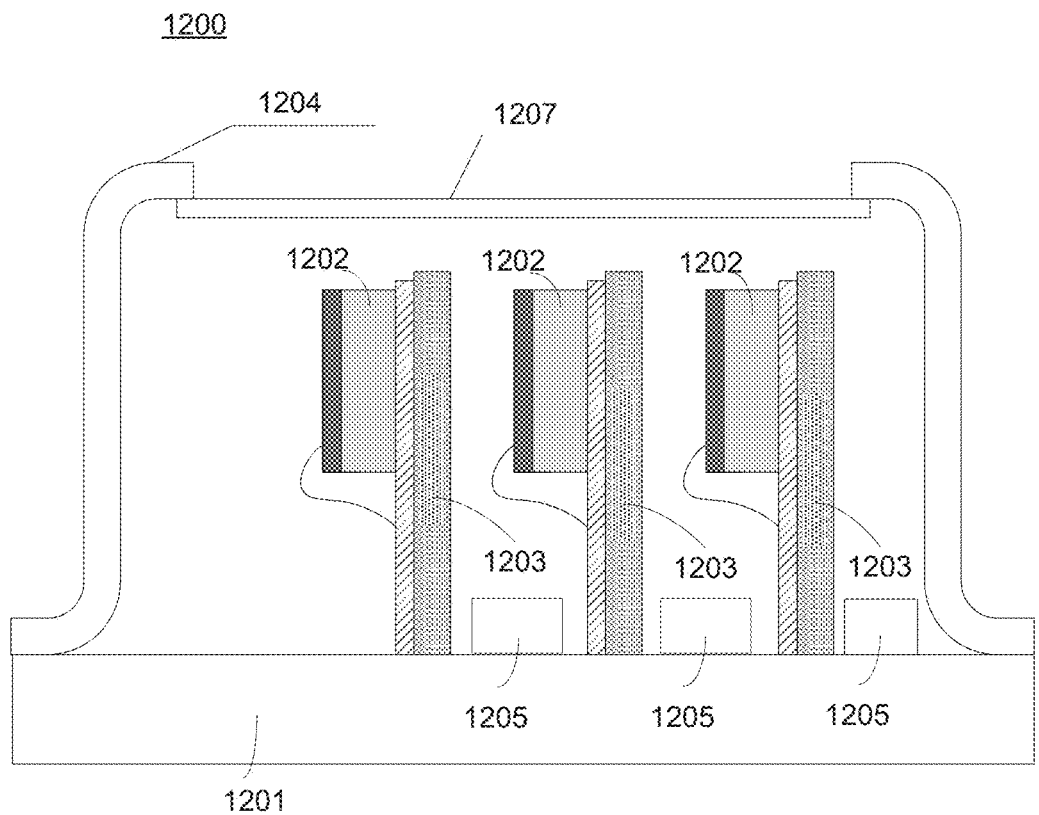
FIG. 12A shows a representative packaged component that includes multiple diode dice configured in accordance with embodiments of the present technology.

FIG. 12A shows a representative packaged component 1200 that includes multiple diode dice configured in accordance with embodiments of the present technology. In this embodiment, individual diode dice 1202 are carried by corresponding carriers 1203. The diode dice 1202 are positioned to emit multiple light beams through the transparent protective plate 1207 of the shell 1204. In some embodiments, the packaged component 1200 includes one or more control circuit components 1205 positioned on the substrate, each configured to control a corresponding diode die 1202. The shell 1204 is positioned to enclose both the diode dice 1202 and the control circuit components 1205.

In many embodiments, the packaged component and a collimator module (e.g., a lens) are assembled together so that the collimator module can direct the beams over a large range of angles. Therefore, it is desirable to consider the focal plane of the collimator module when positioning the multiple diode dice on the substrate. For example, the multiple diode dice can be positioned on a curved plane that corresponds to the focal plane of the collimator module.

Figure 12B:
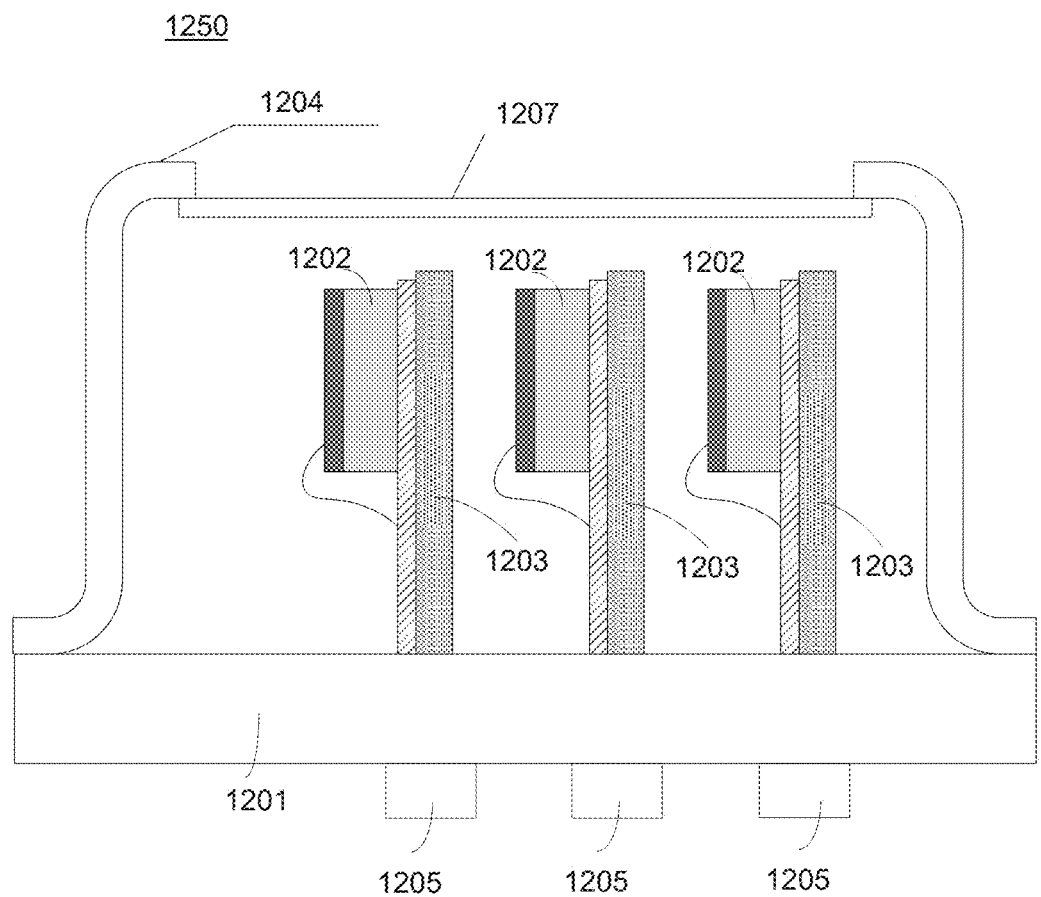
FIG. 12B shows another representative packaged component that includes multiple diode dice configured in accordance with embodiments of the present technology.

FIG. 12B shows another representative packaged component 1250 that includes multiple diode dice configured in accordance with embodiments of the present technology. In this embodiment, the control circuit components are positioned on the opposite side of the substrate 1201. Each diode die 1202 has a corresponding control circuit component 1205 that is positioned beneath the substrate so that the distance between a diode die 1202 and the corresponding control circuit component 1205 can be minimized, thereby reducing distributed inductance.

Figure 13A:
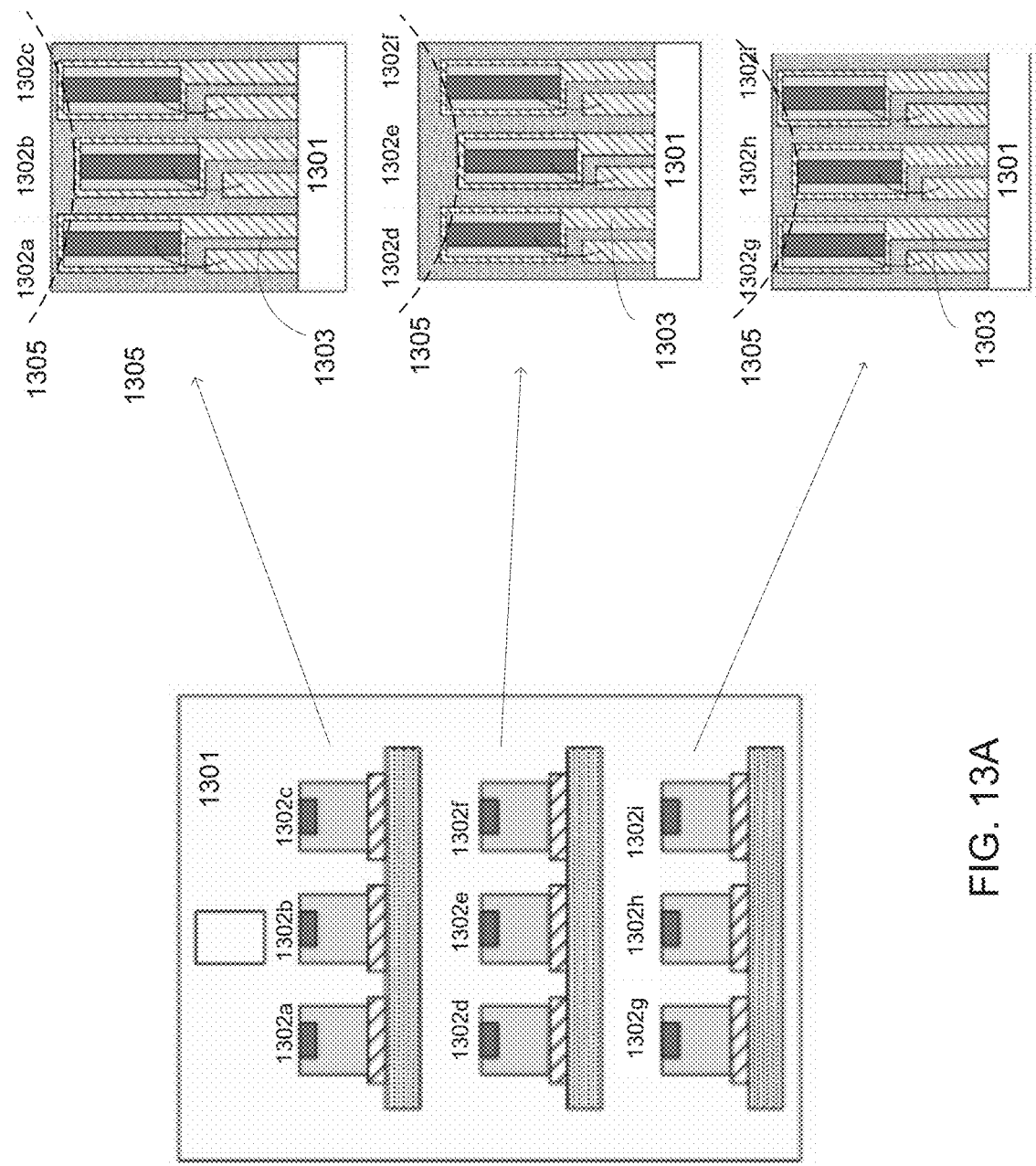
FIG. 13A shows a representative configuration of diode dice designed to account for a focal plane of a collimator module configured in accordance with embodiments of the present technology.

FIG. 13A shows a representative configuration of diode dice designed to account for a focal plane of a collimator module configured in accordance with embodiments of the present technology. In this embodiment, a 3×3 diode dice array is packaged together. The diode dice 1302a-1302i are carried by the substrate 1301 via corresponding carriers 1303. Diode dice 1302a-1302c form the first row in the array, diode dice 1302d-1302f form the second row in the array, and diode dice 1302g-1302i form the third row in the array. The multiple carriers 1303 have different heights such that the emission surfaces of the multiple diode dice are positioned on the curved plane 1305 corresponding to the focal plane of the collimator module.

Figure 13B:
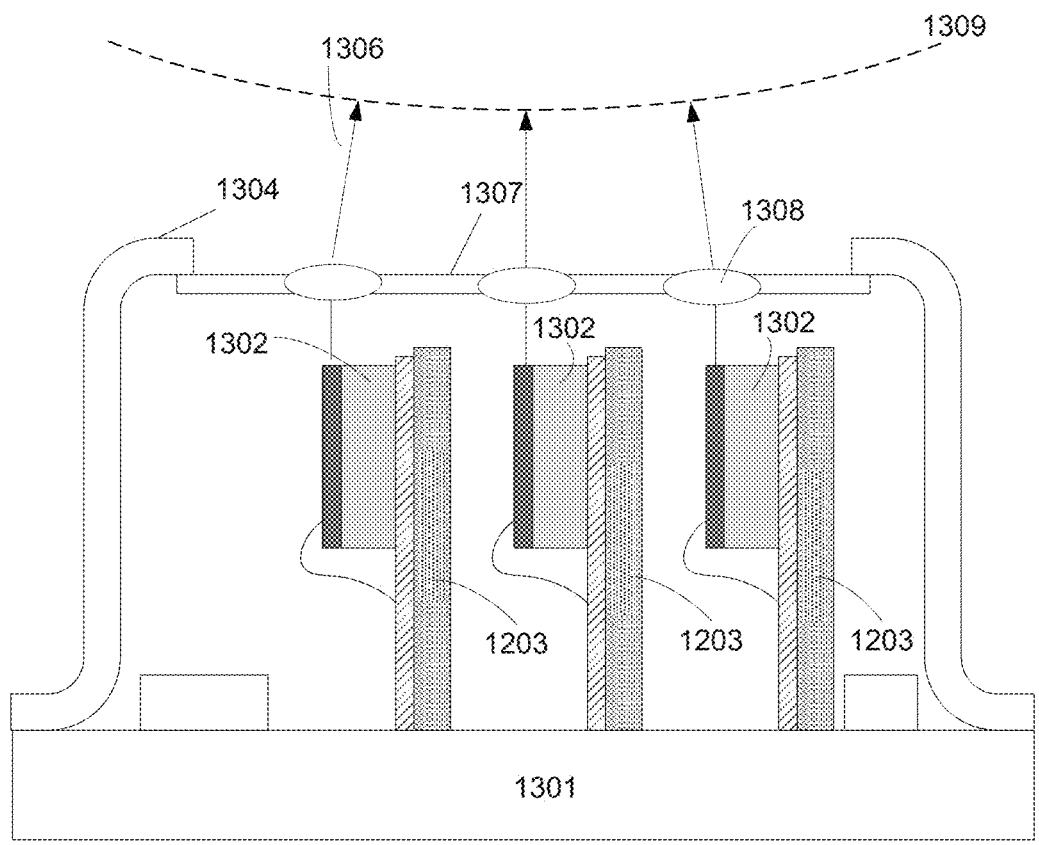
FIG. 13B shows another representative configuration designed to account for the focal plane of the collimator module configured in accordance with embodiments of the present technology.

FIG. 13B shows another representative configuration designed to account for the focal plane of the collimator module configured in accordance with embodiments of the present technology. In this embodiment, the packaged component comprises multiple micro-lenses 1308 positioned in paths of the multiple electromagnetic energy beams to generate multiple refracted electromagnetic energy beams that correspond to a focal plane 1309 of the collimator module. For example, the lenses 1308 can be integrated with a transparent protective cover 1307 that covers at least a part of an opening or transparent area of the shell 1304. The electromagnetic energy beams 1306 are refracted corresponding to the focal plane 1309 of the collimator module.

Figure 14A:
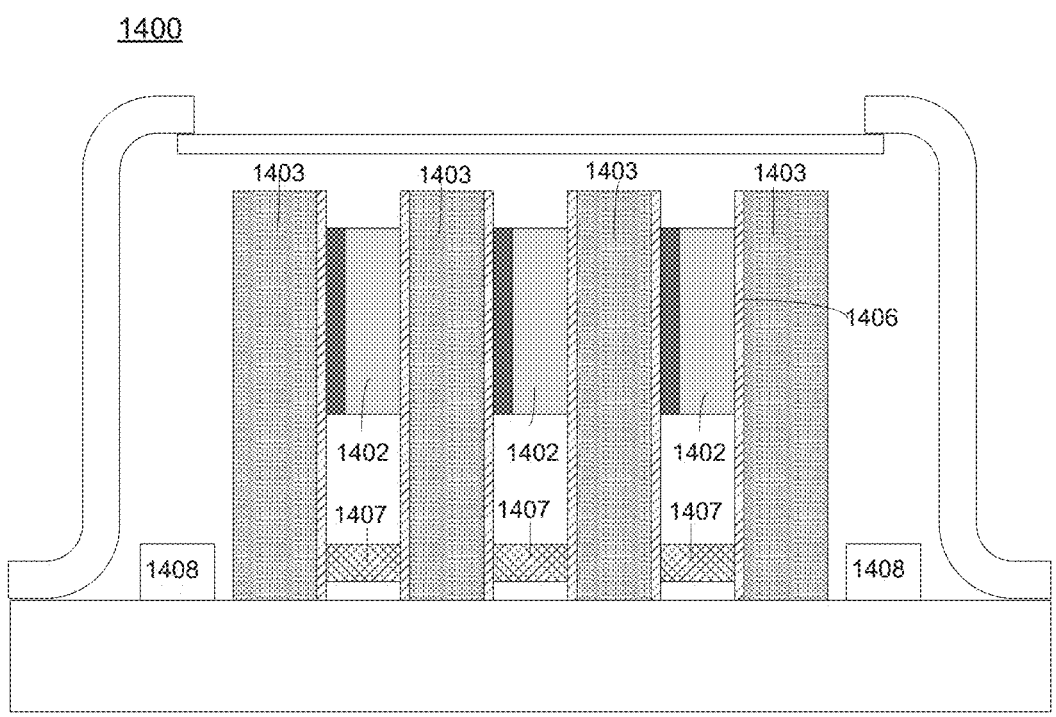
FIG. 14A shows another representative packaged component that includes multiple diode dice configured in accordance with embodiments of the present technology.

FIG. 14A shows another representative packaged component 1400 that includes multiple diode dice configured in accordance with embodiments of the present technology. In this embodiment, the packaged component includes multiple heat sinks 1403 for carrying the diode dice 1402. Adjacent diode dice 1402 are electrically connected to the system circuitry via one or more of the multiple heat sinks 1403. In some implementations, the thickness of the heat sinks 1403 can be used to control the distances between adjacent diode dice 1402.

The packaged component also includes multiple nonconductive elements 1407 (sometimes referred to as dummy parts) corresponding to the multiple diode dice 1402. A dummy part 1407 is positioned between the multiple heat sinks 1403 and at a distance from the diode die 1402 to facilitate manufacturing of the packaged part, as described below.

The packing process for the embodiment shown in FIG. 14A can include the following steps:

Step 2.a: Attach a diode die and a dummy part to a first heat sink.

Step 2.b: Attach a second heat sink to the diode die and the dummy part.

Step 2.c: Attach another diode die and dummy part to the second heat sink.

Repeat steps 2.b and 2.c to obtain multiple diode dice in an assembly. The assembly is then cut (e.g., using laser cutting or water cutting) to a desired shape. In some embodiments, a dummy part includes an insulator. For example, the dummy part can include a ceramic material. In some embodiments, the distance between the dummy part and the corresponding diode dice is within a range from 50 μm to 150 μm. Because the thickness of the dummy part is generally the same as a thickness of the corresponding diode die, the dummy part can distribute some of the cutting forces to minimize potential damage to the diode dice.

In the embodiment shown in FIG. 14A, each of the heat sinks 1403 includes a conductive element 1406 that is connected to an individual diode die 1402. The control circuit 1408 is operatively coupled to the individual diode die independently of other diode dice via the conductive element 1406 to control the individual diode die. The diode dice 1403 thus can be operated independently from each other (e.g., one diode die can be turned on while the rest of the diode dice remain off).

Figure 14B:
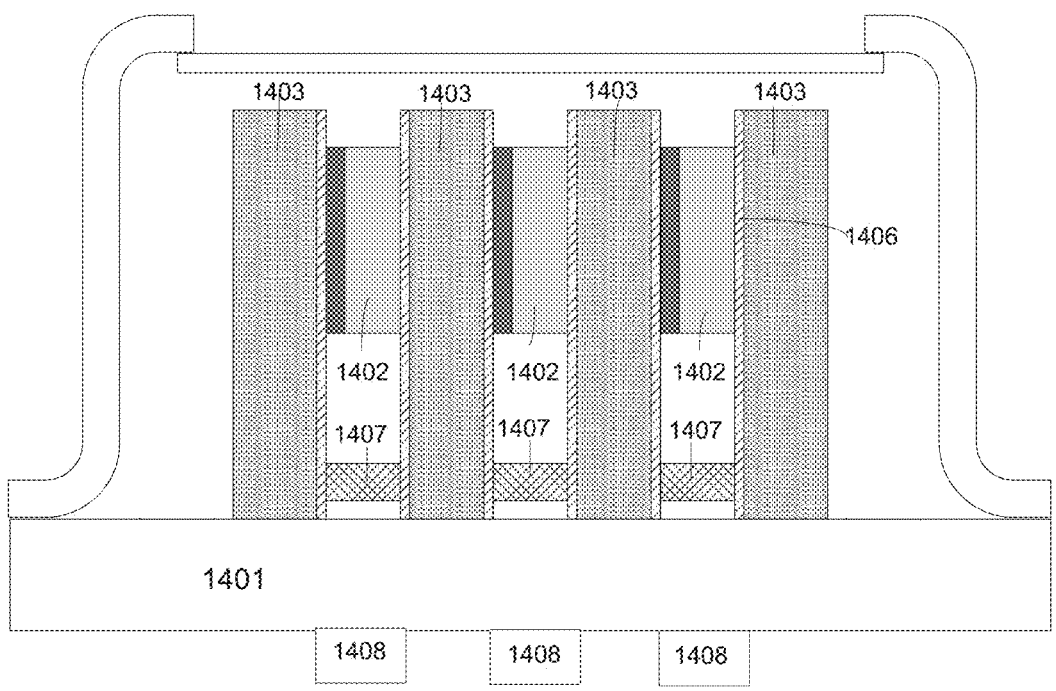
FIG. 14B shows another representative packaged component that includes multiple diode dice configured in accordance with embodiments of the present technology.

FIG. 14B shows another representative packaged component 1450 that includes multiple diode dice configured in accordance with embodiments of the present technology. In this embodiment, the control circuit components 1408 are positioned on the opposite side of the substrate 1401. Each diode die 1402 has a corresponding control circuit component 1408 that is positioned beneath the substrate so that the distance between a diode die 1202 and the corresponding control circuit component 1205 can be minimized, thereby reducing distributed inductance. It is noted that each of the heat sinks 1403 includes a conductive element 1406 that is connected to an individual diode die to allow independent control of the diode dice.

Figure 14C:
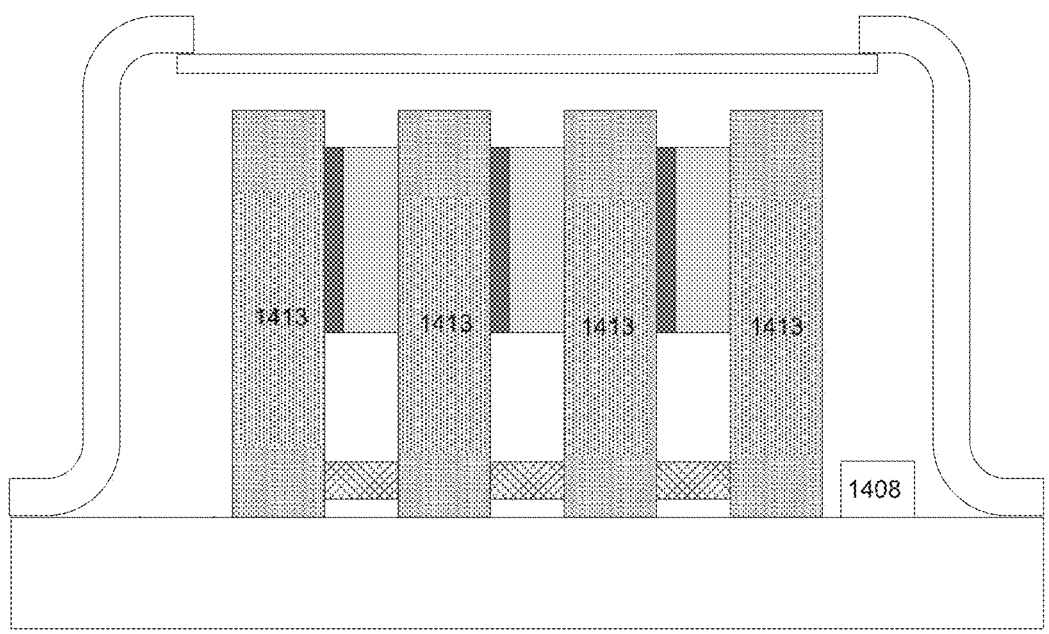
FIG. 14C shows yet another representative packaged component that includes multiple diode dice configured in accordance with embodiments of the present technology.

FIG. 14C shows yet another representative packaged component 1480 that includes multiple diode dice configured in accordance with embodiments of the present technology. In this embodiment, the heat sinks 1413 are electrically conductive. Thus, all diode dice are electrically connected together, and can be controlled uniformly by a single control circuit 1408 (e.g., all the diode dice can be turned on/off at the same time).

Figure 15A:
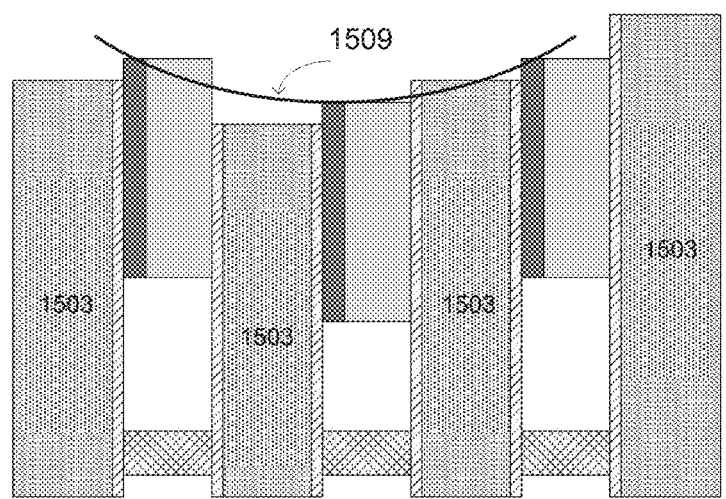
FIG. 15A shows a representative configuration of diode dice that corresponds to a focal plane of a collimator module configured in accordance with embodiments of the present technology.

FIG. 15A shows a representative configuration of diode dice in a packaged component. Similar to the embodiment shown in FIG. 13A, in this embodiment, the multiple heat sinks 1503 have different heights such that the emission surfaces of the multiple diode dices are positioned on a curved plane 1509 relative to the focal plane of the collimator module.

Figure 15B:
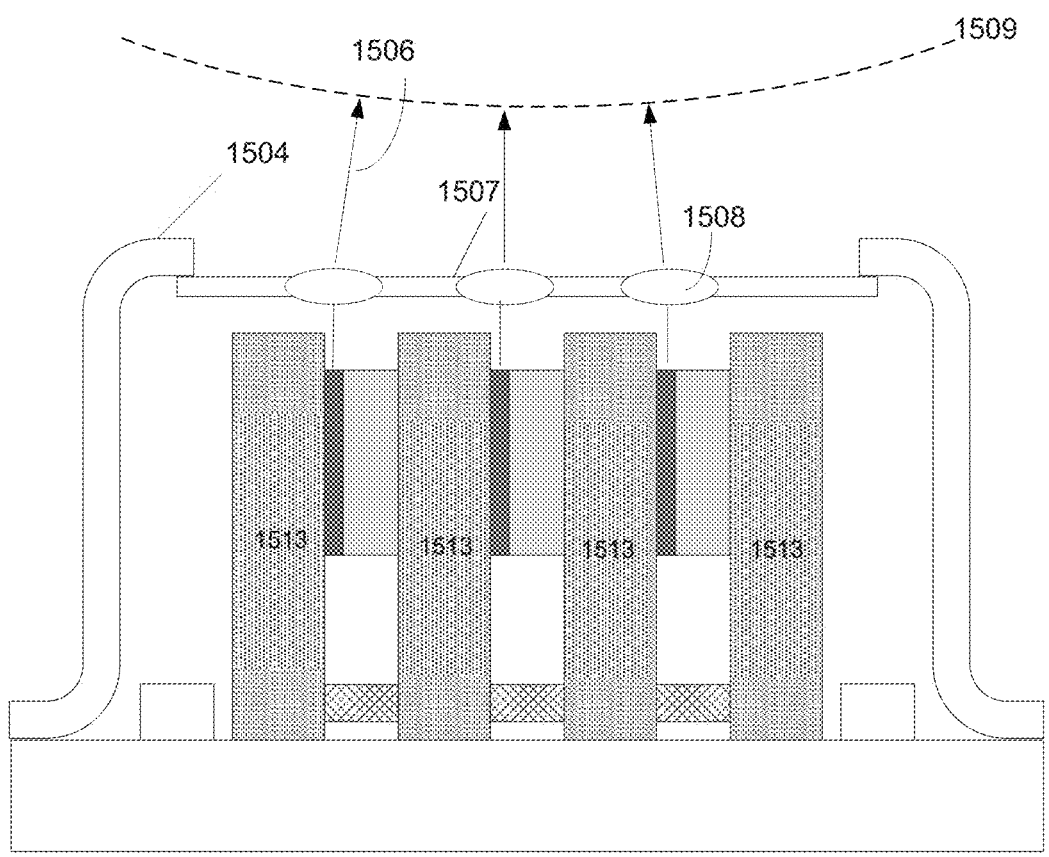
FIG. 15B shows another representative configuration of diode dice designed to account for the focal plane of a collimator module configured in accordance with embodiments of the present technology.

FIG. 15B shows another representative configuration of diode dice designed to account for the focal plane of a collimator module. In this embodiment, the packaged component comprises multiple micro-lenses 1508 positioned in paths of the multiple electromagnetic energy beams to generate multiple refracted electromagnetic energy beams that correspond to a focal plane 1509 of the collimator module. For example, the lenses 1508 can be integrated with a transparent protective cover 1507 that covers at least a part of an opening or transparent area of the shell 1504. The electromagnetic energy beams 1506 are refracted corresponding to the focal plane 1509 of the collimator module.

Figure 15C:
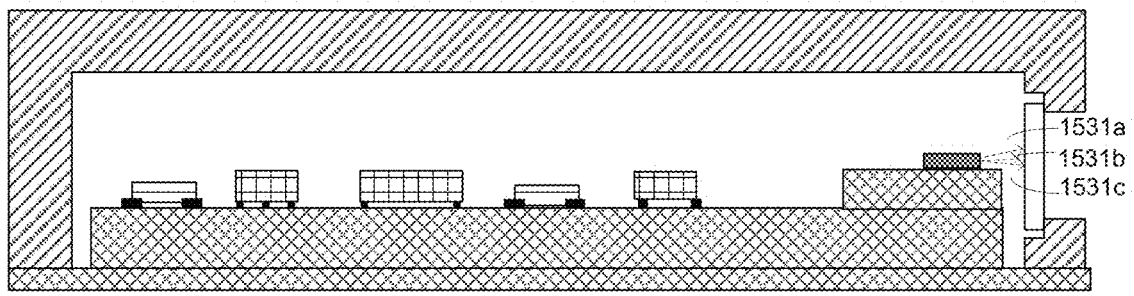
FIG. 15C shows yet another representative configuration of diode dice configured in accordance with embodiments of the present technology.
Figure 15D:
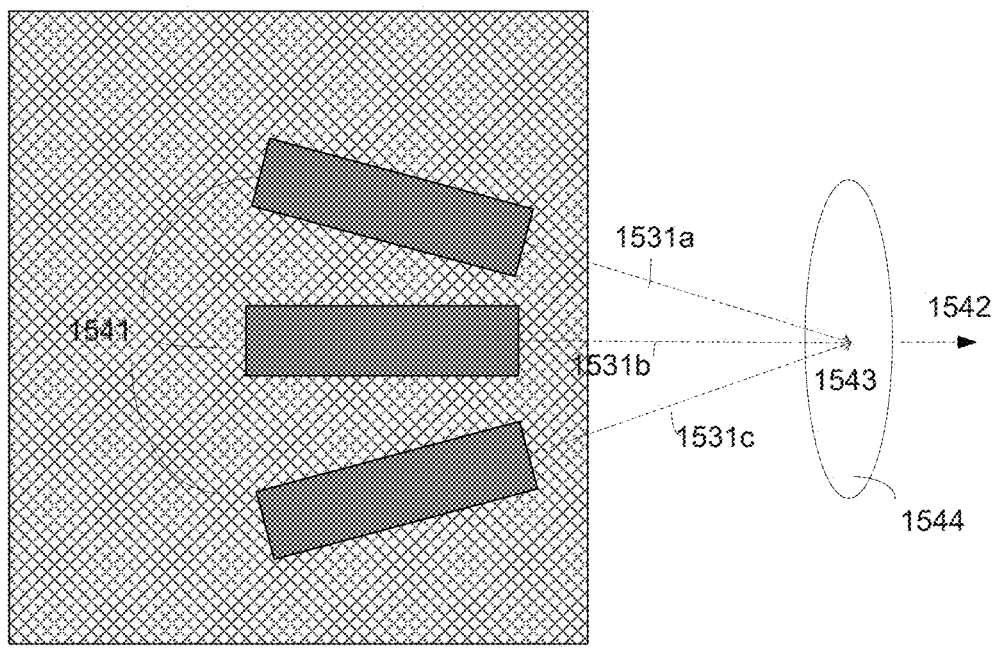
FIG. 15D shows a corresponding top view of the representative configuration of diode dice shown in FIG. 15C.

FIG. 15C shows yet another representative configuration of multiple diode dice configured in accordance with embodiments of the present technology. In this embodiment, the multiple diode dice are positioned side by side on the substrate 1501 in a non-parallel fashion such that the multiple electromagnetic energy beams 1531a, 1531b, 1531c from the multiple diode dice are not parallel to each other. FIG. 15D shows a corresponding top view of the diode dice in FIG. 15C. In some implementations, as shown in FIG. 15D, the diode dice 1541 are arranged such that the electromagnetic energy beams 1531a, 1531b, 1531c pass through the center 1543 of the collimator module 1544. The collimator module 1544 then focuses the multiple electromagnetic beams 1531a, 1531b, 1531c into a beam 1542 in one direction.

Figure 15E:
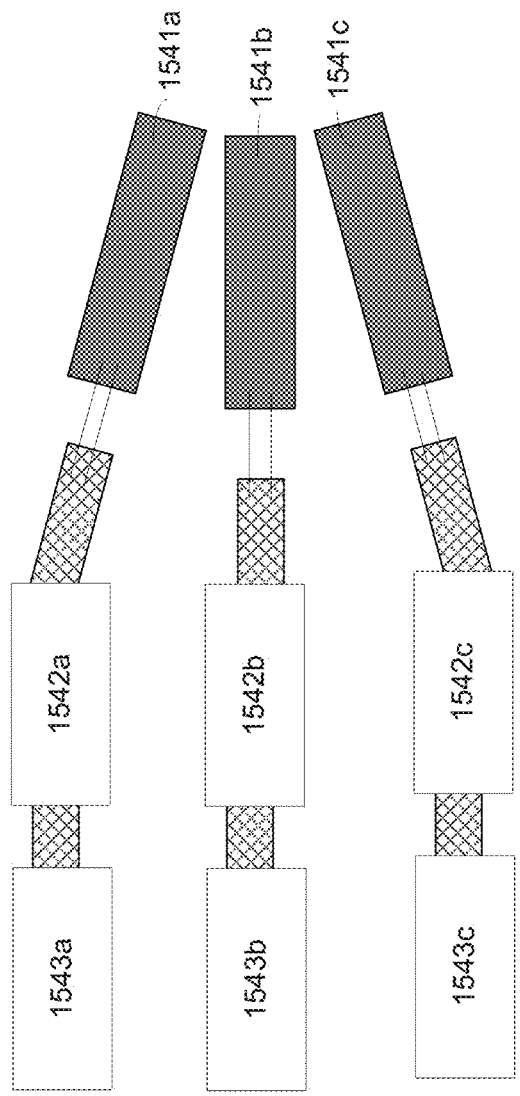
FIG. 15E shows another representative top view of multiple diode dice coupled to corresponding control circuit components configured in accordance with embodiments of the present technology.

FIG. 15E shows another representative top view of multiple diode dice coupled to corresponding control circuit components configured in accordance with embodiments of the present technology. In this embodiment, the multiple diode dice 1541a, 1541b, 1541c are positioned side by side in a non-parallel fashion so that the multiple electromagnetic energy beams from the diode dice are not parallel to each other. The diode dice are connected to corresponding switching components 1542a, 1542b, 1542c and driver circuits 1543a, 1553b, 1543c. The distance between each of the diode die and the corresponding circuitry (e.g., the switching component and driver circuit) can be minimized to reduce distributed inductance.

Figure 16:
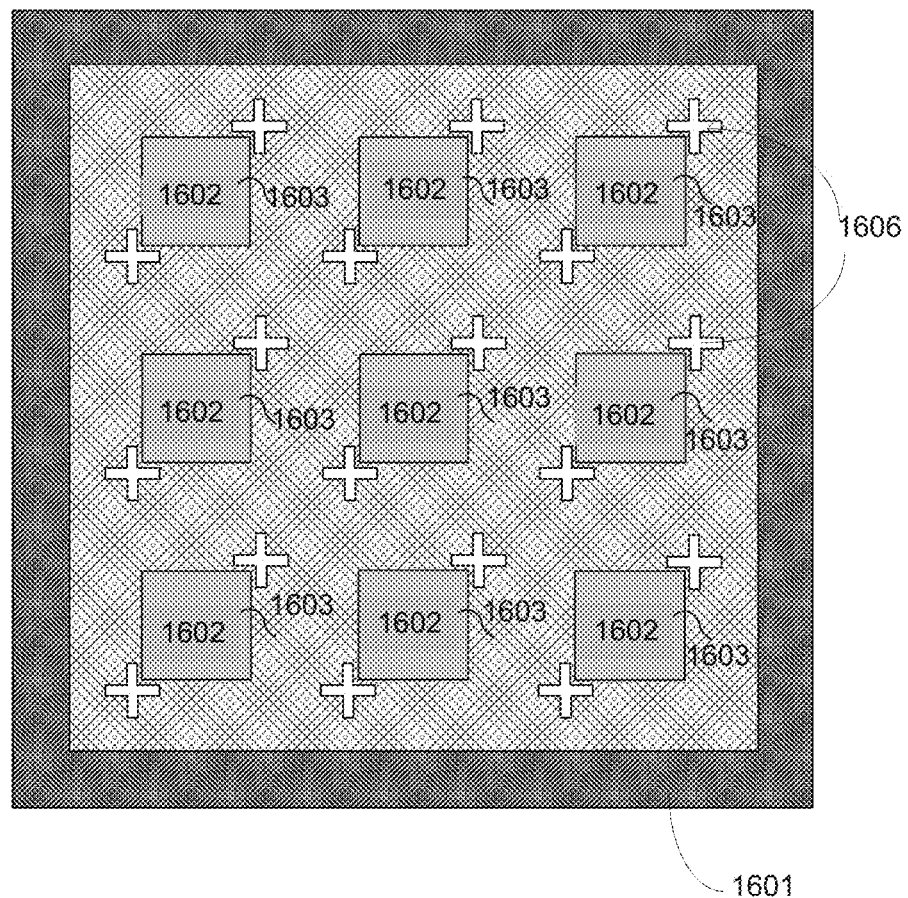
FIG. 16 shows a top view of a representative receiver module configured in accordance with embodiments of the present technology.

As described above with reference to FIG. 3, the sensor system can also include a multi-unit receiver module to convert the light signals into corresponding electrical signals. FIG. 16 shows a top view of a representative multi-unit receiver module 1600 configured in accordance with embodiments of the present technology. The receiver module 1600 includes a substrate 1601. The receiver module also includes multiple semiconductor receiver units 1602 coupled to the substrate 1601 via conductive wires 1603. An individual semiconductor receiver unit may include a cathode at a positive side and an anode at a negative side.

The individual semiconductor receiver units 1602 are positioned to receive light beams reflected by objects in the external environment and convert the light to electrical signals. To allow the semiconductor receiver units 1602 to be accurately positioned, the substrate 1601 can include multiple markers 1606 to indicate the suitable positions of the receiving units 1602. In some embodiments, the receiver module 1600 further includes a transparent protective plate carried by the substrate 1601 to enclose the semiconductor receiver units 1602. Alternatively, the receiver module 1600 can be packaged at the wafer level to allow the semiconductor receiver units 1602 to be accurately positioned.

In some embodiments, the semiconductor receiver units 1602 include a plurality of photodiodes. For example, the semiconductor receiver units 1602 can form an avalanche photodiode array.

In many embodiments, the receiver module and a collimator module (e.g., a lens) are assembled together so that the collimator module can direct the reflected beams from one or more objects in the external environment to the receiver module. It is thus desirable to account for the focal plane of the collimator module when positioning the multiple receiving units. For example, the multiple semiconductor receiver units can be positioned on or in proximity to a curved plane that corresponds to the focal plane of the collimator module.

Figure 17A:
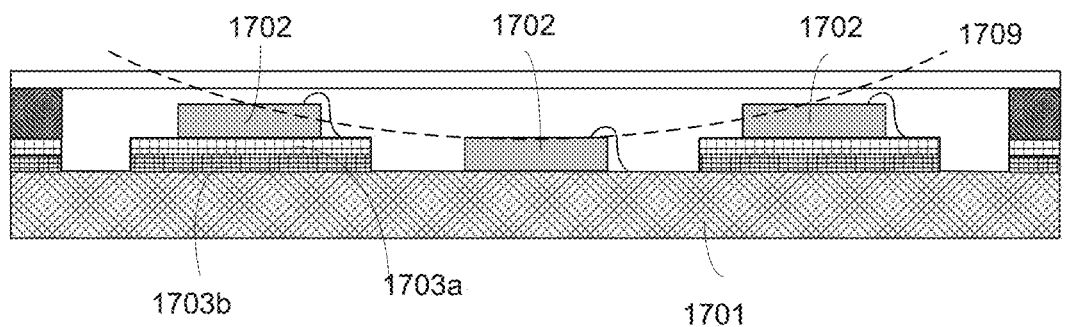
FIG. 17A shows semiconductor receiver units positioned corresponding to a focal plane 1709 of a collimator module in a representative arrangement in accordance with embodiments of the present technology.

FIG. 17A shows semiconductor receiver units positioned corresponding to a focal plane 1709 of a collimator module in a representative arrangement in accordance with embodiments of the present technology. In this embodiment, multiple layers of ceramic board 1703a, 1703b are positioned on the substrate 1701 to allow the plurality of semiconductor receiver units 1702 to be positioned at different heights relative to the substrate 1701 so as to align with the focal plane 1709 of the collimator module.

Figure 17B:
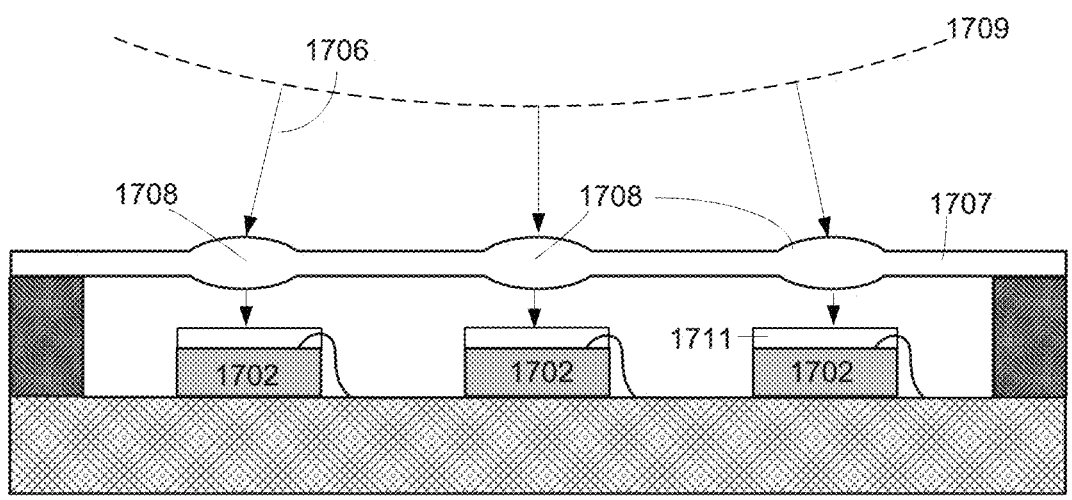
FIG. 17B shows another representative configuration of semiconductor receiver units designed to account for the focal plane of a collimator module configured in accordance with embodiments of the present technology.

FIG. 17B shows another representative configuration of semiconductor receiver units designed to account for the focal plane of a collimator module configured in accordance with embodiments of the present technology. In this embodiment, the receiver module includes a plurality of microlenses 1706 positioned in paths of the collimated electromagnetic energy beams to refract the collimated electromagnetic energy beams based on a focal plane of the collimator module. For example, the lenses 1708 can be integrated with a transparent protective cover 1707. The returned electromagnetic energy beams 1706 are refracted corresponding to the focal plane 1709 of the collimator module.

In some embodiments, the receiver module further includes a plurality of bandpass filters 1711. Individual bandpass filters 1711 are positioned on the individual semiconductor receiver units 1702 to filter the corresponding collimated electromagnetic energy beams. The plurality of semiconductor receiver units 1702 can be arranged in a line or in an array.

With multiple light beams emitted from the multi-source emitter module and multiple light beams received at the multi-unit receiver module, cumulative errors can build up when multiple light beams from different diode dice are received by the same receiving unit. To obtain accurate signals, it can be desirable to have a one-to-one correspondence between individual diode dice and individual receiving units.

In some embodiments, the one-to-one correspondence between individual diode dice and individual receiving units can be obtained when the diode dice and the receiver units are arranged in the same pattern. In some embodiments, the one-to-one correspondence can be obtained when displacements between adjacent diode emitters are proportional to displacements between adjacent semiconductor receiver units. Here, the displacement is a vector quantity that refers to how individual elements are positioned with respect to each other (e.g., the pattern in which the diode dice and the receiver units are arranged, and the distance between individual diode dice and/or receiver units).

Figure 18A:
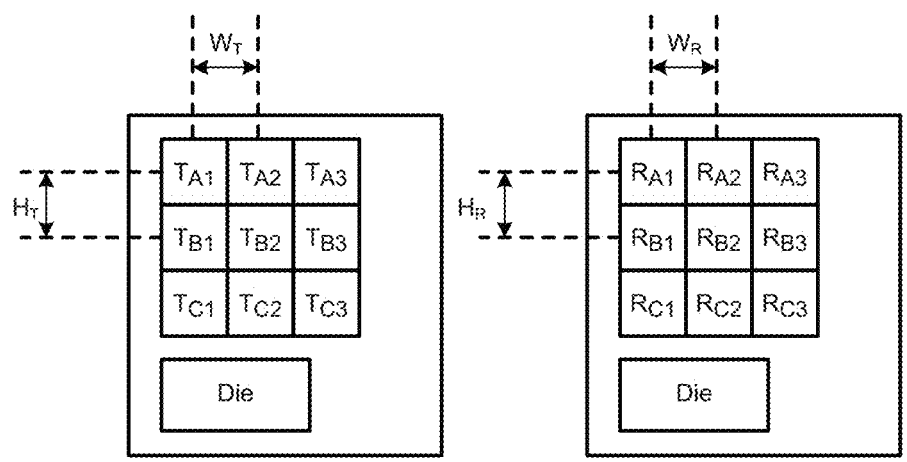
FIG. 18A shows a representative correspondence between individual diode dice and receiving units configured in accordance with embodiments of the present technology.

FIG. 18A shows a representative correspondence between individual diode dice and receiving units configured in accordance with embodiments of the present technology. In this embodiment, each diode die corresponds to a different receiving unit (e.g., $T_{A1}$ to $R_{A1}$, $T_{A2}$ to $R_{A2}$, etc.). The plurality of diode emitters can emit the plurality of electromagnetic energy beams simultaneously or in a time multiplexing manner.

In some embodiments, the multi-source emitter module and the multi-unit receiver module share the same optical module (e.g., an optical module that directs the plurality of electromagnetic energy beams from the source module as a plurality of outgoing electromagnetic energy beams, and directs the reflected electromagnetic energy beams reflected from the one or more objects in the external environment toward the receiver module). In such cases, the displacements between two adjacent transmitters is the same as the displacements between two adjacent receivers. For example, the distance between the centers of two adjacent transmitters in a first direction $W_T$ is the same as the distance between the centers of two adjacent receivers in the same direction $W_R$ (i.e., $W_T=W_R$). Similarly, the distance between centers of two adjacent transmitters in a second direction $H_T$ is the same as the distance between centers of two adjacent receivers in the same direction $H_R$ (i.e., $H_T=H_R$).

In some embodiments, the multi-source emitter module and the multi-unit receiver module use separate optical modules. For example, a first optical module is positioned to direct the plurality of electromagnetic energy beams from the source module toward one or more objects in the external environment. A second optical module is positioned to direct the plurality of reflected electromagnetic energy beams reflected from the one or more objects in the external environment toward the receiver module. In such arrangements, the distance between the centers of two adjacent transmitters and the distance between the centers of two adjacent receivers can have the following correspondence: $W_T/W_R=H_T/H_R$. Depending on the optical configurations, $W_T$, $W_R$, $H_T$, and $H_R$ may correspond in different manners that also produce the one-to-one correspondence between individual transmitters and receivers.

More generally, when the multiple emitters and multiple receivers are arranged in non-regular shapes, the one-to-one correspondence between individual elements can be obtained when diode emitters and the semiconductor receiver units are arranged in the same shape. In some embodiments, the one-to-one correspondence can be obtained when displacements between adjacent diode emitters are proportional to displacements between adjacent semiconductor receiver units.

Figure 18B:
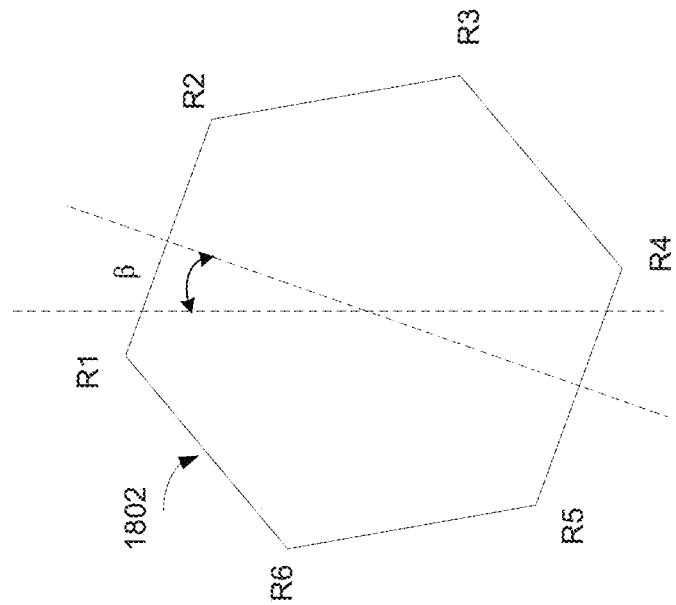
FIG. 18B shows another representative correspondence between individual diode dice and receiving units configured in accordance with embodiments of the present technology.
Figure 18B:
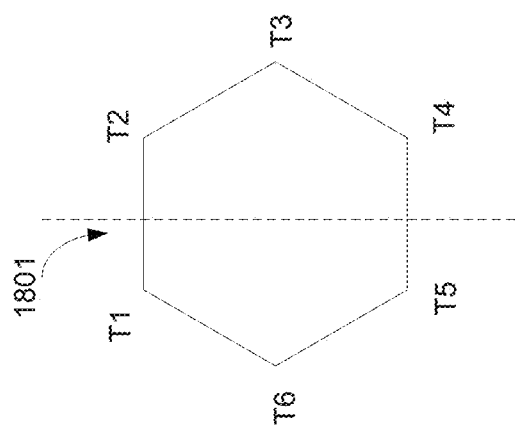

When the multi-source emitter module and the multi-unit receiver module use separate optical modules, as shown in FIG. 18B, the pattern in which the diode emitters are organized is the same as the pattern in which the semiconductor receiver units are organized. The correspondence between the emitter module 1801 and the receiver module 1802 can be obtained by rotating the emitter module 1801 as a whole by angle β and scaling the distances between adjacent elements via a ratio. The ratio is determined based on optical properties of the separate optical modules. If the optical properties of the separate optical modules are generally the same, there is no need to adjust individual elements (e.g., diode die or receiver units) to obtain the correspondence.

When the transmitter module and the receiver module share the same optical module, displacements between adjacent diode emitters are proportional to displacements between adjacent semiconductor receiver units. Therefore, the calibration process can be simplified, thereby making mass production of the sensor device easier. For example, the distances between individual diode dice and the distances between individual receiver units can be first adjusted to ensure that they are proportional to each other. Then, the positions of the transmitter module and the receiving module can be adjusted as a whole to obtain the one-to-one correspondence. Sharing the same optical module between the transmitter module and the receiver module eliminates the need to adjust individual receiver units based on the position of the corresponding diode die.

The process for manufacturing of the multi-source emitter module and the multi-unit receiver module can be carefully controlled to allow the diode dice and the semiconductor receiver units to be accurately positioned. In many cases, die bonding techniques offer better control and accuracy for positioning the diode dice and receiving units, as compared to surface mounting techniques. For example, a conductive die attach film can be used as a part of the die bonding process to attach the diode dice or the semiconductor receiver units to the corresponding substrate. In the cases for which die bonding techniques still fail to provide sufficient accuracy for positioning the elements, the carriers and/or heat sinks can be used to control the displacements between adjacent elements.

Figure 19A:
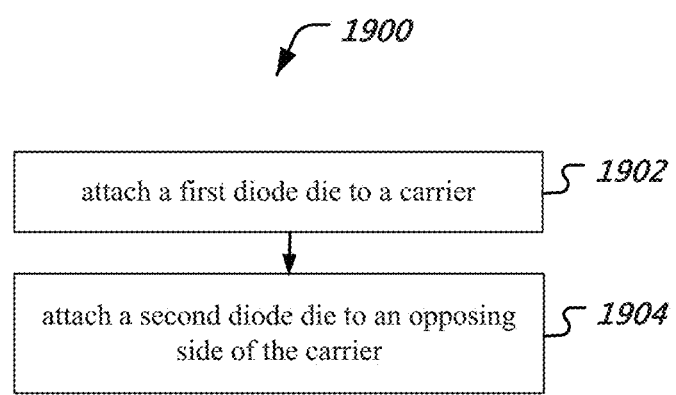
FIG. 19A is a flowchart representation of a method for manufacturing a multi-source electromagnetic energy emitter configured in accordance with embodiments of the present technology.

FIG. 19A is a flowchart representation of a method 1900 for manufacturing a multi-source electromagnetic energy emitter configured in accordance with embodiments of the present technology. The method 1900 includes, at block 1902, attaching a first diode die to a side of a first carrier. The method 1900 also includes, at block 1904, attaching a second diode die to an opposing side of the first carrier such that a distance between the first diode die and the second diode die is generally equivalent (100%±5%) to a thickness of the first carrier.

In some embodiments, the method also includes attaching an opposing side of the first diode to a side of a second carrier, and attaching a third diode die to an opposing side of the second carrier such that a distance between the first diode die and the third diode die is generally equivalent (100%±5%) to a thickness of the second carrier. In some implementations, the method further includes attaching a fourth diode die to the side of the carrier using a die bonding technique. The die bonding technique controls the distance between the fourth diode and the first diode.

Figure 19B:
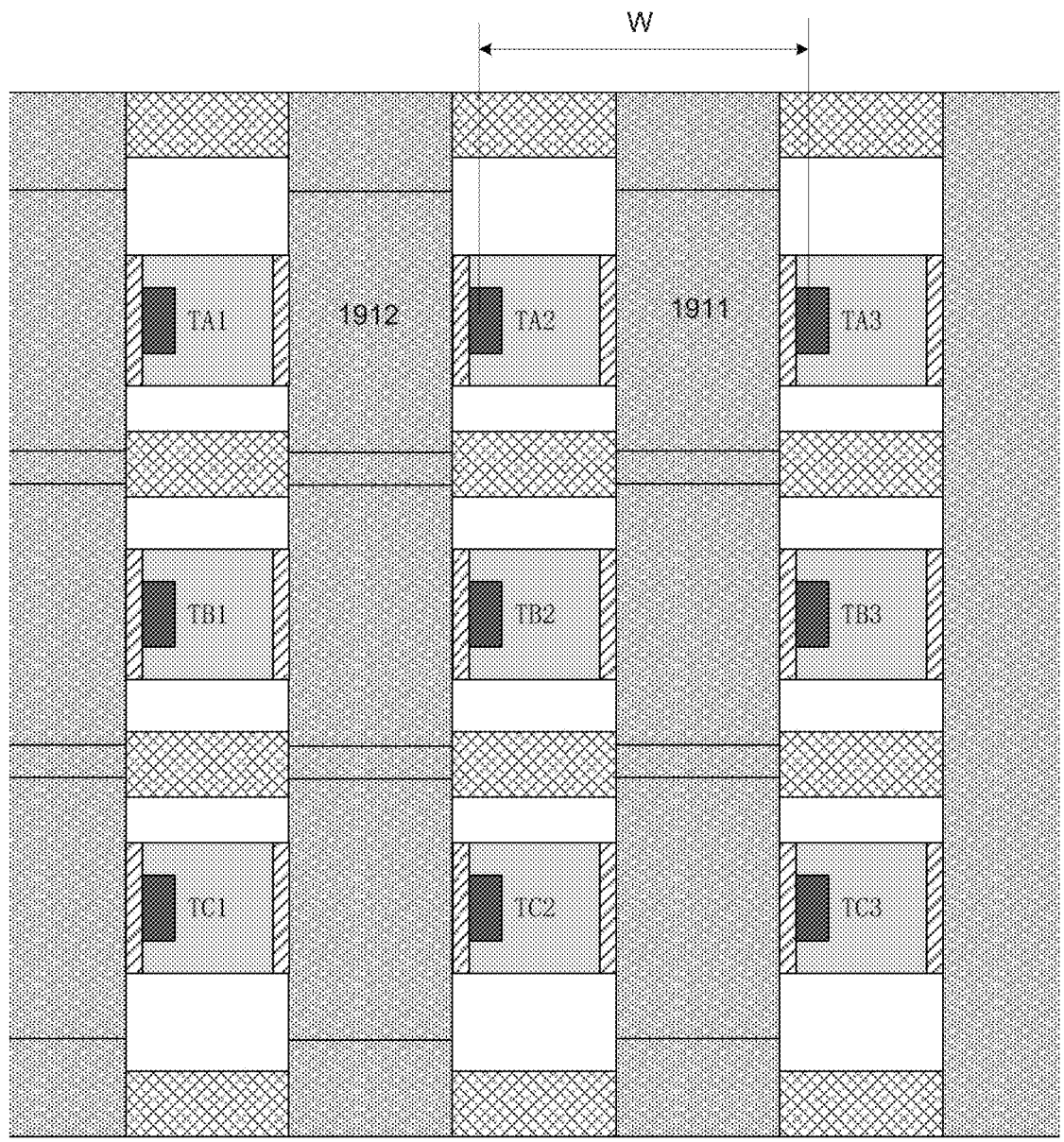
FIG. 19B is a schematic illustration of a multi-source electromagnetic energy emitter manufactured according to the method shown in FIG. 19A.

FIG. 19B is a schematic illustration of a multi-source electromagnetic energy emitter manufactured according to the method shown in FIG. 19A. In this embodiment, a first diode die TA2 is attached to a first carrier 1911 (e.g., using a conductive glue). A second diode die TA3 is attached to an opposing side of the first carrier 1911. The distance W between the first diode die and the second diode die (i.e., the distance between the emitting areas of the two diode dice) can be controlled by the thickness of the first carrier 1911.

Then, the first diode TA2 can be attached to a second carrier 1912 (e.g., using a conductive glue). A third diode die TA1 is attached to an opposing side of the second carrier 1912. Again, the distance between the first diode die TA2 and the third diode die TA1 (i.e., the distance between the emitting areas of the two diode dice) can be controlled by the thickness of the second carrier 1912.

The distance between neighboring dice in the vertical direction (as viewed in FIG. 19B) can be controlled using die bonding techniques. For example, a fourth diode die TB2 can be attached to the carriers 1911, 1912 using a die bonding technique. A dummy part, e.g., a shim or offset element) can be placed between the first diode die TA2 and the fourth diode die TB2 to distribute forces during cutting and/or assembling, as discussed above with reference to FIG. 14A.

Figure 20A:
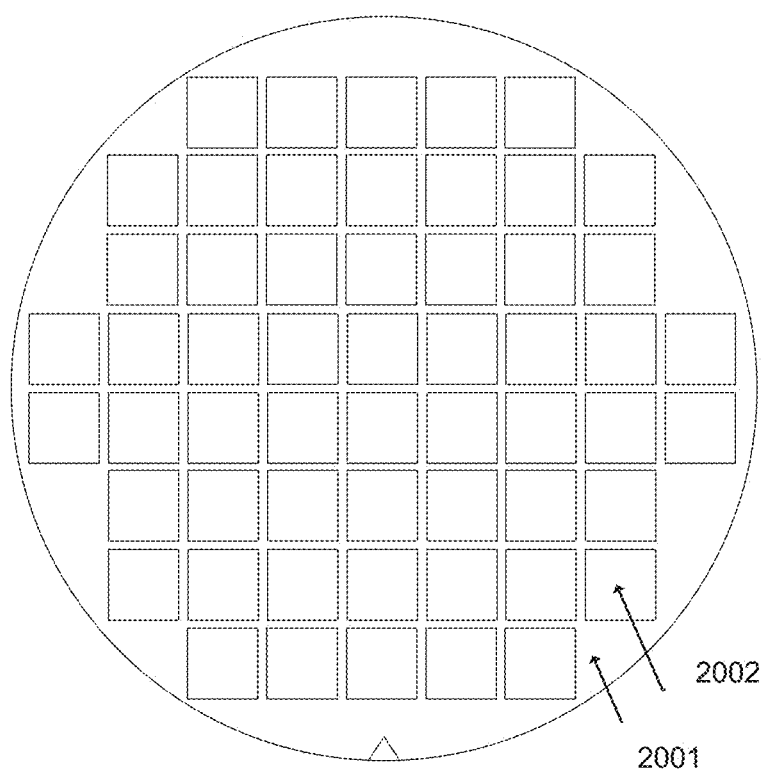
FIG. 20A is a schematic illustration of a wafer comprising an array of multi-unit receiver modules in accordance with embodiments of the present technology.
Figure 20B:
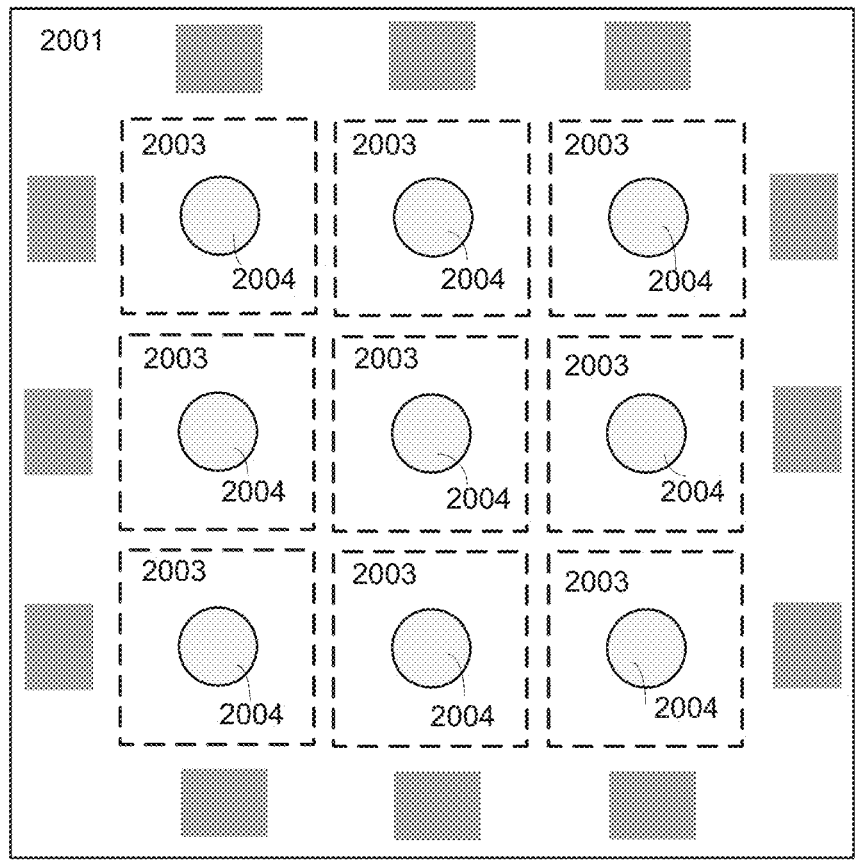
FIG. 20B is a schematic illustration of a multi-unit receiver module packaged at a wafer level configured in accordance with embodiments of the present technology.

Die bonding techniques can also provide positioning accuracy for the semiconductor receiver units in the multi-unit receiver module. Alternatively, the semiconductor receiver units can be integrated at the wafer level to allow the semiconductor receiver units to be accurately positioned. FIG. 20A is a schematic illustration of a wafer 2001 comprising an array of multi-unit receiver modules 2002. Each of the multi-unit receiver modules 2002 includes multiple semiconductor receiver units. FIG. 20B is a schematic illustration of a multi-unit receiver module 2002 packaged at a wafer level configured in accordance with embodiments of the present technology. The multi-unit receiver module 2002 includes a substrate 2001 and a plurality of semiconductor receiver units 2003. Each semiconductor receiver unit 2003 has a separate receiving area 2004. In some embodiment, each semiconductor receiver unit 2003 has a cathode pad located at one side that is independent from other cathode pads. The semiconductor receiver units can share the same anode at the other side.

As discussed above, the outgoing light beams can form various scanning patterns as shown in FIGS. 4A-4D. Similarly, the returned light beams can form corresponding scanning paths. In some cases, placing the diode dice and/or semiconductor receiver units in a regular shape may not be desirable. Taking the scan paths shown in FIG. 4D as an example, when there are multiple semiconductor receiver units located on the same scanning path (e.g., a straight line), the receiver units receive the same scanning path, causing the number of effectively received paths to decrease.

Figure 21A:
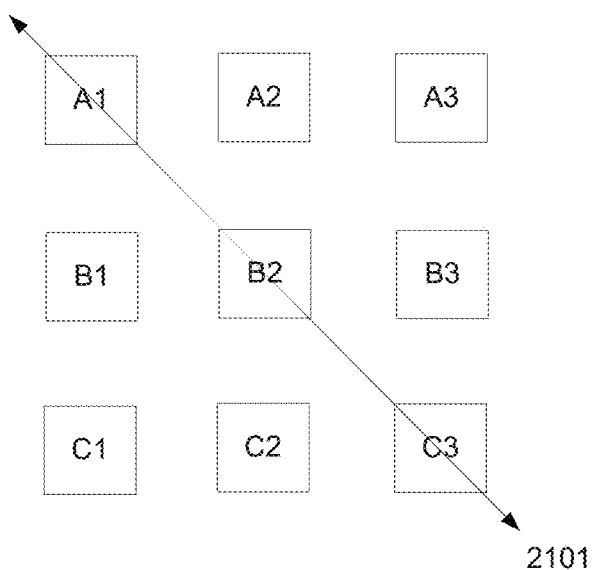
FIG. 21A illustrates a scenario in which the number of effective receivers is smaller than the actual number of receivers.
Figure 21B:
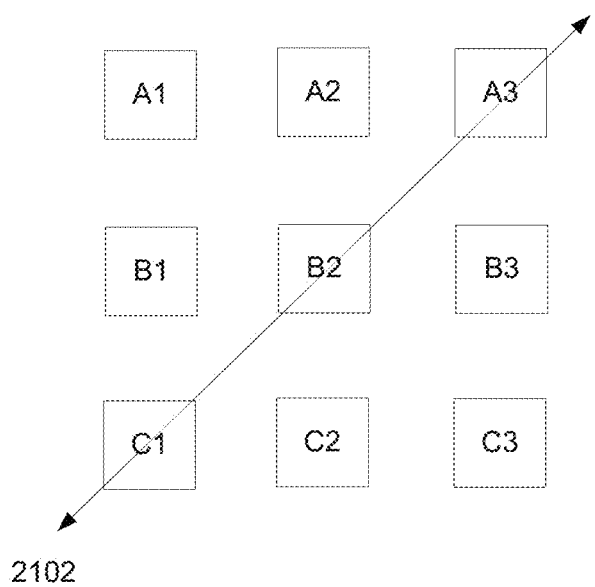
FIG. 21B illustrates another scenario in which the number of effective receivers is smaller than the actual number of receivers.

FIGS. 21A-21B demonstrate several scenarios in which the number of received paths is smaller than the actual number of receivers. In FIG. 21A, nine semiconductor receiver units are arranged in a regular 3×3 square-shape array. When the tangent of the scan path is diagonal to the square (e.g., in a first direction 2101), multiple receivers (e.g., A1, B2, C4) receive the same path, acting as a single receiver. Thus, instead of detecting three different paths, the three receivers detect the same scanning path. The effective number of received scan paths thus is reduced to five from nine: (1) C1, (2) B1 and C2, (3) A1, B2, and C3, (4) A2 and B3, and (5) A3. The density of the received data thus is impacted.

Figure 21C:
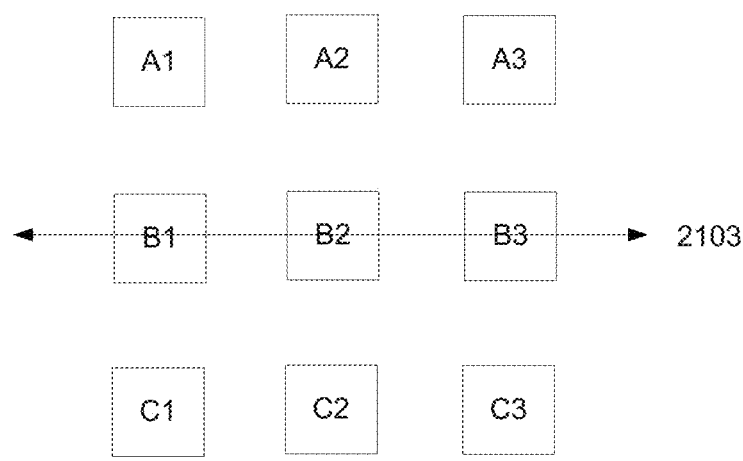
FIG. 21C illustrates a scenario in which the number of effective receivers is further reduced.
Figure 21D:
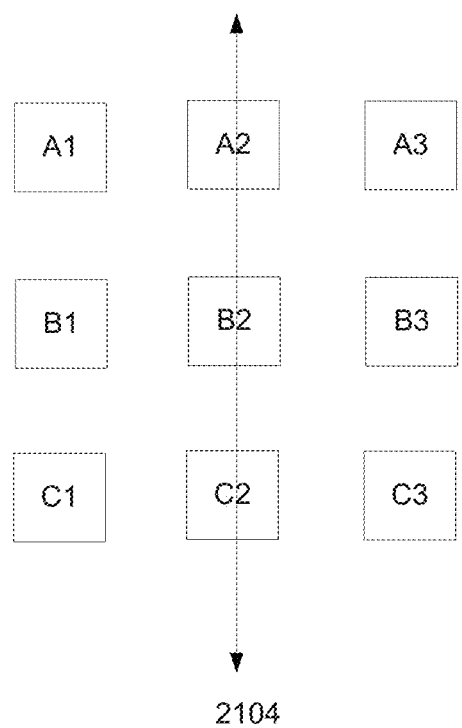
FIG. 21D illustrates another scenario in which the number of effective receivers is further reduced.

Similarly, as shown in FIG. 21B, when the tangent of the scan path is diagonal to the square (e.g., a second direction 2102), the effective number of receivers can be reduced to five: (1) A1, (2) A2 and B1, (3) A3, B2, and C1, (4) B3 and C2, and (5) C3. In some cases, the effective number of receivers can be further reduced. FIGS. 21C-21D demonstrate several scenarios when the number of effective received scan paths is further reduced. For example, as shown in FIG. 21C, when the tangent of the scan path is parallel to a first side of the square (e.g., a third direction 2103), the effective number of received scan paths is reduced to three: (1) A1, A2, and A3, (2) B1, B2, and B3, and (3) C1, C2, and C3. Similarly, when the tangent of the scan path is parallel to a second side of the square (e.g., a fourth direction 2104), the effective number of receivers is reduced to three: (1) A1, B1, C1, (2) A2, B2, C2, and (3) A3, B3, C3.

Figure 22A:
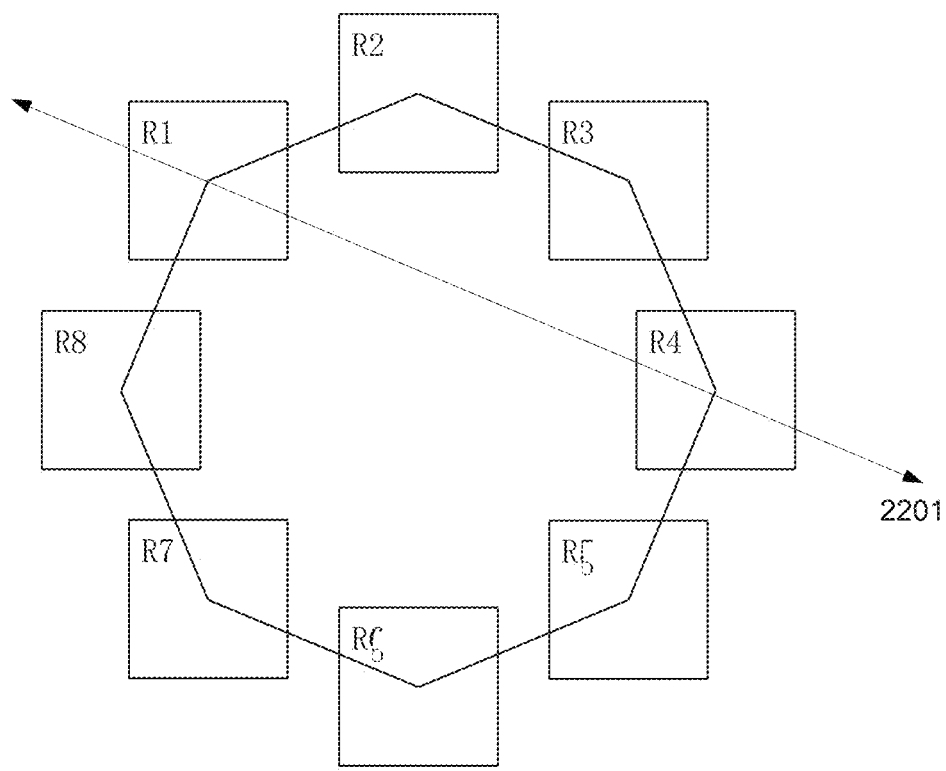
FIG. 22A shows another scenario in which the effective number of receivers is reduced when the actual receivers are positioned in a manner corresponding to a regular polygon.

FIG. 22A shows another scenario in which the effective number of receivers is reduced when the actual receivers are positioned so as to correspond to a regular polygon. When the tangent of the scan path is parallel to a first direction 2201, the effective number of receivers is reduced to four when the actual number of receivers is eight: (1) R2, R3, (2) R1, R4, (3) R5, R8, and (4) R6, R7. In general, for a convex polygon having N vertices (i.e., N receivers), when N is an odd number, the minimal number of effective receivers is (N+1)/2. When N is an even number, the minimal number of effective receivers is N/2.

Figure 22B:
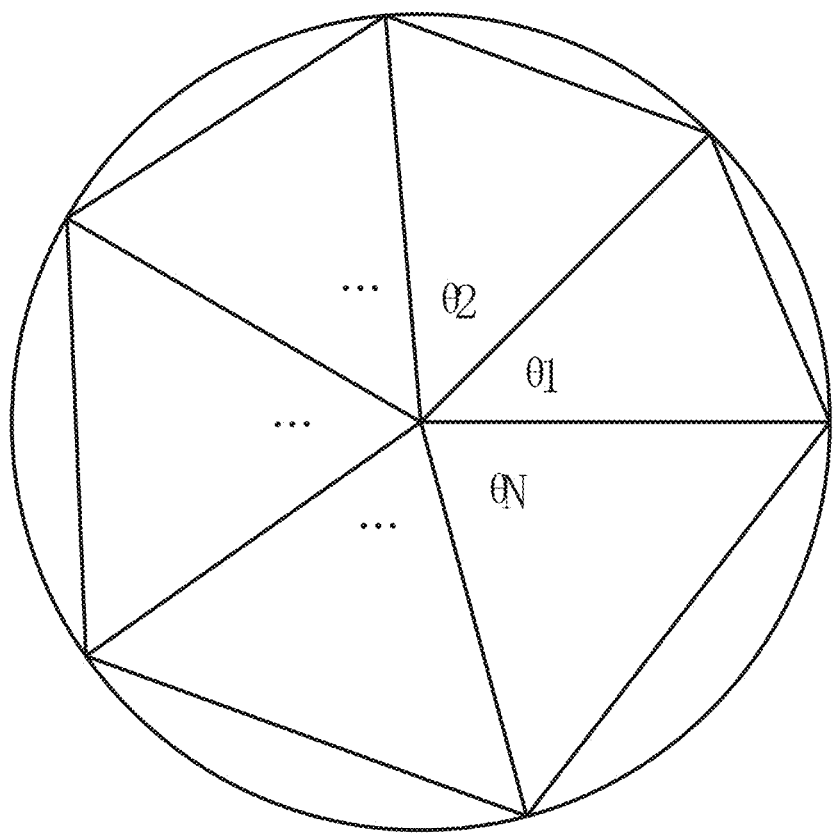
FIG. 22B shows a schematic diagram of receivers configured in accordance with embodiments of the present technology positioned so that the angles formed by extending lines from adjacent elements to the center of the convex polygon are different from each other.

Based on the above observations, the diode dice and/or semiconductor receiver units can be positioned (e.g., optimally positioned) using the following criteria:

(1) all the elements (e.g., diode dice or semiconductor receiver units) are placed on a circle;
(2) the elements form a convex polygon; and
(3) the angles formed by extending lines from adjacent elements to the center of the convex polygon are different from each other. For example, as shown in FIG. 22B, $\theta_1 \neq \theta_1 \neq \ldots \neq \theta_N$.

Figure 22C:
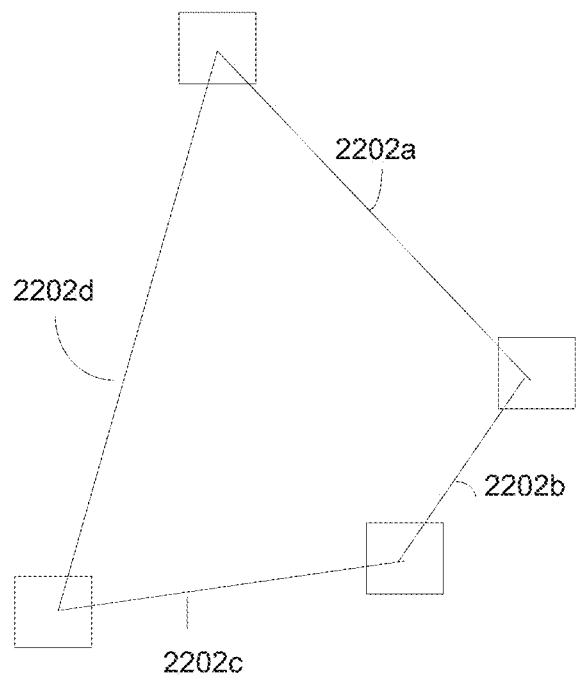
FIG. 22C shows another schematic diagram of receivers configured in accordance with embodiments of the present technology positioned so that all lines formed by connecting two of four elements are not parallel to each other.

In some embodiments, the diode dice or semiconductor receiver units can be positioned (e.g., optimally positioned) by placing the elements such that at least a part of lines formed by connecting two of four elements are not parallel to each other. For example, as shown in FIG. 22C, all lines formed by connecting two of four elements (e.g., 2202a, 2202b, 2202c, 2202d) are not parallel to each other. This way, the number of effective receivers can be increased as compared to the cases shown in FIG. 22A.

Calibrating the emitter module and the receiver module to obtain the one-to-one correspondence described above can also be an important aspect of the manufacturing process. In some embodiments, the emitter module is calibrated first, and the receiver module is then calibrated and adjusted to obtain the one-to-one correspondence described above. In some embodiments, the receiver module is calibrated first, and the emitter module is then calibrated and adjusted to obtain the one-to-one correspondence described above. In some implementations, both the emitter module and the receiver module can be calibrated and adjusted at the same time to allow flexibility in the manufacturing process.

Figure 23:
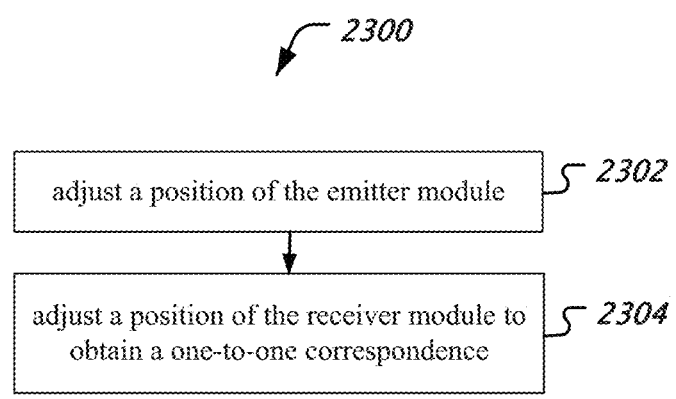
FIG. 23 is a flowchart representation of a method for calibrating an electromagnetic energy sensor in accordance with embodiments of the present technology.

FIG. 23 is a flowchart representation of a method 2300 for calibrating an electromagnetic energy sensor in accordance with embodiments of the present technology. The sensor includes an emitter module, a receiver module, and a collimator module as described in some of the embodiments above. The method 2300 includes, at block 2302, adjusting a position of the emitter module to obtain a good collimation quality. The method also includes, at block 2304, adjusting a position of the receiver module such that individual semiconductor receiver units in the receiver module form a one-to-one correspondence with individual diodes in the emitter module. The diodes in the emitter module can be fixed or individually adjustable. Similarly, the semiconductor receiver units in the receiver module can be fixed or individually adjustable.

When the electromagnetic energy beams from the diode dice are collimated more effectively by the collimator module, a light spot formed by the electromagnetic energy beams from each diode die becomes smaller. To obtain a position of the emitter module that achieves a good collimation quality, the light spot formed by each diode die can be observed and measured using equipment such as an infrared camera. When the diameter of the spot reaches its minimum, it can be determined that the emitter module is at an optimal position.

Figure 24A:
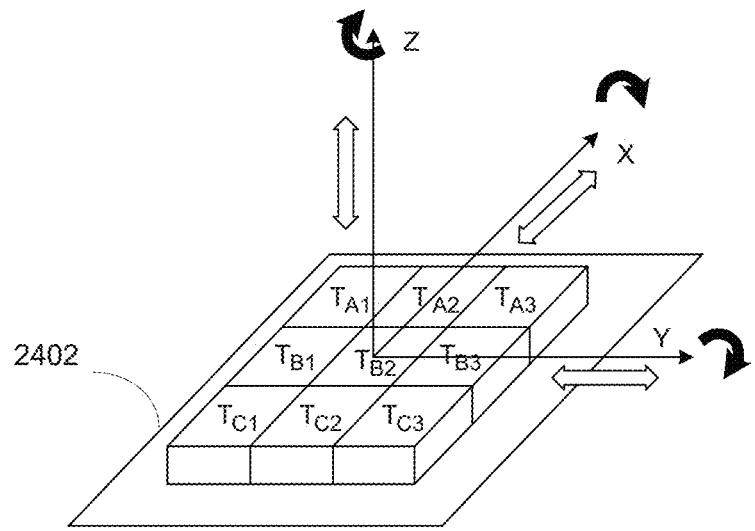
FIG. 24A illustrates a representative calibration process on the emitter side in accordance with the method shown in FIG. 23.
Figure 24B:
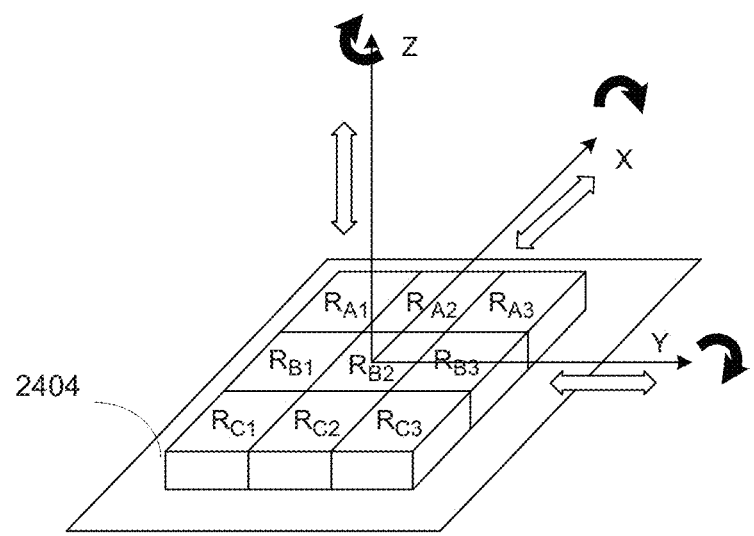
FIG. 24B illustrates a representative calibration process on the receiver side in accordance with the method shown in FIG. 23.

FIGS. 24A-24B demonstrate a representative calibration process in accordance with the method 2300 shown in FIG. 23. FIG. 24A shows a representative process for adjusting an emitter module 2402 in accordance with embodiments of the present technology. The emitter module 2402 is first adjusted so that it is positioned at a selected (e.g., optimal) position to achieve a good collimation quality. Typically, small light spots of the diode dice can be obtained by adjusting the emitter module 2402 such that the sum of the distances between individual diodes and an axis of the collimator module is at least approximately minimized, and the sum of the distances between individual diodes and the focal plane of the collimator module is at least approximately minimized.

In some embodiments, adjusting the position of the emitter module 2402 includes moving the emitter module 2402 in a horizontal direction (e.g., a direction parallel to the substrate plane, such as the X and/or Y direction) so that the distance between a reference point and the axis of the collimator (e.g., the Z axis) is at least approximately minimized, thereby reducing the area of the light spot for each diode die. In order to allow the distances between all diodes and the axis of the collimator module to be minimized while simplifying the calibration process, the reference point is typically selected to be at a center of the emitter module 2402. For example, the reference point can be a reference diode located at a center of the emitter module 2402. The reference point can also be a geometric center of the emitter module, or can have another (e.g., off-center) location 2402. After the reference point is adjusted, the emitter module 2402 is moved along the axis of the collimator (e.g., the Z axis) such that a sum of the distances between individual diodes and the focal plane of the collimator module is at least approximately minimized to further reduce the sizes of the light spots. In some implementations, the emitter module 2402 can also be rotated around one or more axes (e.g., X/Y/Z axes) to allow an individual light spot to reach its minimal size for a good collimation quality.

In some implementations, measurements are performed on the light spot of the reference diode. When the light spot of the reference diode reaches its minimum diameter, area, or other relevant dimension after adjusting the emitter module in the horizonal direction and/or along the axis of the collimator, it can be determined that the emitter module 2402 is placed at an optimal position for a good collimation quality. In some implementations, the light spots of one or more diode dice (e.g., several diode dice around the reference point or the reference diode) can be measured. When the areas of the light spots are generally the same or are within a relatively small range of each other (e.g., from 0.8× average light spot area to 1.2× average light spot area), it can be determined that the emitter module 2402 is placed at an optimal position for a good collimation quality.

In some embodiments, the mechanical structures of the components can be designed such that the sum of the distances between individual diodes in the emitter module 2402 and an axis of the collimator module is at least approximately minimized when the emitter module 2402 and the collimator module are assembled together, thereby reducing the complexity of the calibration process. Using such mechanical configurations, the emitter module 2402 only needs to be adjusted along the axis of the collimator (e.g., Z axis) such that a sum of distances between individual diodes and the focal plane of the collimator module is at least approximately minimized to reduce the size of the light spots.

FIG. 24B shows an example of a process for adjusting a receiver module 2404. In FIG. 24B, the receiver module 2404 is adjusted such that individual semiconductor receiver units in the receiver module 2404 form a one-to-one correspondence with individual diodes in the emitter module 2402. In some embodiments, the one-to-one correspondence is obtained by adjusting the position of the receiver module 2404 relative to the emitter module 2402 such that a distance between individual semiconductor receiver units and the axis of the collimator module (e.g., Z axis) is at least approximately minimized.

To simplify the calibration process, a reference point of the receiver module 2404 can also be used to facilitate obtaining the one-to-one correspondence. The reference point can be a reference semiconductor receiver unit located at a center of the receiver module 2404. The reference point can also be a geometric center of the receiver module 2404. For example, the receiver module 2404 can be moved in a horizontal direction (e.g., a direction parallel to the substrate plane such as X and/or Y direction) so that the distance between the reference point and the axis of the collimator (e.g., Z axis) is at least approximately minimized to allow the reference point of the receiver module 2402 to be aligned to the reference point of the emitter module 2402. Then, the receiver module 2404 can be moved along the axis of the collimator module (e.g., Z axis) such that a sum of the distances between individual semiconductor receiver units and a focal plane of the collimator module is at least approximately minimized to obtain the one-to-one correspondence between the semiconductor units and the diode dice.

In some embodiments, the receiver module can be further rotated around one or more axes (e.g., one or more of the X/Y/Z axes) such that the individual semiconductor receiver units in the receiver module 2404 correspond to the individual diodes in the emitter module 2402 more closely. In some embodiments, adjusting the position of the emitter module 2404 is performed prior to rotating the receiver module 2404.

To determine whether the individual semiconductor receiver units and the individual diode dice form a one-to-one correspondence, the amount of light received by the semiconductor receiver units can be measured. When the amount of light received by individual semiconductor receiver units is generally the same and is equal to or greater than a predetermined threshold, it can be determined that individual semiconductor receiver units in the receiver module 2404 are placed in optimal positions that correspond to the individual diodes in the emitter module 2402. For example, the position of the receiver module 2404 can be adjusted so that the amount of light received by every semiconductor receiver unit (or a selected subset of the semiconductor receiver units) is equal to or greater than a predetermined threshold. In some implementations, the position of the receiver module 2404 can be adjusted so that the amount of light received by individual receiver units is generally the same or is within a relatively small range (e.g., from 0.8× average amount of light to 1.2× average amount of light). In some implementations, the position of the receiver module 2404 can be further adjusted so that variance of the amount of received light among the semiconductor receiver units falls within a small range.

Figure 25:
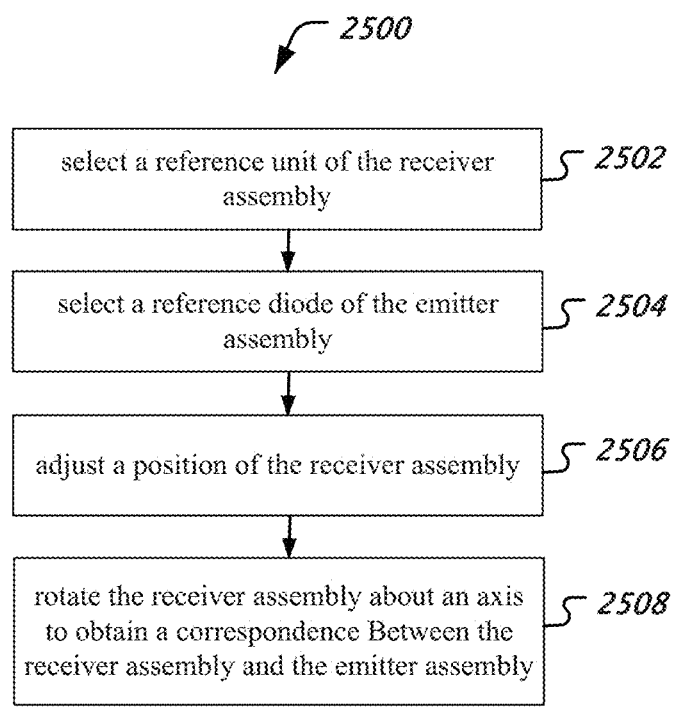
FIG. 25 is a flowchart representation of another method for calibrating an electromagnetic energy sensor in accordance with embodiments of the present technology.

FIG. 25 is a flowchart representation of a method 2500 for calibrating an electromagnetic energy sensor to obtain accurate correspondence between individual diode dice and the semiconductor receiver units in accordance with embodiments of the present technology. The sensor includes an emitter assembly, a collimator module, and a receiver assembly as described above in the context of several embodiments. The method 2500 includes, at block 2502, selecting a reference unit of the receiver assembly from a plurality of semiconductor receiver units included in the receiver assembly. The method 2500 includes, at block 2504, selecting a reference diode of the emitter assembly from a plurality of diodes included in the receiver assembly. The method also includes, at block 2506, adjusting a position of the receiver assembly such that the reference unit of the receiver assembly aligns with the reference diode of the emitter assembly. The method further includes, at block 2508, rotating the receiver assembly about an axis to obtain a correspondence between individual semiconductor receiver units in the receiver assembly and individual diodes in the emitter assembly. The axis passes through the reference unit of the receiver assembly.

In some embodiments, the reference unit of the receiver assembly is a semiconductor receiver unit positioned in the center of the receiver unit. The reference diode of the emitter assembly is a diode positioned in the center of the emitter assembly.

In some embodiments, the method includes adjusting a position of the emitter assembly such that multiple electromagnetic energy beams from the plurality of diodes form a spot at a specified location. The spot can be observed and measured using equipment such as an infrared camera. The location and size of the spot can be indicators for determining whether the emitter assembly has been calibrated successfully. For example, in some implementations, the diameter of the spot has a diameter is smaller than or equal to a predetermined threshold to complete the calibration of the emitter.

In some embodiments, adjusting the position of the emitter assembly is performed prior to adjusting the position of the receiver assembly. In some implementations, adjusting the position of the emitter assembly includes moving the emitter assembly along at least one axis in a horizontal direction that is parallel to the substrate plane (e.g., X and/or Y axis in FIG. 24A), moving the emitter assembly along a vertical axis that is perpendicular to the emitter substrate plane (e.g., Z axis in FIG. 24A), and rotating the emitter assembly along at least one axis in the horizontal direction (e.g., X and/or Y axis in FIG. 24A) such that the plurality of diodes is positioned relative to a focal plane of the collimator module.

In some embodiments, adjusting the position of the emitter assembly further includes rotating the emitter assembly around the vertical axis (e.g., Z axis in FIG. 24A) such that the spot formed by the multiple electromagnetic energy beams from the plurality of diodes is located at the specified location.

In some embodiments, adjusting the position of the receiver assembly includes moving the receiver assembly in a horizontal direction that is parallel to the substrate plane (e.g., X and/or Y direction as shown in FIG. 24B) so that the reference unit of the receiver assembly aligns with the reference diode of the emitter assembly.

In some embodiments, adjusting the position of the receiver assembly also includes moving the receiver assembly along a vertical axis that is perpendicular to the receiver substrate plane (e.g., Z axis as shown in FIG. 24B), and rotating the receiver assembly about at least one axis in a horizontal direction (e.g., X and/or Y axis as shown in FIG. 24B) such that the plurality of semiconductor receiver units is positioned relative to a focal plane of the collimator module. The receiver assembly then can be rotated about a vertical axis that passes through the reference point of the receiver assembly (e.g., Z axis in FIG. 24B).

In one advantageous aspect of the present technology, the disclosed techniques can provide an optoelectronic scanning device that is capable of emitting multiple electromagnetic beams and detecting multiple returned signals. The disclosed techniques allow a collection of denser and more evenly distributed spatial data, thereby providing a large detection range while complying with local safety regulations.

In another advantageous aspect of the present technology, the disclosed techniques allow the packaged diode components to have a suitable inductance that has a low impact on the response time of the diode. The relevant manufacturing methods allow automatic assembling of the components, thereby reducing cost and manufacturing time of the products.

FIG. 26 is a block diagram illustrating an example of the architecture for a computer system or other control device 2600 that can be utilized to implement various portions of the presently disclosed technology (e.g., the first controller 171 and/or the second controller 172). In FIG. 26, the computer system 2600 includes one or more processors 2605 and memories 2610 connected via an interconnect 2625. The interconnect 2625 may represent any one or more separate physical buses, point to point connections, or both, connected by appropriate bridges, adapters, or controllers. The interconnect 2625, therefore, may include, for example, a system bus, a Peripheral Component Interconnect (PCI) bus, a HyperTransport or industry standard architecture (ISA) bus, a small computer system interface (SCSI) bus, a universal serial bus (USB), IIC (I2C) bus, or an Institute of Electrical and Electronics Engineers (IEEE) standard 674 bus, sometimes referred to as "Firewire."

The processor(s) 2605 may include central processing units (CPUs) to control the overall operation of, for example, the host computer. In certain embodiments, the processor(s) 2605 accomplish this by executing software or firmware stored in memory 2610. The processor(s) 2605 may be, or may include, one or more programmable general-purpose or special-purpose microprocessors, digital signal processors (DSPs), programmable controllers, application specific integrated circuits (ASICs), programmable logic devices (PLDs), or the like, or a combination of such devices.

The memory 2610 can be or include the main memory of the computer system. The memory 2610 represents any suitable form of random access memory (RAM), read-only memory (ROM), flash memory, or the like, or a combination of such devices. In use, the memory 2610 may contain, among other things, a set of machine instructions which, when executed by the processor 2605, causes the processor 2605 to perform operations to implement embodiments of the presently disclosed technology.

Also connected to the processor(s) 2605 through the interconnect 2625 is an (optional) network adapter 2615. The network adapter 2615 provides the computer system 2600 with the ability to communicate with remote devices, such as the storage clients, and/or other storage servers, and may be, for example, an Ethernet adapter or Fiber Channel adapter.

Some of the embodiments described herein are described in the general context of methods or processes, which may be implemented in one embodiment by a computer program product, embodied in a computer-readable medium, including computer-executable instructions, such as program code, executed by computers in networked environments. A computer-readable medium may include removable and non-removable storage devices including, but not limited to, Read Only Memory (ROM), Random Access Memory (RAM), compact discs (CDs), digital versatile discs (DVD), etc. Therefore, the computer-readable media can include a non-transitory storage media. Generally, program modules may include routines, programs, objects, components, data structures, etc. that perform particular tasks or implement particular abstract data types. Computer- or processor-executable instructions, associated data structures, and program modules represent examples of program code for executing steps of the methods disclosed herein. The particular sequence of such executable instructions or associated data structures represents examples of corresponding acts for implementing the functions described in such steps or processes.

Some of the disclosed embodiments can be implemented as devices or modules using hardware circuits, software, or combinations thereof. For example, a hardware circuit implementation can include discrete analog and/or digital components that are, for example, integrated as part of a printed circuit board. Alternatively, or additionally, the disclosed components or modules can be implemented as an Application Specific Integrated Circuit (ASIC) and/or as a Field Programmable Gate Array (FPGA) device. Some implementations may additionally or alternatively include a digital signal processor (DSP) that is a specialized microprocessor with an architecture optimized for the operational needs of digital signal processing associated with the disclosed functionalities of this application. Similarly, the various components or sub-components within each module may be implemented in software, hardware or firmware. The connectivity between the modules and/or components within the modules may be provided using any one of the connectivity methods and media that is known in the art, including, but not limited to, communications over the Internet, wired, or wireless networks using the appropriate protocols.

While the present disclosure contains many specifics, these should not be construed as limitations on the scope of any invention or of what may be claimed, but rather as descriptions of features that may be specific to particular embodiments. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this document should not be understood as requiring such separation in all embodiments.

Only a number of implementations and examples are described and other implementations, enhancements and variations can be made based on what is described and illustrated in this document.

From the foregoing, it will be appreciated that specific embodiments of the disclosed technology have been described herein for purposes of illustration, but that various modifications may be made without deviating from the technology. For example, while a light emitter is used as an example in some of the foregoing discussions, any suitable type of electromagnetic emitter can be used for various sensor systems. Certain aspects of the technology described in the context of particular embodiments may be combined or eliminated in other embodiments. Further, while advantages associated with certain embodiments of the disclosed technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

What is claimed is:

1. A sensor apparatus, comprising:
a source that comprises one or more diodes configured to emit at least one electromagnetic energy beam;
a reflector configured to reflect the at least one electromagnetic energy beam emitted from the source, the reflector including a plurality of reflective surfaces configured to reflect at least two parts of the at least one electromagnetic energy beam emitted from the source to form at least two reflected electromagnetic beams, the at least two parts being substantially parallel to each other, and the at least two reflected electromagnetic beams being not parallel to each other; and
a receiver configured to receive at least one returned electromagnetic energy beam reflected from one or more objects in an external environment and convert light signals from the at least one returned electromagnetic energy beam to one or more electrical signals, the receiver including a plurality of receiver units, and the plurality of receiver units having a one-to-one correspondence with the plurality of reflective surfaces of the reflector.

2. The apparatus of claim 1, wherein:
the source comprises multiple diodes configured to emit multiple electromagnetic energy beams.

3. The apparatus of claim 2, wherein the multiple diodes are packaged together and configured to emit the multiple electromagnetic energy beams, which are parallel to each other.

4. The apparatus of claim 1, wherein the reflector includes an array of micro-mirrors.

5. The apparatus of claim 1, further comprising a beam steering structure configured to receive the at least one electromagnetic energy beam reflected by the reflector and adjust direction of at least one outgoing electromagnetic energy beam.

6. The apparatus of claim 5, wherein the beam steering structure is configured to direct the at least one returned electromagnetic energy beam reflected from the one or more objects in the external environment toward the receiver.

7. The apparatus of claim 5, wherein the beam steering structure comprises:
a first optical element, and
an actuator coupled to the first optical element to rotate the first optical element about an axis for adjusting direction of the at least one outgoing electromagnetic energy beam.

8. The apparatus of claim 7, wherein an angle between an individual outgoing electromagnetic energy beam and the axis changes with time.

9. The apparatus of claim 7, wherein the first optical element includes a first surface and a second surface, wherein the first surface and the second surface are non-parallel.

10. The apparatus of claim 9, wherein the first optical element further includes a stabilizer at an end of the first optical element.

11. The apparatus of claim 7, wherein the beam steering structure comprises a second optical element configured to rotate around the axis at a different speed than the first optical element.

12. The apparatus of claim 5, the beam steering structure further comprises a scanning mirror.

13. The apparatus of claim 5, wherein the reflector is located along a different axis than an optical axis of a collimator.

14. The apparatus of claim 1, further comprising:
a collimator positioned between the source and the reflector, and including an array of micro-lenses.

15. An apparatus comprising:
a source that comprises one or more diodes configured to emit at least one electromagnetic energy beam;
a reflector configured to reflect the at least one electromagnetic energy beam emitted from the source, the reflector including a plurality of reflective surfaces that are not parallel to each other, and positions of the plurality of reflective surfaces and a position of the source being fixed; and
a receiver configured to receive at least one returned electromagnetic energy beam reflected from one or more objects in an external environment and convert light signals from the at least one returned electromagnetic energy beam to one or more electrical signals;
wherein the receiver includes a plurality of receiver units, the plurality of receiver units having a one-to-one correspondence with the plurality of reflective surfaces of the reflector.

16. The apparatus of claim 15, further comprising:
a beam steering structure configured to receive the at least one electromagnetic energy beam reflected by the reflector and adjust direction of at least one outgoing electromagnetic energy beam, the beam steering structure including:
a first optical element, and an actuator coupled to the first optical element to rotate the first optical element about an axis for adjusting direction of the at least one outgoing electromagnetic energy beam.

17. The apparatus of claim 16, wherein the first optical element includes a first surface and a second surface, wherein the first surface and the second surface are non-parallel.

18. The apparatus of claim 16, wherein the beam steering structure further includes a second optical element configured to rotate around the axis at a different speed than the first optical element.

* * * * *